(12) United States Patent
Kadota et al.

(10) Patent No.: US 8,552,818 B2
(45) Date of Patent: Oct. 8, 2013

(54) TUNABLE FILTER

(75) Inventors: Michio Kadota, Nagaokakyo (JP);
Hideaki Kobayashi, Nagaokakyo (JP);
Takashi Ogami, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/555,462

(22) Filed: Jul. 23, 2012

(65) Prior Publication Data

US 2012/0286900 A1 Nov. 15, 2012

Related U.S. Application Data

(63) Continuation of application No. PCT/JP2011/051751, filed on Jan. 28, 2011.

(30) Foreign Application Priority Data

Jan. 28, 2010 (JP) ................................. 2010-016715

(51) Int. Cl.
*H03H 9/54* (2006.01)
*H03H 9/64* (2006.01)

(52) U.S. Cl.
USPC ............ 333/188; 333/189; 333/193; 333/195

(58) Field of Classification Search
USPC .............. 333/188, 189, 193, 195; 310/313 B, 310/313 D
See application file for complete search history.

(56) References Cited

U.S. PATENT DOCUMENTS

| | | | |
|---|---|---|---|
| 2,037,171 A | 4/1936 | Lane | |
| 2,222,417 A | 11/1940 | Mason | |
| 5,291,159 A * | 3/1994 | Vale | 333/188 |
| 5,422,615 A | 6/1995 | Shibagaki et al. | |
| 5,559,481 A | 9/1996 | Satoh et al. | |
| 5,789,845 A * | 8/1998 | Wadaka et al. | 310/334 |
| 5,933,062 A | 8/1999 | Kommrusch | |
| 7,030,718 B1 * | 4/2006 | Scherer | 333/188 |
| 7,423,502 B2 * | 9/2008 | Razafimandimby et al. | 333/188 |

(Continued)

FOREIGN PATENT DOCUMENTS

| | | |
|---|---|---|
| FR | 878813 A | 2/1943 |
| JP | 01-157108 | * 6/1989 |

(Continued)

OTHER PUBLICATIONS

English language machine translation of JP 2009-130831, published on Jun. 11, 2009.*

(Continued)

*Primary Examiner* — Barbara Summons
(74) *Attorney, Agent, or Firm* — Keating & Bennett, LLP

(57) ABSTRACT

A tunable filter that is capable of magnifying a pass band width or increasing a frequency variable amount includes a resonator circuit portion provided in at least one of a series arm connecting an input terminal and an output terminal to each other and a parallel arm connecting the series arm and a ground potential to each other, a first variable capacitor is connected in series to the resonator circuit portion and a second variable capacitor is connected in parallel to the resonator circuit portion. The resonator circuit portion includes a piezoelectric substrate including $LiNbO_3$ or $LiTaO_3$, an elastic wave resonator including an electrode located on the piezoelectric substrate, and a bandwidth extending inductance Lx, Lx connected to the elastic wave resonator.

14 Claims, 27 Drawing Sheets

(56) References Cited

U.S. PATENT DOCUMENTS

| | | | |
|---|---|---|---|
| 7,609,133 B2 * | 10/2009 | Osugi et al. | 333/187 |
| 7,646,265 B2 * | 1/2010 | Stuebing et al. | 333/189 |
| 7,696,844 B2 * | 4/2010 | Cathelin et al. | 333/190 |
| 2005/0025324 A1 | 2/2005 | Takata | |
| 2005/0212612 A1 | 9/2005 | Kawakubo et al. | |
| 2005/0231306 A1 | 10/2005 | Kushitani et al. | |
| 2007/0210877 A1 | 9/2007 | Osugi et al. | |
| 2008/0024244 A1 | 1/2008 | Cathelin et al. | |
| 2008/0169886 A1 * | 7/2008 | Kuroda | 333/193 |
| 2008/0252397 A1 | 10/2008 | Stuebing et al. | |
| 2010/0259128 A1 | 10/2010 | Kadota et al. | |
| 2011/0063051 A1 * | 3/2011 | Fedan | 333/195 |

FOREIGN PATENT DOCUMENTS

| | | | |
|---|---|---|---|
| JP | 05-183380 A | | 7/1993 |
| JP | 06-236815 A | | 8/1994 |
| JP | 06-260876 A | | 9/1994 |
| JP | 09-162684 A | | 6/1997 |
| JP | 10-013187 | * | 1/1998 |
| JP | 2000-151356 | * | 5/2000 |
| JP | 2002-299997 | * | 10/2002 |
| JP | 2005-33246 A | | 2/2005 |
| JP | 2005-45475 A | | 2/2005 |
| JP | 2005-217852 A | | 8/2005 |
| JP | 2007-243587 A | | 9/2007 |
| JP | 2009-130831 A | | 6/2009 |
| WO | 2009/090715 A1 | | 7/2009 |
| WO | 2010/058544 A1 | | 5/2010 |
| WO | 2010/058570 A1 | | 5/2010 |

OTHER PUBLICATIONS

Official Communication issued in International Patent Application No. PCT/JP2011/051751, mailed on Mar. 22, 2011.

Official Communication issued in corresponding European Patent Application No. 12183354.5, mailed on Jun. 14, 2013.

Kadota et al., "Ultra Wide Band Resonator Composed of Grooved Cu-Electrode on LiNbO3 and its Application to Tunable Filter," IEEE International Ultrasonics Symposium Proceedings, Sep. 20, 2009, pp. 2668-2671.

El Hassan et al., "Reconfiguration of Bulk Acoustic Wave Filters: Application to WLAN 802.11b/g (2.40-2.48 GHz)," IEEE Electronics, Circuits and Systems, Dec. 2006, pp. 395-398.

Lakin, "Thin Film Resonator Technology," IEEE International Frequency Control Symposium and PDA Exhibition Jointly with the 17th European Frequency and Time Forum, May 4, 2003, pp. 765-778.

* cited by examiner

W/LN (0°, 100°, 0°)

Ta/LN (0°, 100°, 0°)

TUNABLE FILTER

BACKGROUND OF THE INVENTION

1. Field of the Invention

The present invention relates to a tunable filter preferably for use as a passband filter in a communication system, and in more detail, relates to a tunable filter including an elastic wave resonator.

2. Description of the Related Art

Occasionally, in a passband filter used in a communication system, a pass band is desired to be adjustable. Various passband filters, such as tunable filters, which satisfy this requirement, have been proposed.

For example, Japanese Unexamined Patent Application Publication No. 2005-217852 discloses a tunable filter that uses a plurality of surface acoustic wave resonators and a plurality of variable capacitors. FIG. 46 is a circuit diagram of the tunable filter described in Japanese Unexamined Patent Application Publication No. 2005-217852.

In a tunable filter 1101, a plurality of series arm resonators 1104 and 1105 are connected in series to a series arm that connects an input end portion 1102 and an output end portion 1103 to each other. In addition, parallel arm resonators 1106 and 1107 are respectively connected to a plurality of parallel arms provided between the series arm and a ground potential. The series arm resonators 1104 and 1105 and the parallel arm resonators 1106 and 1107 are defined by surface acoustic wave resonators.

A ladder filter circuit, which includes the series arm resonators 1104 and 1105 and the parallel arm resonators 1106 and 1107, is provided. Furthermore, so as to allow the pass band to be adjusted, variable capacitors 1108 to 1115 are connected. The variable capacitor 1108 is connected in parallel to the series arm resonator 1104, and the variable capacitor 1110 is connected in series to the series arm resonator 1104 and the variable capacitor 1108. In the same way, the variable capacitor 1109 is also connected in parallel to the series arm resonator 1105, and the variable capacitor 1111 is connected in series to the series arm resonator 1105.

Also in the parallel arm, the variable capacitor 1112 is connected in parallel to the parallel arm resonator 1106, and the variable capacitor 1114 is connected in series to the parallel arm resonator 1106 and the variable capacitor 1112. In the same way, the variable capacitor 1113 is connected in parallel to the parallel arm resonator 1107, and the variable capacitor 1115 is connected in series to the parallel arm resonator 1107.

In the tunable filter 1101, it is possible to increase a resonant frequency FrS of a circuit portion of the series arm with a decrease in the capacitances of the variable capacitors 1110 and 1111, such as the series capacitances. In addition, it is possible to decrease an anti-resonant frequency FaS of the series arm with an increase in the parallel capacitance, such as an electrostatic capacitance due to the variable capacitors 1108 and 1109.

In the same way, it is also possible to change a resonant frequency FrP and an anti-resonant frequency FaP of a circuit portion of the parallel arms, by changing the capacitances of the variable capacitors 1112 and 1113 connected in parallel and the capacitances of the variable capacitors 1114 and 1115 connected in series. Accordingly, it is possible to change the center frequency of the entire tunable filter 1101, by changing the capacitances of the variable capacitors 1108 to 1115.

However, in the tunable filter 1101 described in Japanese Unexamined Patent Application Publication No. 2005-217852, there has occurred a problem that the surface acoustic wave resonators used for the series arm resonators 1104 and 1105 and the parallel arm resonators 1106 and 1107 have small electromechanical coupling coefficients and the absolute value of a frequency-temperature coefficient TCF is small. In addition, the specific combination of the frequency characteristics of the parallel arm resonators and the series arm resonators has not been described.

SUMMARY OF THE INVENTION

In view of the above-mentioned current situation of the related art, preferred embodiments of the present invention provide an improved tunable filter including a circuit configuration in which an elastic wave resonator and a variable capacitor are connected.

Also, preferred embodiments of the present invention provide a tunable filter capable of magnifying a pass band width or varying the pass band width.

A tunable filter according to a preferred embodiment of the present invention includes a resonator circuit portion provided in at least one of a series arm connecting an input terminal and an output terminal to each other and a parallel arm between the series arm and a ground potential, a first variable capacitor connected in series to the resonator circuit portion, and a second variable capacitor connected in parallel to the resonator circuit portion, wherein the resonator circuit portion includes an elastic wave resonator and a bandwidth extending inductance connected to the elastic wave resonator, the elastic wave resonator including a piezoelectric substrate, which includes $LiNbO_3$ or $LiTaO_3$, and an electrode located on the piezoelectric substrate.

In a specific aspect of the tunable filter according to a preferred embodiment of the present invention, the resonator circuit portion includes a plurality of series arm resonator circuit portions provided in the series arm, wherein the tunable filter further includes a coupling element connected between the ground potential and a connection point between the plural series arm resonator circuit portions, and matching elements connected between the input terminal and the ground potential and between the output terminal and the ground potential.

In another specific aspect of the tunable filter according to a preferred embodiment of the present invention, as the resonator circuit portion, a series arm resonator circuit portion and a parallel arm resonator circuit portion are included in both of the series arm and the parallel arm, respectively, and a ladder filter is configured using the series arm resonator circuit portion and the parallel arm resonator circuit portion.

In another specific aspect of the tunable filter according to a preferred embodiment of the present invention, the resonator circuit portion includes a plurality of parallel resonators, and the bandwidth extending inductance is connected to the plural parallel resonators.

In another specific aspect of the tunable filter according to a preferred embodiment of the present invention, a concave portion is formed on a top surface of the piezoelectric substrate, an electrode located on the piezoelectric substrate is an IDT electrode, the elastic wave resonator is a surface acoustic wave resonator, and the IDT electrode includes metal with which the concave portion is filled. In this case, it is possible to increase the electromechanical coupling coefficient of the surface acoustic wave resonator. Accordingly, it is possible to widen a band width and it is also possible to widen the variable frequency range of the tunable filter.

In another specific aspect of the tunable filter according to a preferred embodiment of the present invention, the surface acoustic wave resonator further includes an $SiO_2$ film arranged so as to cover a top surface of the piezoelectric substrate. In this case, it is possible to decrease the absolute value of the frequency-temperature coefficient TCF of the surface acoustic wave resonator. Accordingly, it is possible to improve the temperature characteristic of the tunable filter.

In another specific aspect of the tunable filter according to a preferred embodiment of the present invention, the tunable filter further includes a capacitor connected between the input terminal and the output terminal.

In another specific aspect of the tunable filter according to a preferred embodiment of the present invention, the impedances of the matching element and the coupling element in a pass band of the tunable filter preferably are about 20Ω to about 105Ω, for example. In general, values of about 50Ω or about 75Ω, for example, are preferably used as the matching impedance. In view of an insertion loss, it is desirable that an impedance is set to a value near thereto, and about 20Ω to about 105Ω ranging within about ±30Ω are preferable, for example.

In another specific aspect of the tunable filter according to a preferred embodiment of the present invention, the bandwidth extending inductance is one of a conductor pattern of a spiral shape or a meander shape and a bonding wire.

In another specific aspect of the tunable filter according to a preferred embodiment of the present invention, the tunable filter further includes a package, wherein the bandwidth extending inductance is a conductor pattern of a spiral shape or a meander shape, and the conductor pattern of a spiral shape or a meander shape is disposed on the piezoelectric substrate or in the package. In this case, since it is possible to provide the bandwidth extending inductance using the conductor pattern located on the piezoelectric substrate or in the package, it is possible to achieve the miniaturization of the tunable filter.

In a tunable filter according to a preferred embodiment of the present invention, a tunable filter of a ladder circuit configuration includes a series arm resonator provided in a series arm, a parallel arm resonator provided in a parallel arm, and a variable capacitor connected to at least one of the series arm resonator and the parallel arm resonator, wherein when a resonant frequency and an anti-resonant frequency of the series arm resonator are FrS and FaS and a resonant frequency and an anti-resonant frequency of the parallel arm resonator are FrP and FaP, FrS≤{(n−1) FrP+FaP}/n and FaP≤{(n−1) FaS+FrS}/n are satisfied where the n is an integer number greater than or equal to 2 and less than or equal to 30.

In a specific aspect of the tunable filter according to the second preferred embodiment of the present invention, FrS≤(FrP+FaP)/2, FaP>FrS, and FaP<FaS are satisfied.

In another specific aspect of the tunable filter according to a preferred embodiment of the present invention, FrS≤(2 FrP+FaP)/3, FaP>FrS, and FaP<FaS are satisfied.

In another specific aspect of the tunable filter according to a preferred embodiment of the present invention, when a value obtained by normalizing a frequency variable width of the tunable filter by (FaP+FrS)/2 is t and a value obtained by normalizing an absolute value of a difference between a resonant frequency and an anti-resonant frequency of each of the series arm resonator and the parallel arm resonator by the resonant frequency of each thereof is y, a value, obtained by normalizing Δfr/FrP, a ratio of Δfr=FrS−FrP to FrP, by the fractional band width y, is less than or equal to a value indicated by the following Expression (1).

$$\{(2-t/0.9) \times (1+y) - (2+t/0.9)\} / \{(2+t/0.9) \times y\} \times 100 (\%) \tag{1}$$

In another specific aspect of the tunable filter according to a preferred embodiment of the present invention, a maximum value of a ratio of a difference between the resonant frequency FrS of the series arm resonator and the resonant frequency FrP of the parallel arm resonator to a bandwidth of the series arm resonator is caused to be within a range illustrated in the following Table 1.

TABLE 1

| | Fractional Band Width of Resonator (%) | | | | | | | | | | | | | |
|---|---|---|---|---|---|---|---|---|---|---|---|---|---|---|
| | 12 | 13 | 14 | 15 | 16 | 17 | 18 | 19 | 20 | Greater than 20 and Less than or Equal to 25 | Greater than 25 and Less than or Equal to 30 | Greater than 30 and Less than or Equal to 40 | Greater than 40 and Less than or Equal to 50 | Greater than 50 and Less than or Equal to 60 |
| {(FrS − FrP)/ Bandwidth of Resonator} (%) | Less than or Equal to 33 | Less than or Equal to 37 | Less than or Equal to 41 | Less than or Equal to 44.5 | Less than or Equal to 47.5 | Less than or Equal to 50 | Less than or Equal to 52.6 | Less than or Equal to 54.7 | Less than or Equal to 56.6 | Less than or Equal to 63.9 | Less than or Equal to 68.3 | Less than or Equal to 74.4 | Less than or Equal to 78.0 | Less than or Equal to 80.5 |

In another specific aspect of the tunable filter according to a preferred embodiment of the present invention, a maximum value of a ratio of a difference between the resonant frequency FrS of the series arm resonator and the resonant frequency FrP of the parallel arm resonator to a bandwidth of the series arm resonator is caused to be within a range illustrated in the following Table 2. When being caused to be within this range, the tunable filter whose variable width is large is configured.

TABLE 2

| | Fractional Band Width of Resonator (%) | | | | | | | | | | | | | |
|---|---|---|---|---|---|---|---|---|---|---|---|---|---|---|
| | 12 | 13 | 14 | 15 | 16 | 17 | 18 | 19 | 20 | Greater than 20 and Less than or Equal to 25 | Greater than 25 and Less than or Equal to 30 | Greater than 30 and Less than or Equal to 40 | Greater than 40 and Less than or Equal to 50 | Greater than 50 and Less than or Equal to 60 |
| {(FrS − FrP)/ Bandwidth of Resonator} (%) | Less than or Equal to 11 | Less than or Equal to 17.2 | Less than or Equal to 22.4 | Less than or Equal to 27 | Less than or Equal to 31 | Less than or Equal to 34.4 | Less than or Equal to 37.6 | Less than or Equal to 40.4 | Less than or Equal to 42.9 | Less than or Equal to 52.4 | Less than or Equal to 58.7 | Less than or Equal to 66.7 | Less than or Equal to 71.4 | Less than or Equal to 74.6 |

In another specific aspect of the tunable filter according to a preferred embodiment of the present invention, a minimum 3 dB band width is either the smaller of (FrS−FrP)×0.9 or (FaS−FaP)×0.9, and a maximum frequency variable width is caused to be within a range of 140×(FaP−FrS)/(FaP+FrS) (%) to 180×(FaP−FrS)/(FaP+FrS) (%).

In another specific aspect of the tunable filter according to a preferred embodiment of the present invention, each of a fractional band width of the series arm resonator and a fractional band width of the parallel arm resonator is greater than or equal to about 13% and less than or equal to about 60%, for example. In this case, it is possible to further increase the frequency variable amount. More preferably, the fractional band width of each of the series arm resonator and the parallel arm resonator is greater than or equal to about 15%, for example. In that case, it is possible to further increase the frequency variable amount.

In another specific aspect of the tunable filter according to a preferred embodiment of the present invention, an electrode normalized film thickness is within a range illustrated in the following Table 3 when Euler angles of LiNbO$_3$ are (0°, 70° to 115°, 0°) and a duty ratio is X.

TABLE 3

| Electrode Material | Electrode Normalized Film Thickness H/λ |
|---|---|
| Al | ≥0.18032 − 0.15186X + 0.04954X$^2$ |
| Mo | ≥0.13336 − 0.25984X + 0.1623X$^2$ |
| Cu | ≥0.11452 − 0.16714X + 0.06712X$^2$ |
| Ni | ≥0.14498 − 0.27652X + 0.17081X$^2$ |
| Ag | ≥0.0904 − 0.13393X + 0.0518X$^2$ |
| Au | ≥0.05966 − 0.10753X + 0.05177X$^2$ |
| W | ≥0.08039 − 0.15733X + 0.08902X$^2$ |
| Ta | ≥0.08344 − 0.15413X + 0.0806X$^2$ |
| Pt | ≥0.06404 − 0.12311X + 0.06493X$^2$ |

X in the table indicates a duty ratio

In addition, in the present application and attached drawings, LiNbO$_3$ is occasionally abbreviated to LN and LiTaO$_3$ is occasionally abbreviated to LT.

In another specific aspect of the tunable filter according to a preferred embodiment of the present invention, the series arm resonator and parallel arm resonator include bulk wave resonators, wherein the bulk wave resonator includes a substrate configured to include a cavity open in a top surface, a piezoelectric thin film or a piezoelectric thin plate, arranged on a substrate so as to cover the cavity of the substrate, a first excitation electrode provided in a portion that is a bottom surface of the piezoelectric thin film and faces the cavity, and a second excitation electrode provided in a top surface of the piezoelectric thin film and disposed so as to face the first excitation electrode through the piezoelectric thin film. In this way, in a preferred embodiment of the present invention, the above-mentioned series arm resonator and parallel arm resonator may be configured using the bulk wave resonators.

One of the above-mentioned first excitation electrode and second excitation electrode may be split in two, and the other may be a common excitation electrode facing the excitation electrode split in two, through a piezoelectric thin film.

In addition, as the bulk wave resonator, a thickness-shear vibration resonator may also be used and a thickness-longitudinal vibration resonator may also be used.

In a tunable filter according to a further preferred embodiment of the present invention, there is provided a tunable filter including a resonator circuit portion provided in at least one of a series arm connecting an input terminal and an output terminal to each other and a parallel arm between the series arm and a ground potential, a first variable capacitor connected in series to the resonator circuit portion, and a second variable capacitor connected in parallel to the resonator circuit portion, wherein the resonator circuit portion includes a bulk wave resonator, and a bandwidth extending inductance connected to the bulk wave resonator, wherein the bulk wave resonator includes a substrate configured to include a cavity open in a top surface, a piezoelectric thin film or a piezoelectric thin plate, arranged on a substrate so as to cover the cavity of the substrate, a first excitation electrode provided in a portion that is a bottom surface of the piezoelectric thin film and faces the cavity, and a second excitation electrode provided in a top surface of the piezoelectric thin film and disposed so as to face the first excitation electrode through the piezoelectric thin film. Here, as the bulk wave resonator, the thickness-shear vibration resonator may also be used and the thickness-longitudinal vibration resonator may also be used.

In the tunable filter according to a preferred embodiment of the present invention, the above-mentioned bulk wave resonator may also be the thickness-shear vibration resonator. In this case, it is desirable that the thickness-shear vibration resonator utilizes a piezoelectric thin film or a piezoelectric thin plate, which includes LiNbO$_3$, and Euler angles thereof are within a range illustrated in the following Table 4.

TABLE 4

| Fractional Band Width Is Greater than or Equal to 20% | Fractional Band Width Is Greater than or Equal to 25% | Fractional Band Width Is Greater than or Equal to 30% |
|---|---|---|
| (0 ± 5°, 63° to 97°, ψ) | (0 ± 5°, 72° to 90°, ψ) | — |
| (10 ± 5°, 62° to 100°, ψ) | (10 ± 5°, 68° to 95°, ψ) | (10 ± 5°, 72° to 90°, ψ) |
| (20 ± 5°, 67° to 103°, ψ) | (20 ± 5°, 72° to 97°, ψ) | (20 ± 5°, 80° to 90°, ψ) |
| (30 ± 5°, 72° to 108°, ψ) | (30 ± 5°, 78° to 102°, ψ) | (30 ± 5°, 89° to 91°, ψ) |
| (40 ± 5°, 76° to 113°, ψ) | (40 ± 5°, 81° to 107°, ψ) | (40 ± 5°, 88° to 98°, ψ) |
| (50 ± 5°, 77° to 115°, ψ) | (50 ± 5°, 83° to 110°, ψ) | (50 ± 5°, 87° to 104°, ψ) |
| (60 ± 5°, 78° to 117°, ψ) | (60 ± 5°, 83° to 113°, ψ) | (60 ± 5°, 87° to 107°, ψ) |

In the tunable filter according to a preferred embodiment of the present invention, the above-mentioned bulk wave resonator may also be the thickness-longitudinal vibration resonator. In this case, it is desirable that the thickness-longitudinal vibration resonator utilizes a piezoelectric thin film or a piezoelectric thin plate, which includes $LiNbO_3$, and Euler angles thereof are within a range of (0±5°, 107° to 137°, ψ), (10±5°, 112° to 133°, ψ), (50±5°, 47° to 69°, ψ), or (60±5°, 43° to 73°, ψ).

In the tunable filter according to a preferred embodiment of the present invention, since the resonator circuit portion includes an elastic wave resonator and a bandwidth extending inductance connected to the elastic wave resonator, the elastic wave resonator including a piezoelectric substrate including $LiNbO_3$ or $LiTaO_3$, it is possible to magnify a pass band width.

In the tunable filter according to a preferred embodiment of the present invention, since FrS≤(FrP+FaP)/2, FaP>FrS, and FaP<FaS are satisfied, it is possible to increase the variable amount of the frequency of a pass band, for example, the center frequency of the pass band. Accordingly, it is possible to provide a tunable filter whose frequency variable range is wide.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 29A is a circuit diagram of a ladder filter where a series arm resonator is disposed on an input terminal side, and FIG. 29B is a circuit diagram illustrating a ladder filter where a parallel arm resonator is disposed on an input terminal side.

DETAILED DESCRIPTION OF THE PREFERRED EMBODIMENTS

Figure 1A:
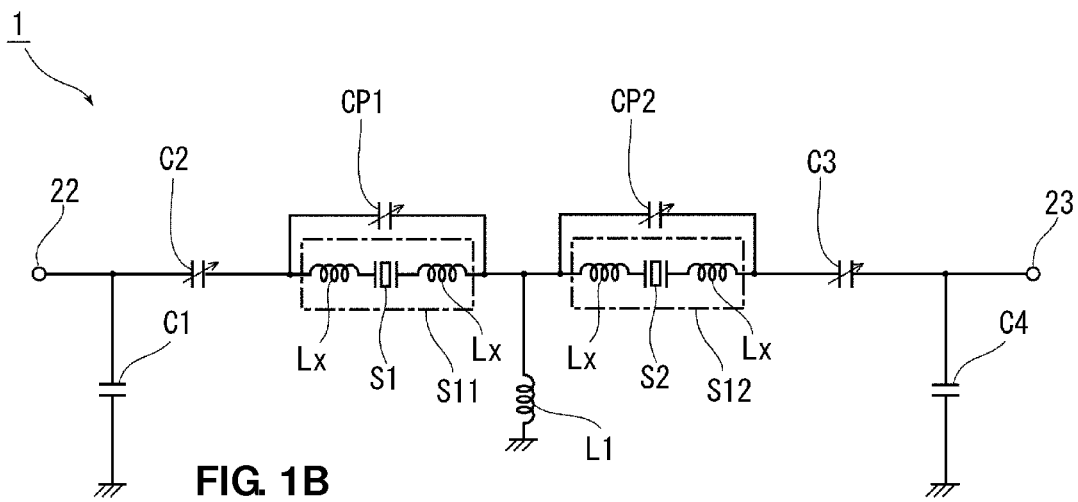
FIG. 1A is a diagram illustrating a circuit configuration of a tunable filter according to a first preferred embodiment of the present invention.
Figure 1B:
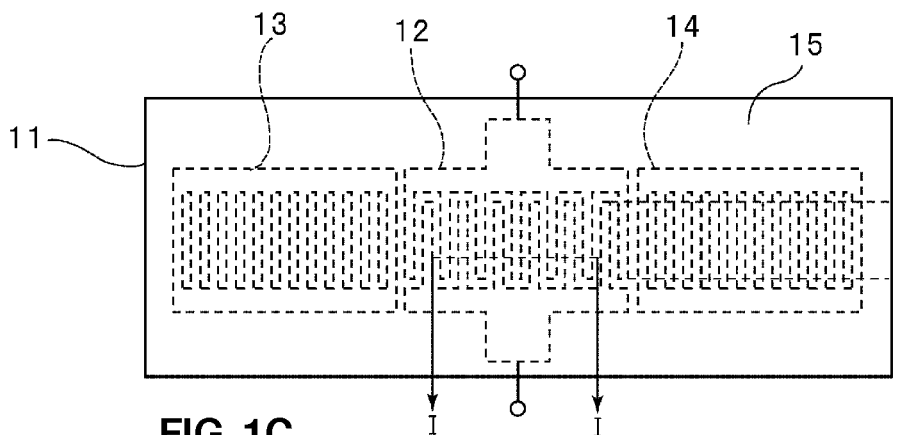
FIG. 1B is a schematic plan view illustrating a surface acoustic wave resonator used in the preferred embodiment.
Figure 1C:
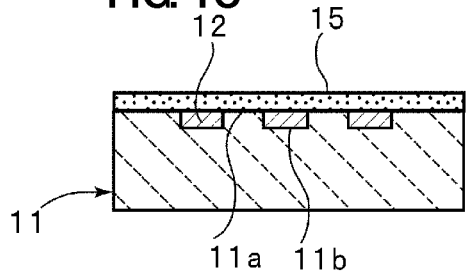
FIG. 1C is an elevational cross-sectional view of a portion taken along a I-I line in FIG. 1B.
Figure 1D:
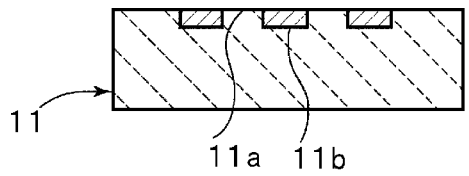
FIG. 1D is an elevational cross-sectional view of a structure in which no $SiO_2$ film in FIG. 1C exists.

Hereinafter, preferred embodiments of the present invention will be described with reference to drawings.
First Preferred Embodiment FIG. 1A is a circuit diagram of a tunable filter according to a first preferred embodiment of the present invention, FIG. 1B is a schematic plan view of a surface acoustic wave resonator used in the tunable filter, and FIG. 1C is the elevational cross-sectional view of a portion taken along a I-I line in FIG. 1B. FIG. 1D is the elevational cross-sectional view of a structure in which no $SiO_2$ film in FIG. 1C exists.

In a tunable filter 1 in FIG. 1A, in a series arm connecting an input terminal 22 and an output terminal 23 to each other, series arm resonator circuit portions S11 and S12 are connected in series to each other. In the series arm resonator circuit portion S11, on both sides of a series arm resonator S1, inductances Lx and Lx are connected in series to the series arm resonator S1. In the same way, in the series arm resonator circuit portion S12, on both sides of a series arm resonator S2, inductances Lx and Lx are connected in series to the series arm resonator S2. On the input side of the series arm resonator circuit portion S11, a variable capacitor C2 is connected in series to the series arm resonator circuit portion S11. In addition, on the input side of the series arm resonator circuit portion S11, a capacitor C1 is provided in a first parallel arm connecting the series arm and a ground potential to each other.

In a second parallel arm connecting the ground potential and a connection point between the series arm resonator circuit portions S11 and S12 to each other, an inductance L1 is provided. On the output side of the series arm resonator circuit portion S12, a variable capacitor C3 is connected to the series arm resonator circuit portion S12. A capacitor C4 is provided in a third parallel arm connecting the output terminal 23 and the ground potential to each other.

The capacitors C1 and C4 are matching elements to perform impedance matching between the tunable filter and previous and next circuits.

The inductance L1 is a coupling element to perform impedance matching between the series arm resonator circuit portions S11 and S12.

In the present preferred embodiment, while preferably includes a capacitor and the coupling element is configured using an inductance, the coupling element may also be configured using a capacitor.

Furthermore, a variable capacitor CP1 is connected in parallel to the series arm resonator circuit portion S11. A variable capacitor CP2 is connected in parallel to the series arm resonator circuit portion S12.

The variable capacitors C2 and C3 connected in series to the series arm resonator circuit portions S11 and S12 are first variable capacitors according to a preferred embodiment of the present invention. In addition, the variable capacitors CP1 and CP2 connected in parallel to the series arm resonator circuit portions S11 and S12, respectively, are second variable capacitors according to a preferred embodiment of the present invention. In the present preferred embodiment, the first variable capacitors C2 and C3 and the second variable capacitors CP1 and CP2 are connected to the all series arm resonator circuit portions S11 and S12, respectively.

In various preferred embodiments of the present invention, it is only necessary for the first variable capacitor and the second variable capacitor to be connected to at least one series arm resonator circuit portion. In addition, while, in the present preferred embodiment, the above-mentioned series arm resonator circuit portions S11 and S12 are preferably provided, the same resonator circuit portion may be provided in a parallel arm. More specifically, a resonator circuit portion in which a bandwidth extending inductance is connected in series to a parallel arm resonator may be provided in the parallel arm. In addition, the above-mentioned resonator circuit portion may be configured only in a parallel arm while not being configured in a series arm. In addition, a bandwidth extending inductance may be commonly connected to a plurality of resonators provided in a parallel arm. By connecting in this way, it is possible to reduce the number of bandwidth extending inductances. Here, while the parallel arm includes a circuit portion connecting the above-mentioned series arm and the ground potential, and in FIGS. 1A-1D, the above-mentioned capacitor C1 and capacitor C4 are provided in the parallel arm, it is only necessary to configure a parallel arm in the same way as the configuration in which the capacitors C1 and C4 are provided and provide the above-mentioned resonator circuit portion in the corresponding parallel arm.

In the present preferred embodiment, the series arm resonators S1 and S2 include surface acoustic wave resonators. The structure of this surface acoustic wave resonator will be described as a representative of the series arm resonator S1. As illustrated in FIGS. 1B, 1C, and 1D, a surface acoustic wave resonator configuring the series arm resonator S1 includes a piezoelectric substrate 11. In the present preferred embodiment, as the piezoelectric substrate 11, a $LiNbO_3$ substrate with Euler angles of (0°, 105°, 0°) is preferably used.

In the top surface 11a of the piezoelectric substrate 11, a plurality of grooves 11b are provided to define concave portions. The groove 11b is filled with electrode material, thereby forming an IDT electrode 12. As illustrated in FIG. 1B, in the present preferred embodiment, on both sides in the surface acoustic wave propagation direction of the IDT electrode 12, reflectors 13 and 14 are provided. Accordingly, one port type surface acoustic wave resonator is configured.

The reflectors 13 and 14 are also provided by filling concave portions, such as a plurality of grooves, provided on the top surface 11a of the piezoelectric substrate 11 with electrode material.

As illustrated in FIGS. 1C and 1D, the top surface of the IDT electrode 12, more specifically, the top surface of an electrode finger portion, is caused to be located on the same plane as the top surface 11a of the piezoelectric substrate 11.

Accordingly, after the above-mentioned IDT electrode 12 and the above-mentioned reflectors 13 and 14 have been formed, the top surface 11a of the piezoelectric substrate 11 is caused to be flat. In the structure in FIG. 1C, an $SiO_2$ film 15 is arranged so as to cover the top surface 11a of the piezoelectric substrate 11. In the structure in FIG. 1D, no $SiO_2$ film is provided.

Hereinafter, the surface acoustic wave resonators illustrated in FIGS. 1C and 1D are named embedded electrode-type surface acoustic wave resonators.

In the tunable filter 1 of the present preferred embodiment, since the series arm resonators S1 and S2 include the above-mentioned embedded electrode-type surface acoustic wave resonators, it is possible to increase the electromechanical coupling coefficient $k^2$ of the surface acoustic wave resonator, and hence, it is possible to widen a fractional band width. In addition to this, since the $SiO_2$ film is subjected to film formation, it is possible to decrease the absolute value of a frequency-temperature coefficient TCF and reduce a change in a characteristic due to a temperature change. This will be described with reference to the following first experimental example and second experimental example.

First Experimental Example

Figure 2:
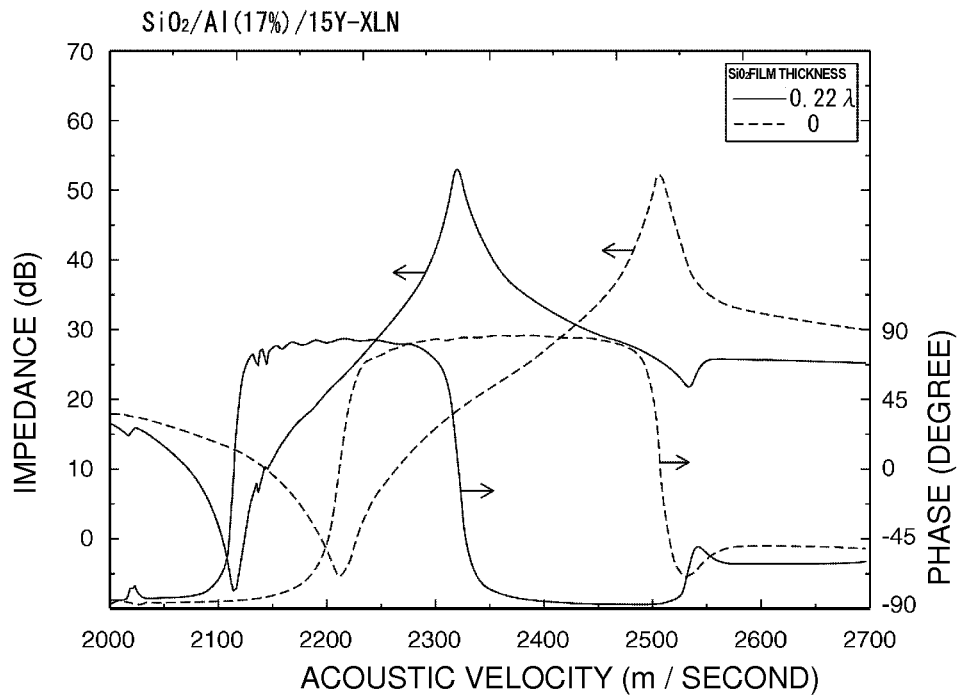
FIG. 2 is a diagram illustrating frequency characteristics of surface acoustic wave resonators, measured in a first experimental example, solid lines indicate an impedance characteristic and a phase characteristic of a surface acoustic wave resonator in which an $SiO_2$ film is provided, and dashed lines indicate an impedance characteristic and a phase characteristic of a surface acoustic wave resonator in which no $SiO_2$ film is provided.

Solid lines in FIG. 2 are diagrams illustrating the impedance characteristic and the phase characteristic of a surface acoustic wave resonator when the film thickness of the IDT electrode 12 is about 0.17λ and the film thickness of an $SiO_2$ film is about 0.22λ on condition that a $LiNbO_3$ substrate of 15° Y-cut X-propagation, such as a $LiNbO_3$ substrate with Euler angles of (0°, 105°, 0°), is used, Al is used as electrode material, and the wave length of the surface acoustic wave resonator is λ. For comparison, dashed lines in FIG. 2 illustrate the impedance-frequency characteristic and the phase characteristic of the surface acoustic wave resonator illustrated in FIG. 1D formed in the same way except that no $SiO_2$ film is provided.

As is clear from FIG. 2, a top/bottom ratio, the ratio of an impedance at an anti-resonant point to an impedance at a resonant frequency, was about 57.5 dB when no $SiO_2$ film was provided. On the other hand, it was possible to increase the top/bottom ratio to about 60.2 dB when an $SiO_2$ film was provided. Furthermore, the frequency-temperature coefficient TCF was about −120 ppm/° C. when no $SiO_2$ film was formed. On the other hand, it was possible to decrease the absolute value thereof to about −10 ppm/° C. to about −30 ppm/° C. because of the $SiO_2$ film.

Accordingly, it is understood that, while the electromechanical coupling coefficient $k^2$ becomes small to a certain extent because of the $SiO_2$ film, it is possible to increase the top/bottom ratio. In addition to this, it is understood that it is possible to improve a temperature characteristic.

Second Experimental Example

A $LiTaO_3$ substrate with Euler angles of (0°, 126°, 0°) was used as a piezoelectric substrate, Au was used as electrode material, an $SiO_2$ film was subjected to film formation so as to cover the piezoelectric substrate, and surface acoustic wave resonators with various structures were manufactured. When it was assumed that a wave length defined by the electrode finger pitch of an IDT electrode in a surface acoustic wave resonator was λ, it was assumed that a normalized thickness resonator was λ, obtained by normalizing the thickness h of an $SiO_2$ film by the wave length λ, was about 0.3. As prepared surface acoustic wave resonators, the following first to fifth surface acoustic wave resonators A to E were prepared.

Figure 3A:
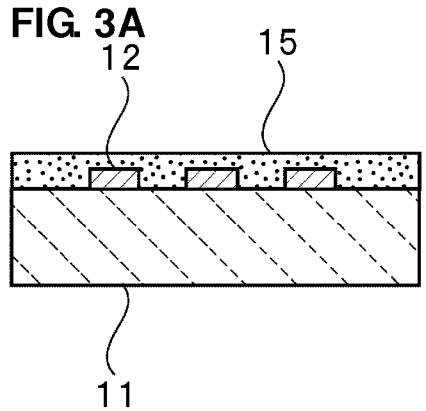
FIG. 3A is an elevational cross-sectional view illustrating a surface acoustic wave resonator where an IDT electrode is located on an LN substrate and an $SiO_2$ film is further laminated.

The first surface acoustic wave resonator A: A structure in which, as illustrated in FIG. 3A, the IDT electrode 12 is provided on the top surface of the piezoelectric substrate 11 and the $SiO_2$ film 15 is further provided. In the top surface of the $SiO_2$ film, a convex portion is provided in a portion below which the electrode is located, the height of the convex portion corresponding to the thickness of an underlying electrode.

The second surface acoustic wave resonator B: The same as the first surface acoustic wave resonator A except that the convex portion in the top surface of an $SiO_2$ film does not exist. The top surface of the $SiO_2$ film is planarized.

The third surface acoustic wave resonator C: A structure in which an IDT electrode and a reflector are formed by filling a groove, provided in the top surface of the piezoelectric substrate, with electrode material. The top surface of the electrode and the top surface of the piezoelectric substrate are located on a same plane. In the top surface of the $SiO_2$ film, a convex portion is formed in a portion below which the electrode is located, the height of the convex portion being roughly equal to the thickness of the electrode.

The fourth surface acoustic wave resonator D: The same structure as the third surface acoustic wave resonator C except that the convex portion is not formed in the top surface of an $SiO_2$ film and the top surface of the $SiO_2$ film is planarized.

The fifth surface acoustic wave resonator E: A structure in which an electrode is only provided on the substrate and an $SiO_2$ is not provided.

Figure 4:
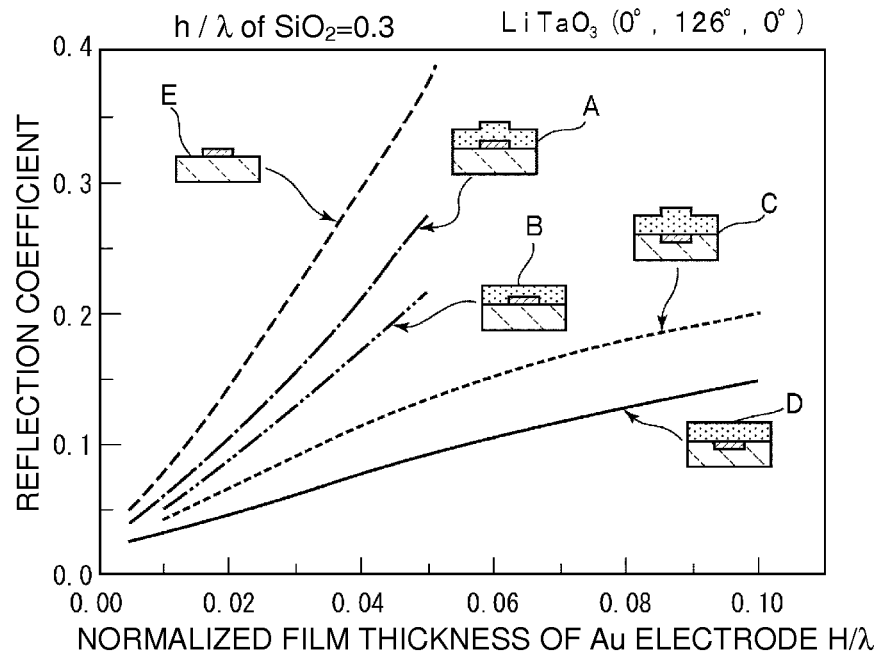
FIG. 4 is a diagram illustrating a change in a reflection coefficient when a normalized film thickness H/λ of an IDT electrode in a surface acoustic wave resonator in 36° YX—$LiTaO_3$ is changed in a second experimental example.
Figure 5:
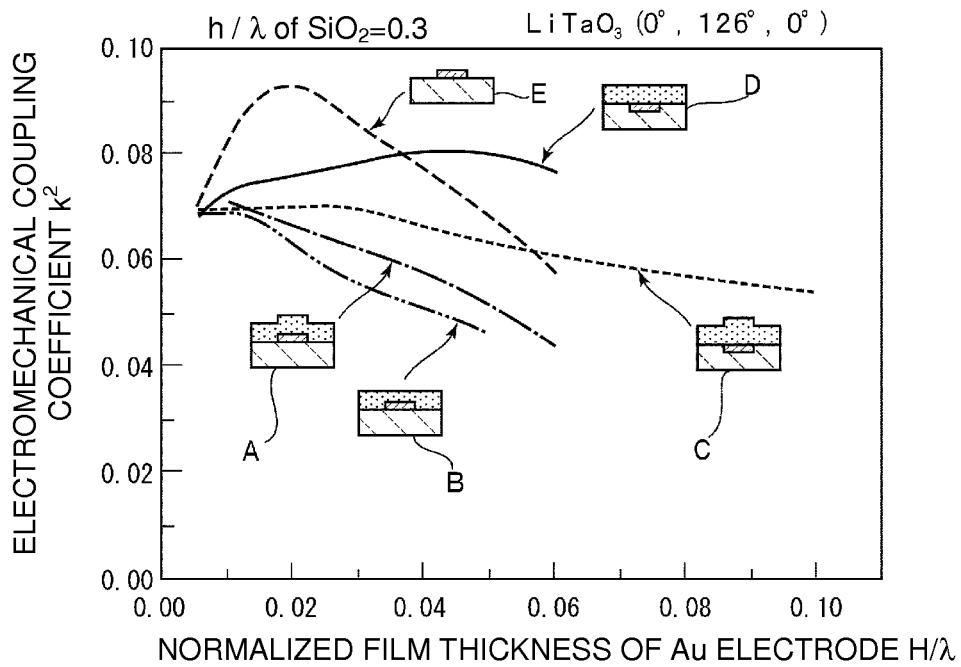
FIG. 5 is a diagram illustrating a change in an electromechanical coupling coefficient $k^2$ when the normalized film thickness H/λ of an IDT electrode in the surface acoustic wave resonator in 36° YX—$LiTaO_3$ is changed in the second experimental example.

FIG. 4 illustrates a change in a reflection coefficient when the normalized film thickness H/λ of an Au electrode is changed on condition that the normalized film thickness of the $SiO_2$ film is about 0.3 in the first to fifth surface acoustic wave resonators A to E. In addition, FIG. 5 illustrates a change in an electromechanical coupling coefficient $k^2$ when the normalized film thickness H/λ of an electrode is changed in the first to fifth surface acoustic wave resonators. As known, the frequency-temperature coefficient TCF of the $SiO_2$ film has a positive value, and the frequency-temperature coefficient TCF of the $LiTaO_3$ substrate has a negative value. Accordingly, in each case, because of the film formation of the $SiO_2$ film, it is possible to reduce the absolute value of the frequency-temperature coefficient TCF and it is possible to improve a temperature characteristic.

However, as is clear from FIG. 4 and FIG. 5, it is understood that when the $SiO_2$ film is provided, in the first surface acoustic wave resonator A, the second surface acoustic wave resonator B, and the third surface acoustic wave resonator C, the electromechanical coupling coefficient $k^2$ becomes small and the electromechanical coupling coefficient $k^2$ decreases with an increase in the normalized film thickness H/λ of the IDT electrode.

On the other hand, in the surface acoustic wave resonators D and E of the fourth and fifth types, it is understood that it is possible to increase the electromechanical coupling coefficient $k^2$ by setting the normalized film thickness of the IDT electrode within a specific range. In the surface acoustic wave resonator D of the fourth type, in which the top surface of the SiO$_2$ film is planarized, it is understood that it is possible to effectively increase the electromechanical coupling coefficient $k^2$ by setting the normalized film thickness of the IDT electrode to about 0.01 to about 0.09, for example. In the surface acoustic wave resonator E of the fifth type, it is understood that it is possible to obtain a large electromechanical coupling coefficient $k^2$ when the normalized film thickness of the IDT electrode is about 0.01 to about 0.04, for example.

In addition, as is clear from FIG. 4, in the surface acoustic wave resonators A to E of the first to fifth types, it is understood that the reflection coefficient increases with an increase in the film thickness of the IDT electrode.

When the results of the third to fourth surface acoustic wave resonators C to D are compared with one another, it is understood that it is possible to increase the reflection coefficient in the third surface acoustic wave resonator C in which the convex portion is provided in the top surface, compared with the fourth surface acoustic wave resonator D, if the normalized film thickness of the IDT electrode is the same. Accordingly, it is understood that, so as to increase the reflection coefficient, it is desirable that the convex portion is provided in the top surface of the SiO$_2$ film.

However, since it is only necessary for the reflection coefficient to be greater than or equal to some value (for example, about 0.02) depending on an intended use, it is understood that the surface acoustic wave resonator D or E of the fourth type, in which the top surface of the SiO$_2$ film is planarized, is desirable in reducing a variation in the reflection coefficient due to a variation in the film thickness of the IDT electrode or configuring a resonator with a wide bandwidth.

As described above, according to the present experimental example, in the structure where Au is embedded in the groove provided in the top surface of the LiTaO$_3$ piezoelectric substrate with Euler angles (0°, 126°, 0°), the IDT electrode is provided, and the SiO$_2$ film is provided, when the surface of the SiO$_2$ film is planarized, it is understood that it is possible to effectively increase the electromechanical coupling coefficient by setting the normalized film thickness of the IDT electrode to about 0.01 to about 0.09, for example. Accordingly, it is understood that it is possible to widen the fractional band width. Accordingly, when being used for the series arm resonator or the parallel arm resonator of a tunable filter, it is understood that it is possible to more effectively adjust the frequency characteristic of the tunable filter. In addition, in an electrode other than Au, the same result has been obtained.

Figure 6:
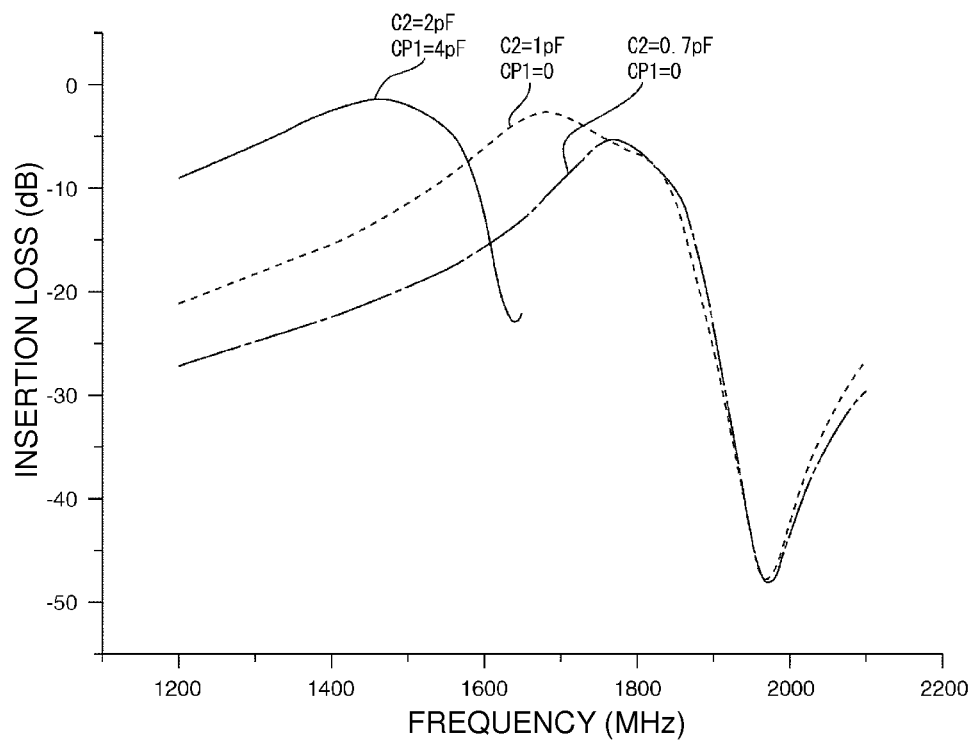
FIG. 6 is a diagram illustrating a change in a filter characteristic of a tunable filter when, in a circuit of the tunable filter according to the first preferred embodiment, capacitances of a variable capacitor C2 and a variable capacitor C3 are caused to be equal to each other, capacitances of a variable capacitor CP1 and a variable capacitor CP2 are caused to be equal to each other, and the capacitance of the variable capacitor C2 is set to about 0.7 pF, about 1 pF, or about 2 pF, for example.

FIG. 6 illustrates the frequency characteristic of the above-mentioned tunable filter 1 utilizing a surface acoustic wave resonator indicated by a solid line in FIG. 8 described later. Here, FIG. 6 illustrates a frequency characteristic when an electrostatic capacitance is changed as illustrated in FIG. 6 in a structure in which the capacitances of the variable capacitor C2 and the variable capacitor C3 are caused to be equal to each other and the capacitances of the variable capacitor CP1 and the variable capacitor CP2 are caused to be equal to each other. In addition, it is assumed that the inductance value of the bandwidth extending inductance Lx is about 4.5 nH, for example.

As is clear from FIG. 6, when the amounts of the capacitances of the variable capacitors C2 and CP1 are changed from C2=about 0.7 pF and CP1=0 (the CP1 is not connected), to C2=about 1 pF and CP1=0, and to C2=about 2 pF and CP1=about 4 pF, it is possible to change a center frequency by about 20% from about 1790 MHz, to about 1680 MHz, and to about 1460 MHz. Accordingly, it is possible to greatly increase a frequency variable amount.

Figure 7:
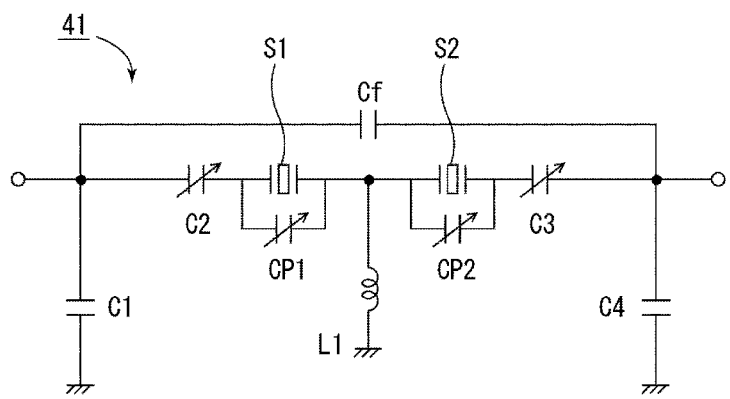
FIG. 7 is a circuit diagram of the tunable filter used in FIG. 6.

Next, a tunable filter 41 of a comparative example was manufactured that was configured in the same way as the above-mentioned preferred embodiment except that the bandwidth extending inductance Lx in FIG. 1A was not connected and the after-mentioned third capacitor Cf was connected. The tunable filter 41 is illustrated in FIG. 7. In addition, when the third capacitor Cf is not connected, the same result as when the third capacitor Cf is connected is obtained. Accordingly, while including the third capacitor Cf, the tunable filter 41 of a comparative example is capable of being used for comparison with the above-mentioned preferred embodiment.

In this tunable filter 41 of a comparative example, it is possible to change a center frequency without changing a pass band width and without deteriorating an attenuation on a high frequency side compared with the pass band. This will be described with reference to FIG. 8 and FIG. 9. A solid line in FIG. 8 indicates the impedance-frequency characteristic of an example of a surface acoustic wave resonator where a groove on a LiNbO$_3$ substrate is filled with metal, and a dashed line indicates the impedance-frequency characteristic of a surface acoustic wave resonator for comparison in which an electrode is formed on a LiNbO$_3$ substrate.

Figure 9:
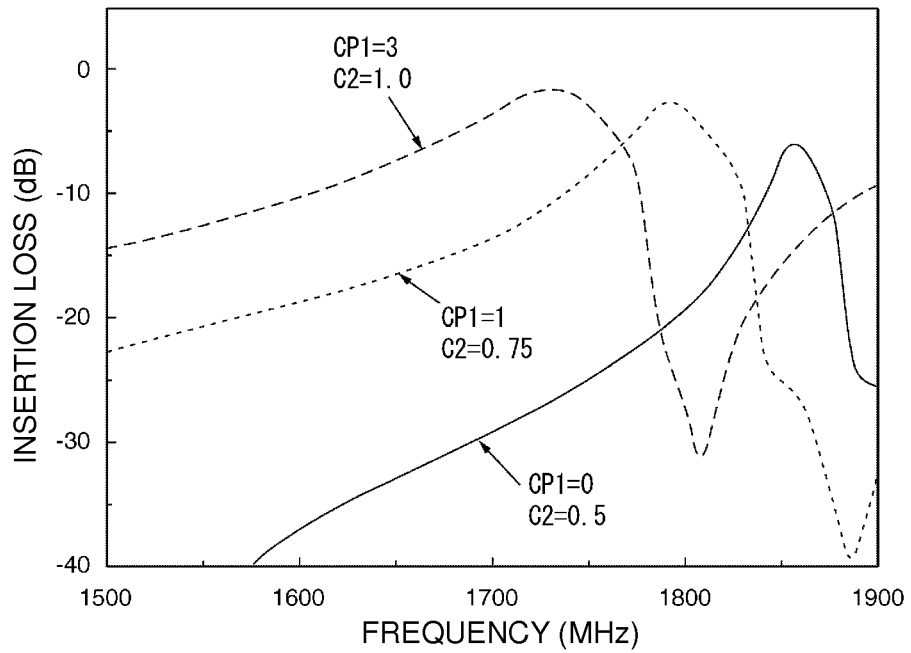
FIG. 9 is a diagram illustrating a frequency characteristic of a tunable filter of a comparative example when embedded electrode-type surface acoustic wave resonators are used as series arm resonators S1 and S2.

FIG. 9 illustrates a frequency characteristic when the above-mentioned embedded electrode-type surface acoustic wave resonators are used as the series arm resonators S1 and S2 in the above-mentioned tunable filter 41 of a comparative example. Here, the capacitances of the variable capacitor C2 and the variable capacitor C3 are also caused to be equal to each other and the capacitances of the variable capacitor CP1 and the variable capacitor CP2 are also caused to be equal to each other.

As is clear from FIG. 9, when the variable capacitors C2 and CP1 are changed from C2=about 0.5 pF and CP1=0 (the CP1 is not connected), to C2=about 0.75 pF and CP1=about 1 pF, and to C2=about 1.0 pF and CP1=about 3 pF, it is only possible to change a center frequency by about 7% from about 1858 MHz, to about 1798 MHz, and to about 1733 MHz.

In addition, as is clear from a comparison between FIG. 6 and FIG. 9, since the tunable filter 1 of the present preferred embodiment includes the bandwidth extending inductance Lx, it is possible to achieve a wider bandwidth than the tunable filter 41 of the comparative example.

In addition, since impedance values when the electrostatic capacitances of the capacitors C1 and C4 are about 2.5 pF become about 35Ω at about 1800 MHz and are roughly matched to external impedances of about 50Ω, it is possible to reduce an insertion loss. In addition, the impedance of the inductance L1 (the inductance value thereof is about 4.5 nH) in the vicinity of about 1800 MHz is about 45 Q.

In addition, even if the third capacitor Cf is omitted from the circuit in FIG. 7, it is possible to obtain the same result as when the third capacitor Cf is included.

As described above, FIG. 8 is a diagram illustrating a comparison between the impedance-frequency characteristic of the surface acoustic wave resonator including the electrode embedded in the LN substrate and the impedance-frequency characteristic of the surface acoustic wave resonator of an existing type in which the electrode is provided on the LN substrate. In each of the surface acoustic wave resonator of an embedded electrode-type and the surface acoustic wave resonator of a non-embedded electrode-type, the IDT electrode and the reflector include Cu and have normalized film thicknesses H/λ of about 0.1, for example.

Figure 8:
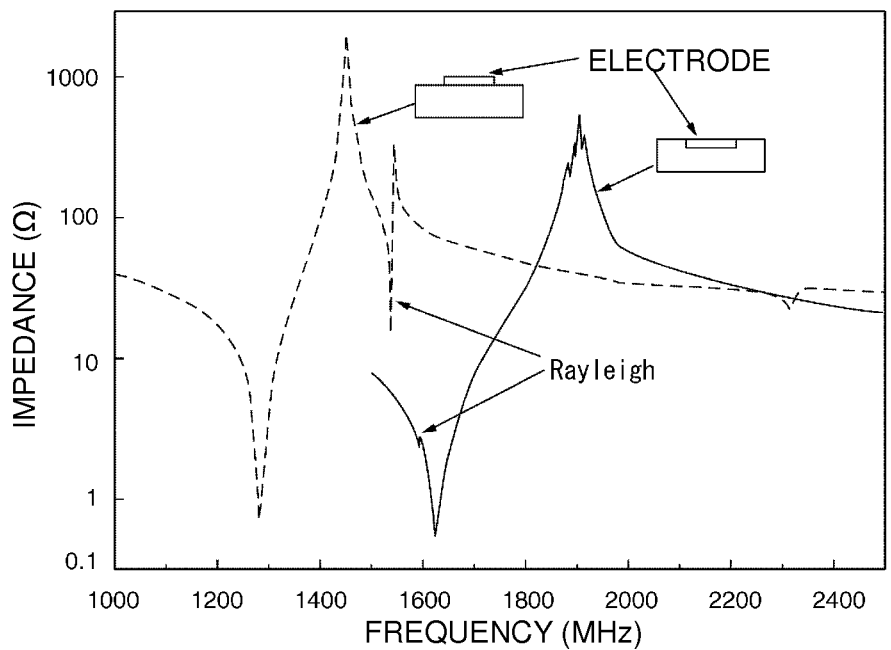
FIG. 8 is a diagram illustrating impedance characteristics of an embedded electrode-type surface acoustic wave resonator where a groove on a $LiNbO_3$ substrate is filled with metal and a surface acoustic wave resonator for comparison in which an electrode is provided on a $LiNbO_3$ substrate.

As is clear from FIG. 8, in the surface acoustic wave resonator of a non-embedded electrode-type, a fractional band width is about 13%. Accordingly, it is understood that, compared with the fractional band width of about 17% of the surface acoustic wave resonator of an embedded electrode-type, the fractional band width becomes narrow in the surface acoustic wave resonator of a non-embedded electrode-type. Even in the case of such a surface acoustic wave resonator of a non-embedded electrode-type, in which the fractional band width is small, if a resonance point is shifted due to the bandwidth extending inductance, it is possible to magnify the fractional band width. Accordingly, it is possible to obtain a large frequency variable amount in the tunable filter. In addition, here, the fractional band width is a value obtained by dividing the absolute value of a difference between a resonant frequency and an anti-resonant frequency by the resonant frequency.

Figure 10:
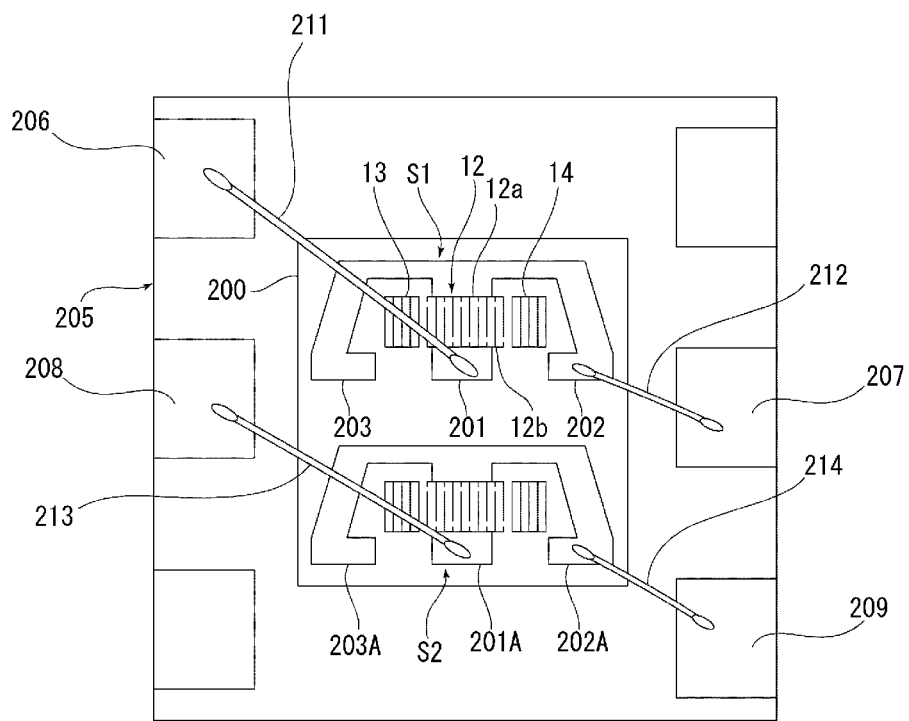
FIG. 10 is a schematic plan cross-sectional view used for explaining the tunable filter according to the first preferred embodiment of the present invention, and here, actual layouts of the series arm resonators S1 and S2 on a piezoelectric substrate and a state in which the piezoelectric substrate is housed in a package are illustrated.
Figure 11:
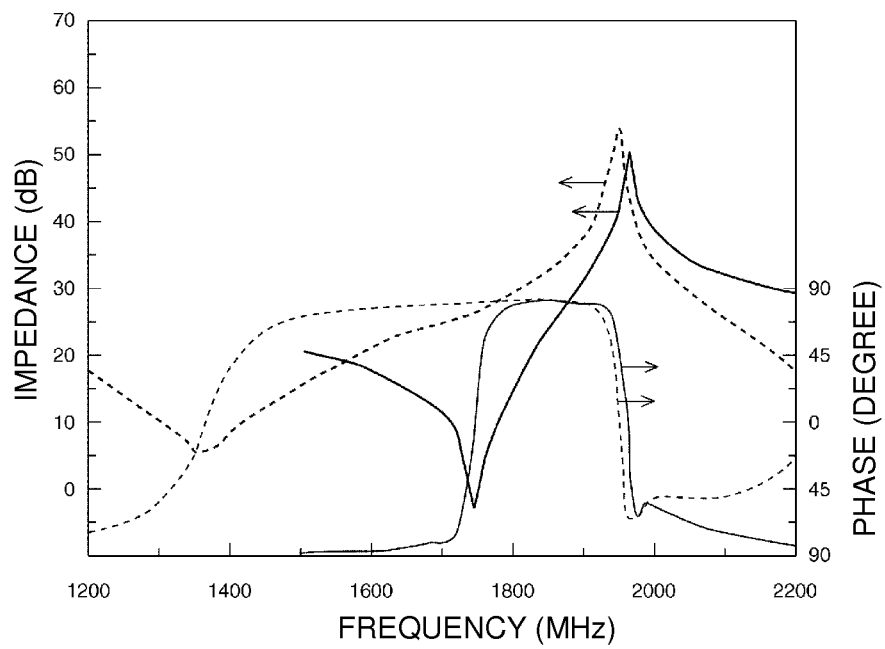
FIG. 11 is a diagram illustrating frequency characteristics of a surface acoustic wave resonator measured in the first preferred embodiment, solid lines indicate an impedance characteristic and a phase characteristic of a surface acoustic wave resonator in which no bonding wire is connected, and dashed lines indicate an impedance characteristic and a phase characteristic of a surface acoustic wave resonator in which a bonding wire is connected.

In the tunable filter 1 of the present preferred embodiment, the bandwidth extending inductance Lx is configured due to a bonding wire electrically connecting the surface acoustic wave resonator to the package. In this case, since an extra component to configure the bandwidth to extend inductance Lx is not necessary, it is possible to achieve downsizing. With reference to FIG. 10 and FIG. 11, an example of a specific structure will be described in which the bandwidth extending inductance Lx is configured using a bonding wire.

FIG. 10 is a schematic plan cross-sectional view used for explaining the tunable filter according to the first preferred embodiment. Here, the actual layouts of the series arm resonators S1 and S2 on a piezoelectric substrate 200 and a state in which the piezoelectric substrate 200 is housed in the package are illustrated.

More specifically, the piezoelectric substrate 200 including a 15° Y-cut LiNbO$_3$ substrate is preferably used, for example. On the piezoelectric substrate 200, the series arm resonators S1 and S2 are configured.

The series arm resonator S1 is a one port type surface acoustic wave resonator including the IDT electrode 12. The IDT electrode 12 includes comb-shaped electrodes 12a and 12b. On both sides in the surface acoustic wave propagation direction of the IDT electrode 12, the reflectors 13 and 14 are provided. Electrode material is embedded in grooves formed in the top surface of the piezoelectric substrate 200, and hence, the IDT electrode 12 and the reflectors 13 and 14 are provided. As the electrode material, a Cu electrode is preferably used. The normalized film thicknesses of the electrode fingers of the IDT electrode 12 and the reflectors 13 and 14 are preferably set to about 0.07, and the duties thereof are set to about 0.6, for example.

In the same way as the series arm resonator S1, the series arm resonator S2 is also configured.

In addition, on the piezoelectric substrate 200, terminals 201, 202, and 203 include an electrode film. The terminal 201 is connected to the comb-shaped electrode 12b of the IDT electrode 12. The terminals 202 and 203 are electrically connected to the comb-shaped electrode 12a.

Also in the series arm resonator S2, one end portion of the IDT electrode is connected to a terminal 201A. The other end portion of the IDT electrode is connected to terminals 202A and 203A. The terminals 201 to 203 and 201A to 203A are formed preferably using the same electrode material as the material configuring the IDT electrode.

The above-mentioned piezoelectric substrate 200 is housed within a package 205. On a package 205 side, electrodes 206 to 209 are provided. The terminal 201 is connected to the electrode 206 via a bonding wire 211. In the same way, the terminal 202 is connected to the electrode 207 via a bonding wire 212. In addition, the terminal 201A is connected to the electrode 208 via a bonding wire 213, and the terminal 202A is connected to the electrode 209 via a bonding wire 214. Now, for the sake of explaining the influences of the bonding wires 211 and 212, the series arm resonator S1 will be described as a representative.

Solid lines in FIG. 11 indicate the impedance characteristic and the phase characteristic of the series arm resonator S1 before the bonding wires 211 and 212 are connected. In addition, actually, in the wafer of a mother before being divided into individual piezoelectric substrates 200, a probe on a signal electric potential side was caused to be in contact with the terminal 201, and a leading end portion of a probe on a ground potential side was caused to be in contact with the terminal 202, thereby performing measurement.

In addition, dashed lines in FIG. 11 indicate an impedance characteristic and a phase characteristic between the electrodes 206 and 207 after the piezoelectric substrate 200 has been mounted in the above-mentioned package 205 and the terminals 201 and 202 have been connected to the electrodes 206 and 207 via the bonding wires 211 and 212. In this case, after a mother wafer was divided and the piezoelectric substrate 200 was obtained, measurement was performed after connection due to the bonding wires 211 and 212 was performed.

As is clear from the dashed line in FIG. 11, it is understood that, in the impedance characteristic between the electrodes 206 and 207, a resonance point is shifted to a low frequency side due to the inductance of the bonding wire, and accordingly, a band width is magnified that serves as a difference between an anti-resonant frequency and a resonant frequency. The bonding wire functions as a bandwidth extending inductance.

Figure 12A:
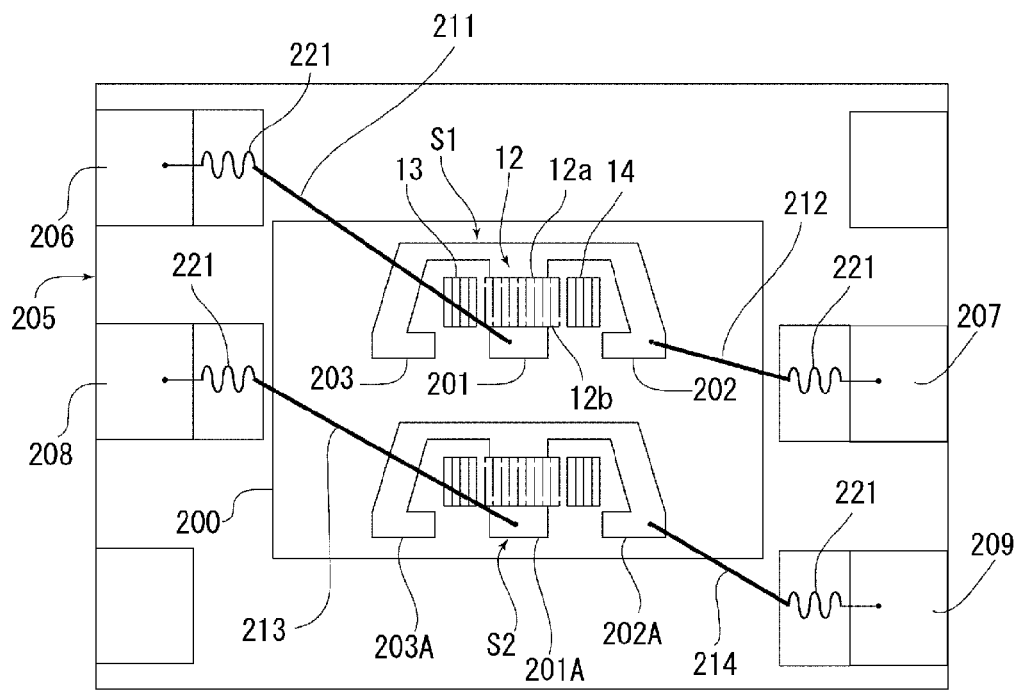
FIG. 12A is a schematic plan view used for explaining a bandwidth extending inductance including a conductor pattern of a meander shape, provided in a package, in another example of a modification to the first preferred embodiment of the present invention.

While, in the above-mentioned first preferred embodiment, the bandwidth extending inductance including the bonding wire is preferably used, a bandwidth extending inductance 221 may also be used that includes a conductor pattern of a meander shape provided in the package 205, as illustrated in FIG. 12A.

Figure 12B:
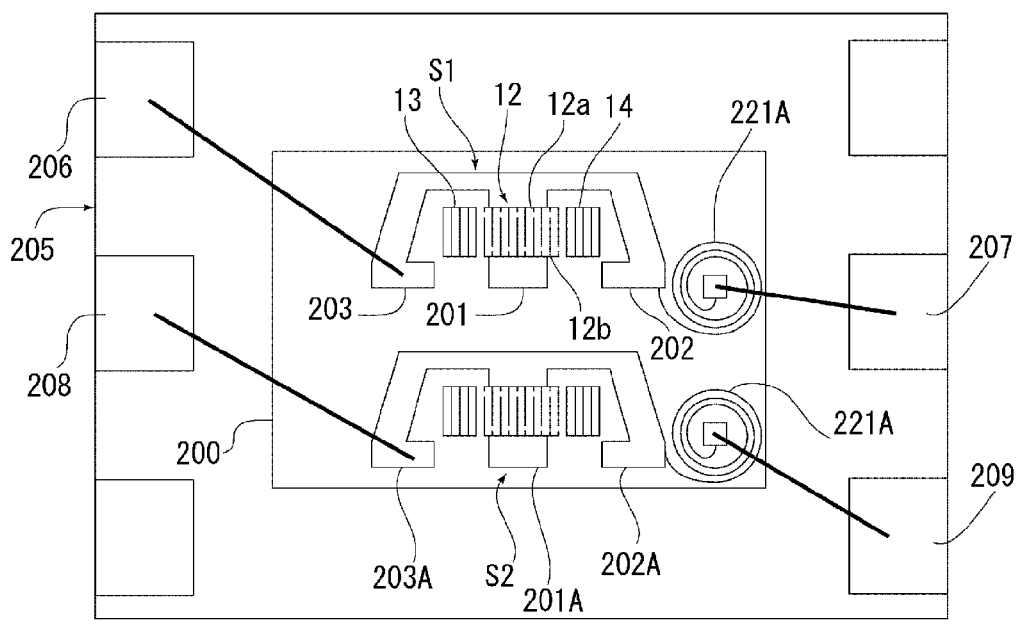
FIG. 12B is a schematic plan view used for explaining a bandwidth extending inductance including a conductor pattern of a spiral shape or a meander shape, provided on a piezoelectric substrate.

In addition, as illustrated in FIG. 12B, a bandwidth extending inductance 221A may also be used that includes a conductor pattern of a spiral shape provided not in the package 205 but on the piezoelectric substrate 200.

As illustrated in FIGS. 12A and 12B, the bandwidth extending inductance may be the conductor pattern of a spiral shape or a meander shape.

FIGS. 12A and 12B have illustrated so-called face-up type surface acoustic wave resonator element chips where the electrode forming surface of the piezoelectric substrate faces upward. In a preferred embodiment of the present invention, a face-down type surface acoustic wave resonator element chip may also be used where the IDT electrode forming surface of a surface acoustic wave resonator element chip is caused to face the mounting electrode plane of the package.

As the bandwidth extending inductance Lx of the face-down type surface acoustic wave resonator, such a conductor pattern of a spiral shape or a meander shape as illustrated in FIG. 12A or 12B is used.

Example of Modification to First Preferred Embodiment

Hereinafter, with reference to FIGS. 13 to 16, an example of a modification in the tunable filter of the first preferred embodiment will be described.

As described above, in the first preferred embodiment, the third capacitor Cf used in the tunable filter 41 of a comparative example illustrated in FIG. 7 is not connected. In this case, in the same way as the case where the third capacitor Cf is connected, it is possible to magnify a pass band width and it is possible to increase a frequency variable amount. However, while, in the frequency characteristic of the first preferred embodiment illustrated in FIG. 6, it is possible to increase the steepness of the filter characteristic on a pass band high-frequency side, the steepness on a low frequency side is not particularly high.

On the other hand, in a band pass filter on a relatively high-frequency side in a duplexer, the high steepness of a filter characteristic on a low frequency side is desired. Therefore, the circuit of a tunable filter was studied that is capable of increasing the steepness of a filter characteristic on a low frequency side.

Figure 13A:
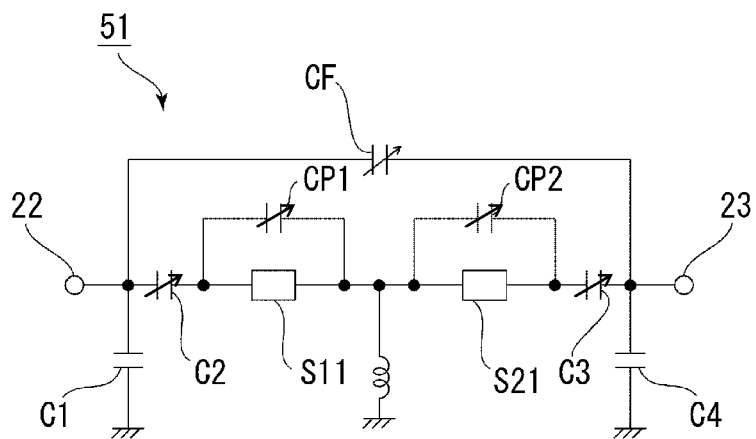
FIG. 13A is a diagram illustrating a circuit configuration of a tunable filter according to an example of a modification to the first preferred embodiment.
Figure 13B:
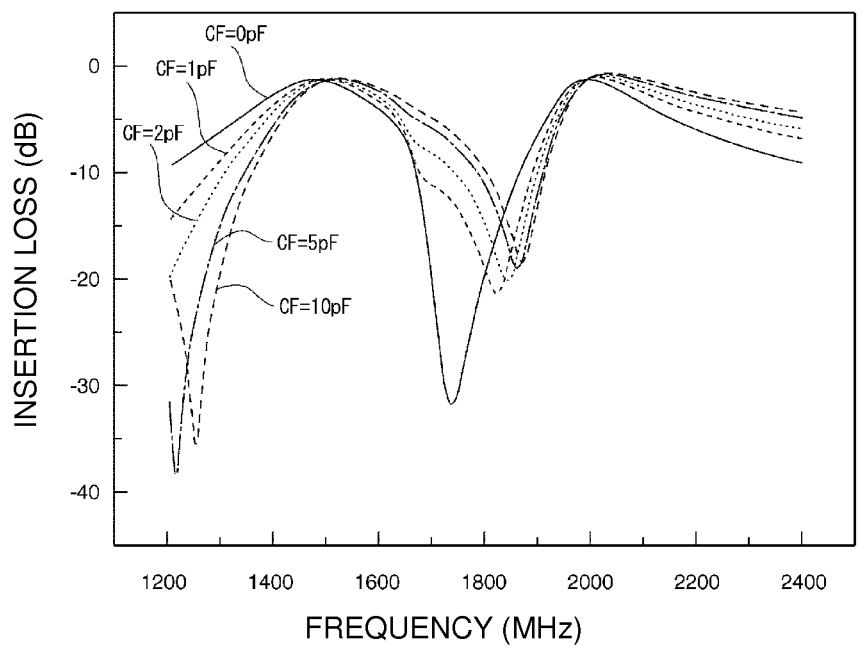
FIG. 13B is a diagram illustrating a frequency characteristic when a capacitance of a capacitor CF is changed.

The third capacitor Cf was added to the circuit in FIGS. 1A-1D, and a tunable filter 51 illustrated in FIG. 13A was designed. FIG. 13B illustrates a frequency characteristic when the capacitance of the third capacitor Cf is changed to 0 pF, about 1 pF, about 2 pF, about 5 pF, or about 10 pF in this tunable filter 51. As is clear from FIG. 13B, it is understood that it is possible to increase the steepness of a filter characteristic on a low frequency side.

Figure 14:
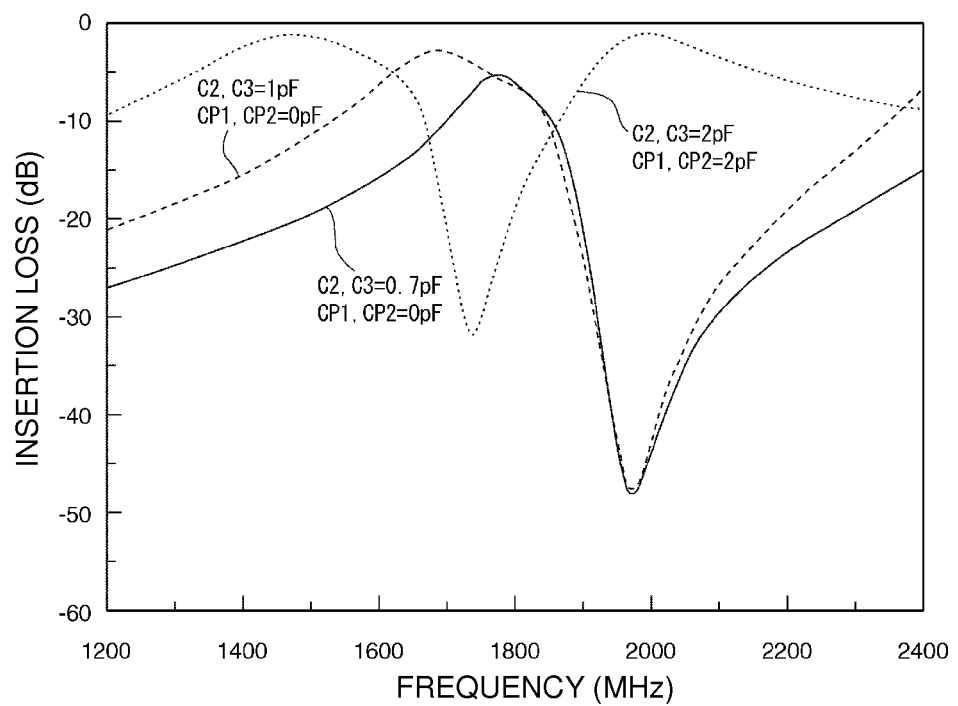
FIG. 14 is a diagram illustrating a frequency characteristic when the capacitor CF is not connected in the tunable filter illustrated in FIG. 13A and capacitances of capacitors C2 and C3 are set to about 0.7 pF, about 1 pF, or about 2 pF and electrostatic capacitances of capacitors CP1 and CP2 are set to 0 or about 2 pF, for example.

In addition, in the tunable filter 51, as illustrated in FIG. 13B, a rebound on the high frequency side of an attenuation pole is large, and an attenuation in the vicinity of 2400 MHz is deteriorated. FIG. 14 illustrates the frequency characteristic of the tunable filter 51 when the electrostatic capacitances of the capacitors C2 and C3 are caused to be equal to each other, the capacitance of the capacitor C2 is set to about 0.7 pF, about 1 pF, or about 2 pF, the electrostatic capacitances of the capacitors CP1 and CP2 are caused to be equal to each other, and the capacitance of the capacitor CP1 is set to 0 or about 2 pF. As is clear from FIG. 14, it is understood that even if the capacitance values of the capacitors C2, C3, CP1, and CP2 are changed, an attenuation in the vicinity of 2400 MHz remains to be deteriorated.

Figure 15A:
FIG. 15A is a circuit diagram of a second tunable filter connected to a tunable filter according to an example of a modification to a preferred embodiment of the present invention.

Therefore, it was considered that an out-of-band attenuation was improved by cascade-connecting, to the tunable filter 51, a second tunable filter 301 of a circuit illustrated in FIG. 15A. In this second tunable filter 301, an inductance 302 and a variable capacitor 303 are connected in series to each other.

Figure 15B:
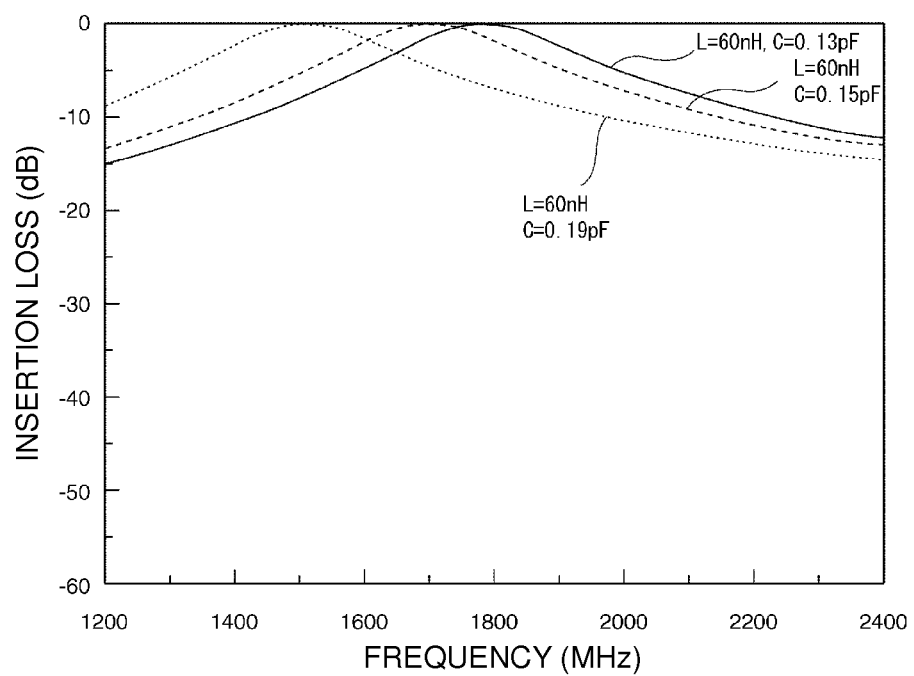
FIG. 15B is a diagram illustrating a change in a frequency characteristic when an electrostatic capacitance of a variable capacitor in FIG. 15A is changed.
Figure 16A:
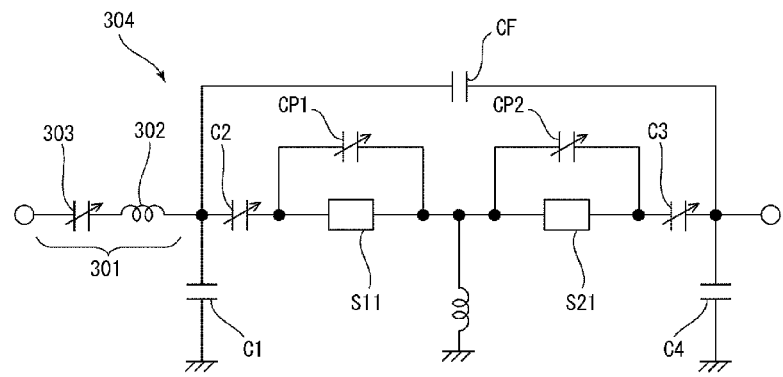
FIG. 16A is a circuit diagram illustrating a tunable filter of an example of a modification to a preferred embodiment of the present invention where the second tunable filter illustrated in FIG. 15A is cascade-connected to the tunable filter illustrated in FIG. 15A.
Figure 16B:
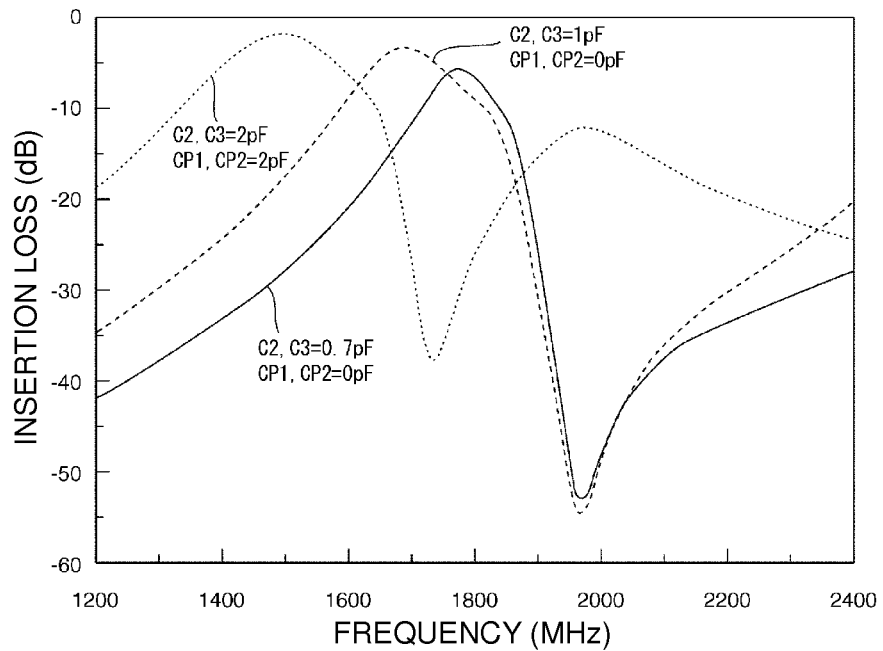
FIG. 16B is a diagram illustrating a frequency characteristic of a tunable filter of the present example of a modification to a preferred embodiment of the present invention.

FIG. 15B illustrates a change in a frequency characteristic when, in the second tunable filter 301, the inductance value of the inductance 302 is fixed at 60 nH and the electrostatic capacitance of the variable capacitor 303 is changed from about 0.13 pF, to about 0.15 pF, and to about 0.19 pF. As is clear from FIG. 15B, it is understood that the electrostatic capacitance of the variable capacitor is changed in such a way as described above and hence, it is possible to frequency-change a center frequency from about 1800 MHz, to about 1700 MHz, and to about 1530 MHz. Accordingly, the electrostatic capacitance of the variable capacitor 303 is adjusted, and hence, it is possible to cause the center frequency of the second tunable filter 301 to roughly coincide with the center frequency of the tunable filter 51. The second tunable filter 301, configured so that the center frequency was caused to roughly coincide with the center frequency of the tunable filter 51, was cascade-connected to the tunable filter as illustrated in FIG. 16A, and a tunable filter 304 was manufactured. FIG. 16B illustrates the frequency characteristic of the corresponding tunable filter 304.

As is clear from a comparison between FIG. 14 and FIG. 16B, it is understood that when the second tunable filter 301 is cascade-connected to the tunable filter 1, it is possible to increase an attenuation in the vicinity of 2400 MHz located on a high frequency side away from a pass band.

While, in each of the above-mentioned experimental examples, the tunable filter has been described where the variable capacitor is connected to the series arm resonator circuit portion in which the bandwidth extending inductance is connected to the surface acoustic wave resonator, there is no particular limit to the structure of the variable capacitor. It is possible to use an arbitrary variable capacitor capable of mechanically or electrically changing an electrostatic capacitance.

Figure 3B:
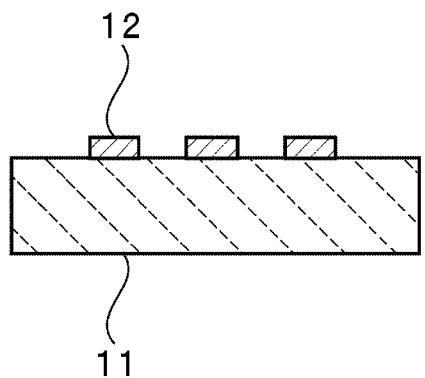
FIG. 3B is an elevational cross-sectional view of a structure in which no $SiO_2$ film in FIG. 3A exists.

In addition, while, in the first preferred embodiment, the embedded electrode-type surface acoustic wave resonator has been used, a surface acoustic wave resonator may also be used where an IDT electrode is formed in the top surface of the piezoelectric substrate as illustrated in FIG. 3B. FIGS. 17 to 25 are diagrams illustrating the characteristics of a surface acoustic wave resonator having the structure of FIG. 3B where an IDT electrode, which includes Al, Mo, Cu, Ni, Ag, Au, W, Ta, or Pt and whose duty is about 0.5, is provided in the top surface of a LiNbO$_3$ substrate of 10° Y-cut X-propagation, specifically, a LiNbO$_3$ substrate with Euler angles of (0°, 100°, 0°). FIG. 17 to FIG. 25 illustrate relationships between the normalized film thickness H/λ of the IDT electrode and the acoustic velocities of individual surface acoustic waves in the upper end portion and the lower end portion of a stop band at the time of the opening of an electrode and in the upper end portion and the lower end portion of a stop band at the time of the short-circuiting of the electrode. In FIG. 17 to FIG. 25, an acoustic velocity corresponding to a resonant frequency and an acoustic velocity corresponding to an anti-resonant frequency are indicated with fr and fa being assigned thereto, respectively.

FIG. 3B is the structure where the SiO$_2$ film in FIG. 3A does not exist.

Figure 17:
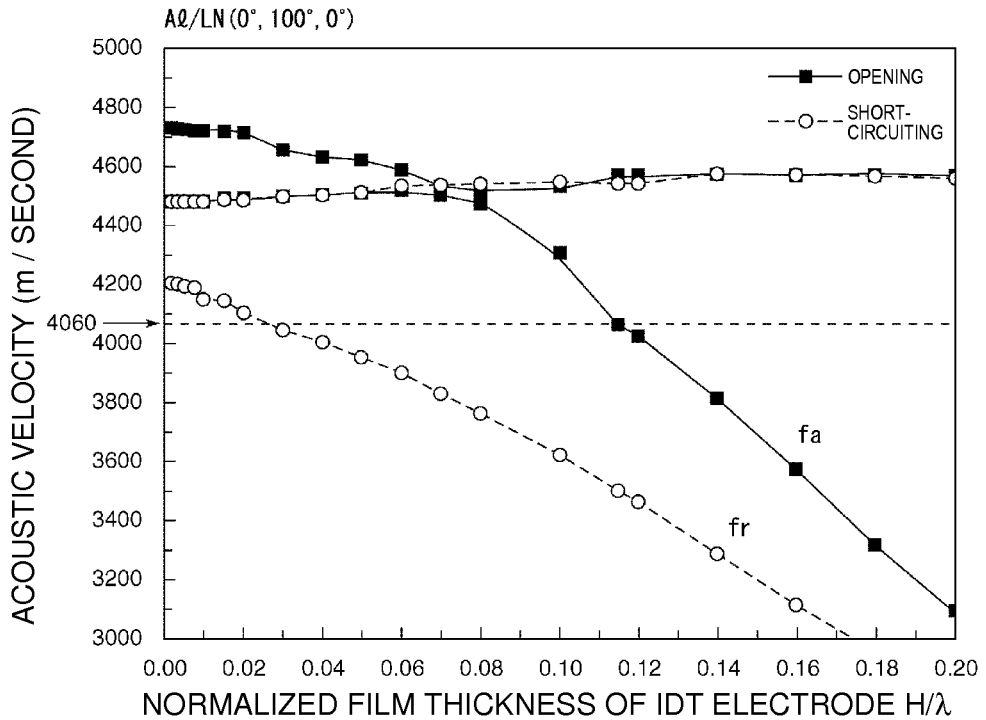
FIG. 17 is a diagram illustrating a relationship between an acoustic velocity of a surface acoustic wave and a normalized film thickness H/λ of an IDT electrode in a surface acoustic wave resonator where the IDT electrode that includes Al and whose duty is about 0.5 is provided on an LN substrate of 10° Y-cut X-propagation.
Figure 18:
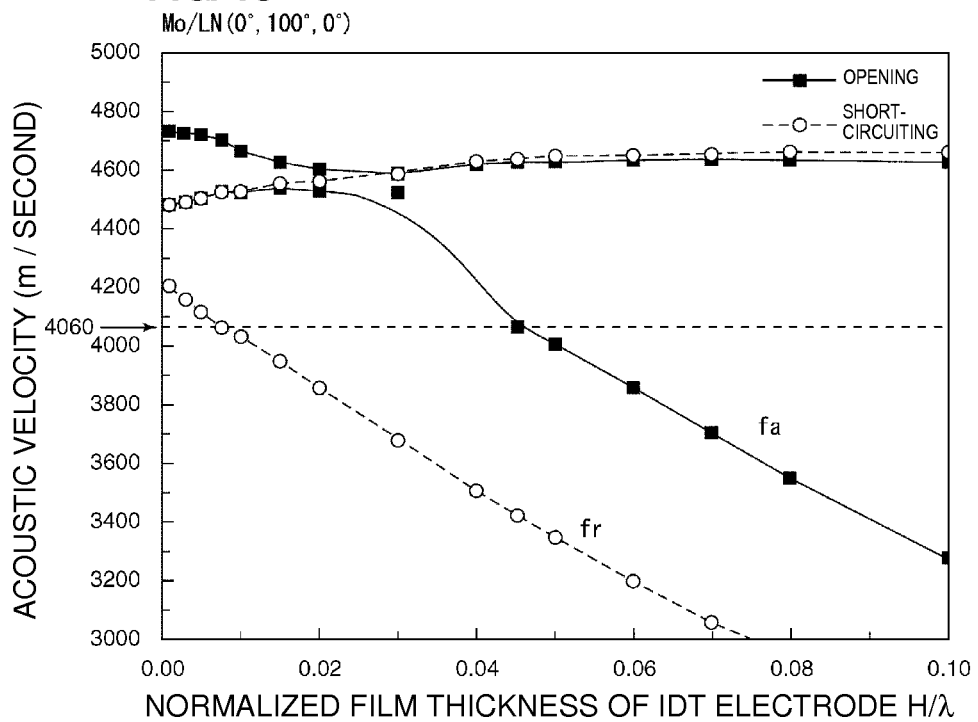
FIG. 18 is a diagram illustrating a relationship between an acoustic velocity of a surface acoustic wave and a normalized film thickness H/λ of an IDT electrode in a surface acoustic wave resonator where the IDT electrode that includes Mo and whose duty is about 0.5 is provided on an LN substrate of 10° Y-cut X-propagation.
Figure 19:
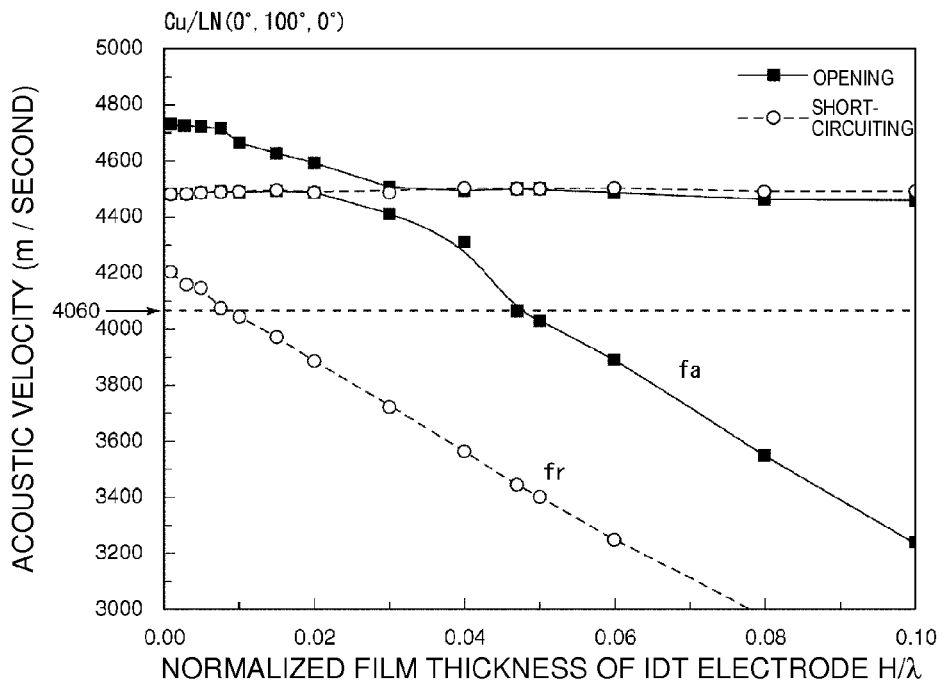
FIG. 19 is a diagram illustrating a relationship between an acoustic velocity of a surface acoustic wave and a normalized film thickness H/λ of an IDT electrode in a surface acoustic wave resonator where the IDT electrode that includes Cu and whose duty is about 0.5 is provided on an LN substrate of 10° Y-cut X-propagation.
Figure 20:
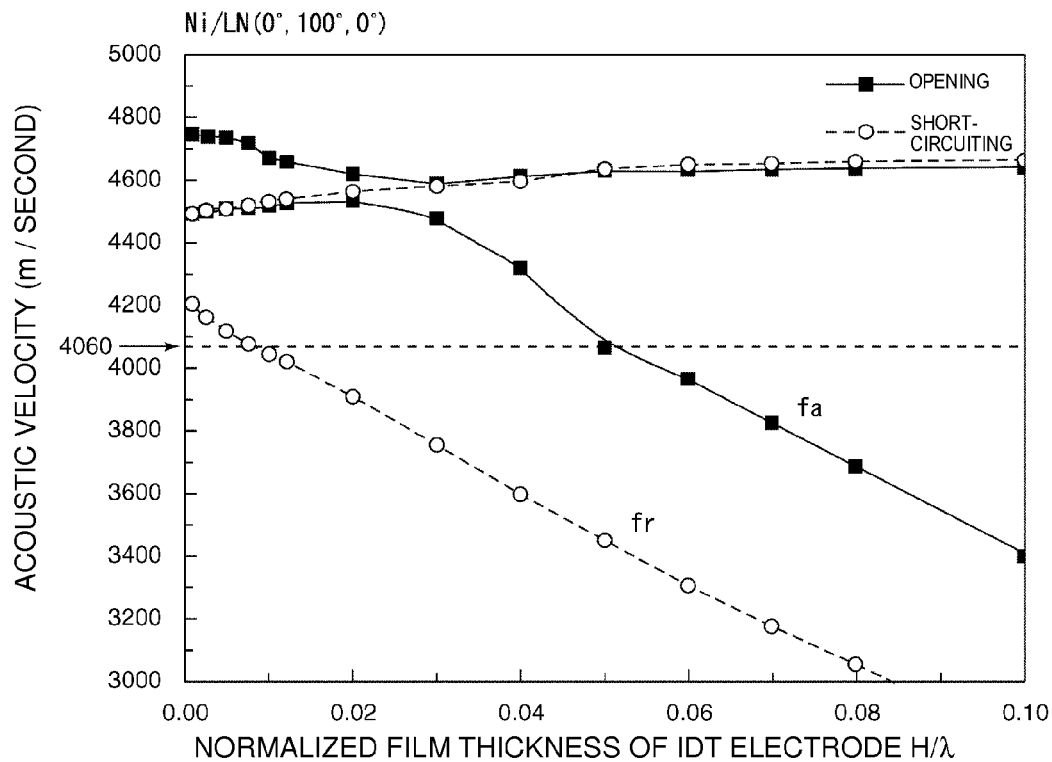
FIG. 20 is a diagram illustrating a relationship between an acoustic velocity of a surface acoustic wave and a normalized film thickness H/λ of an IDT electrode in a surface acoustic wave resonator where the IDT electrode that includes Ni and whose duty is 0.5 is formed on an LN substrate of 10° Y-cut X-propagation.
Figure 21:
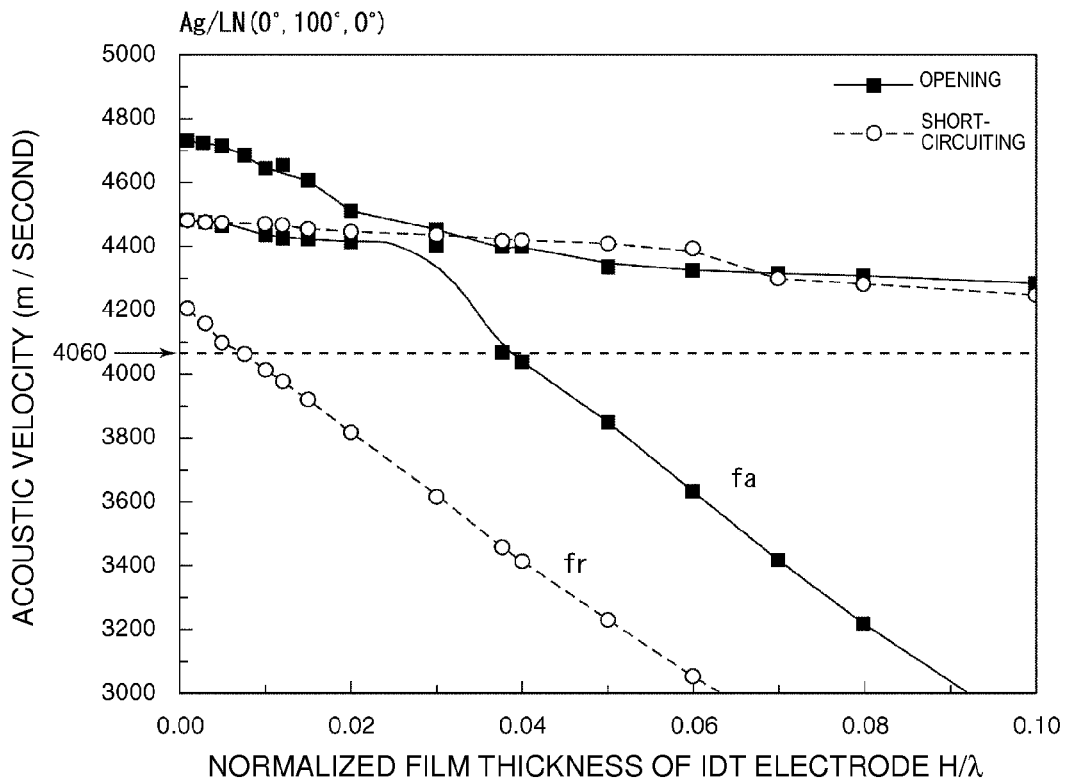
FIG. 21 is a diagram illustrating a relationship between an acoustic velocity of a surface acoustic wave and a normalized film thickness H/λ of an IDT electrode in a surface acoustic wave resonator where the IDT electrode that includes Ag and whose duty is about 0.5 is provided on an LN substrate of 10° Y-cut X-propagation.
Figure 22:
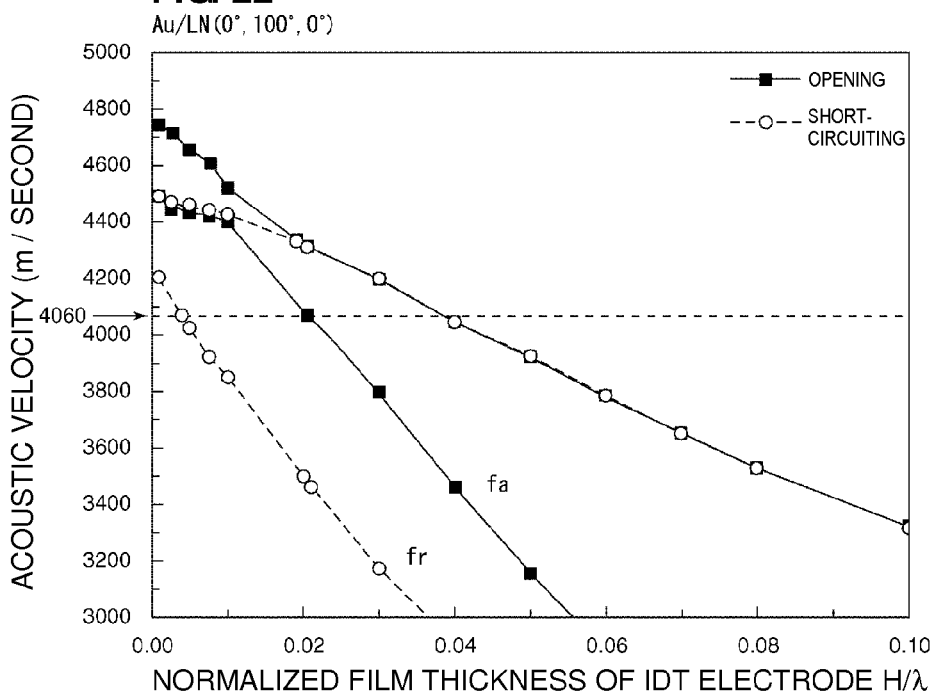
FIG. 22 is a diagram illustrating a relationship between an acoustic velocity of a surface acoustic wave and a normalized film thickness H/λ of an IDT electrode in a surface acoustic wave resonator where the IDT electrode that includes Au and whose duty is about 0.5 is provided on an LN substrate of 10° Y-cut X-propagation.
Figure 23:
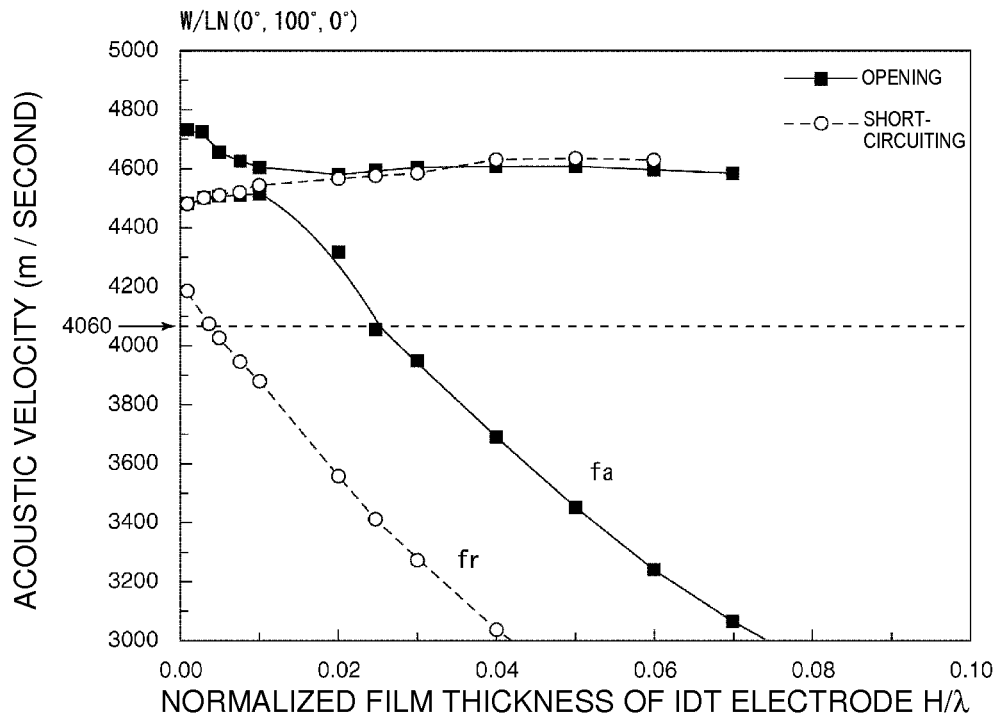
FIG. 23 is a diagram illustrating a relationship between an acoustic velocity of a surface acoustic wave and a normalized film thickness H/λ of an IDT electrode in a surface acoustic wave resonator where the IDT electrode that includes W and whose duty is about 0.5 is provided on an LN substrate of 10° Y-cut X-propagation.
Figure 24:
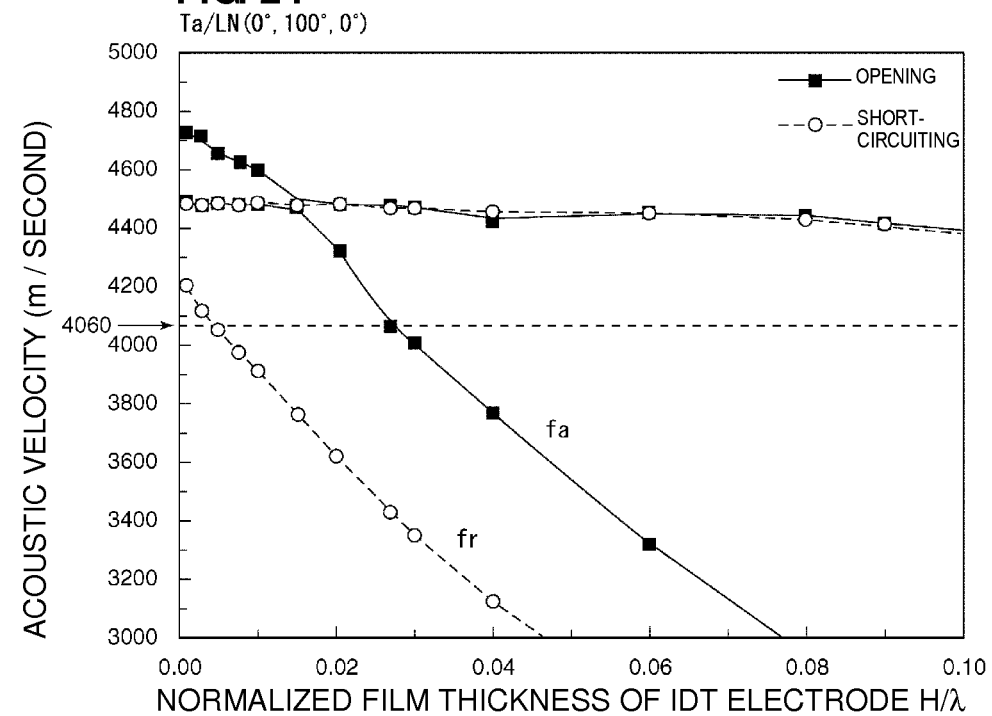
FIG. 24 is a diagram illustrating a relationship between an acoustic velocity of a surface acoustic wave and a normalized film thickness H/λ of an IDT electrode in a surface acoustic wave resonator where the IDT electrode that includes Ta and whose duty is about 0.5 is provided on an LN substrate of 10° Y-cut X-propagation.
Figure 25:
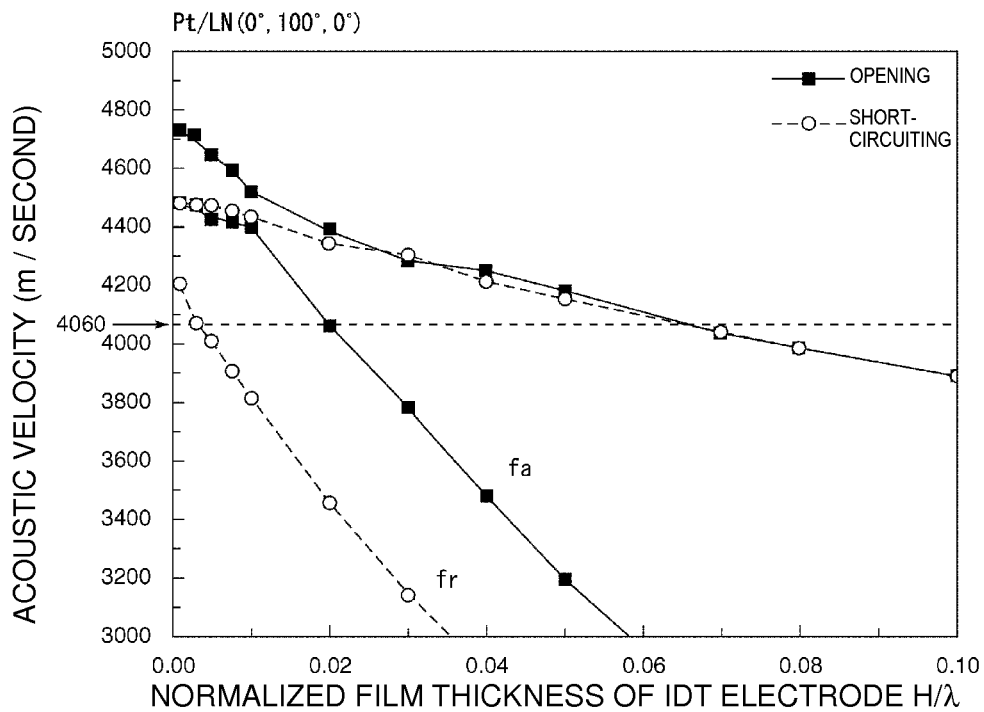
FIG. 25 is a diagram illustrating a relationship between an acoustic velocity of a surface acoustic wave and a normalized film thickness H/λ of an IDT electrode in a surface acoustic wave resonator where the IDT electrode that includes Pt and whose duty is about 0.5 is provided on an LN substrate of 10° Y-cut X-propagation.

As illustrated in FIG. 17, when the electrode includes Al, the normalized film thickness range of the Al electrode where both of the fr and the fa are faster or slower than about 4060 meters per second corresponding to the acoustic velocity of a slow bulk transversal wave is about 0.001 to about 0.03 and greater than or equal to about 0.115, for example. In addition, as illustrated in FIG. 18, when the electrode includes Mo, it is only necessary for the normalized film thickness range of the electrode including Mo to be about 0.001 to about 0.008 and greater than or equal to about 0.045, for example. Summarization including the cases of other electrode metals is as illustrated in the following Table 5.

In the cases of electrodes including metals indicated in a first column in Table 5, it is only necessary for the film thickness of the IDT electrode to be set so as to be within a normalized film thickness range indicated in a second column or a third column.

TABLE 5

| First Column Electrode Material | Second Column Electrode Normalized Film Thickness Range fr, fa > Transversal Wave Acoustic Velocity | Third Column Electrode Normalized Film Thickness Range fr, fa < Transversal Wave Acoustic Velocity |
| --- | --- | --- |
| Al | 0.001 to 0.03 | 0.115 to 0.2 |
| Mo | 0.001 to 0.008 | 0.045 to 0.1 |
| Cu | 0.001 to 0.008 | 0.047 to 0.1 |
| Ni | 0.001 to 0.01 | 0.05 to 0.1 |
| Ag | 0.001 to 0.008 | 0.038 to 0.1 |
| Au | 0.001 to 0.005 | 0.021 to 0.1 |

TABLE 5-continued

| First Column Electrode Material | Second Column Electrode Normalized Film Thickness Range fr, fa > Transversal Wave Acoustic Velocity | Third Column Electrode Normalized Film Thickness Range fr, fa < Transversal Wave Acoustic Velocity |
|---|---|---|
| W | 0.001 to 0.004 | 0.025 to 0.1 |
| Ta | 0.001 to 0.006 | 0.027 to 0.1 |
| Pt | 0.001 to 0.004 | 0.02 to 0.1 |

So as not to cause the slow bulk transversal wave acoustic velocity to be located between the acoustic velocities fr and fa corresponding to the resonant frequency and the anti-resonant frequency, respectively, it is only necessary to adopt the normalized film thickness range in the second column in Table 5. Furthermore, so as to reduce the influence of a leakage component, it is only necessary to use the normalized film thickness range in the third column in Table 5.

Figure 33:
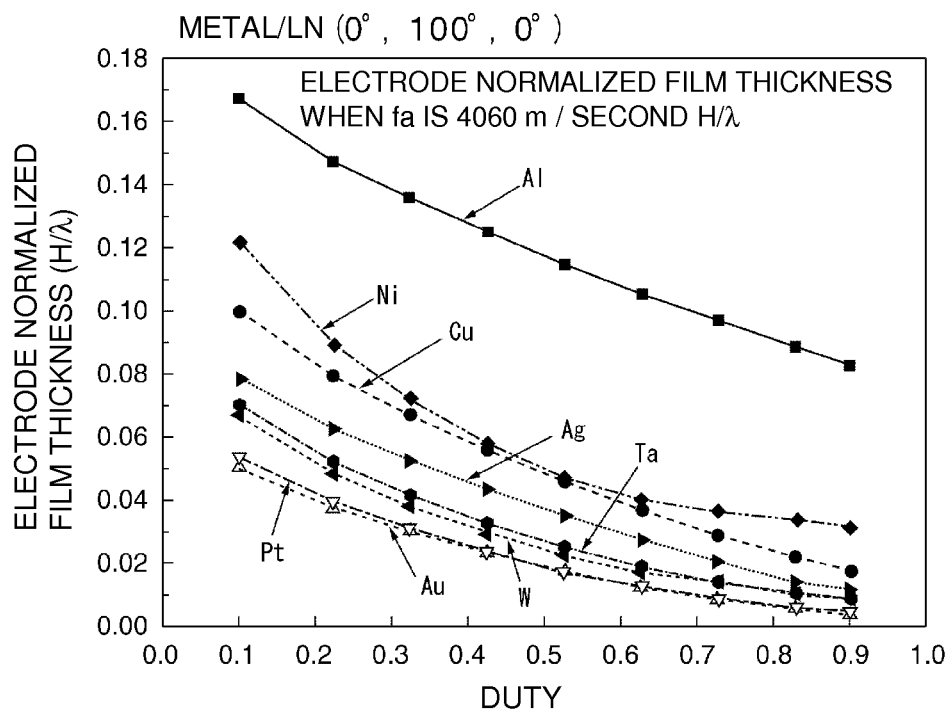
FIG. 33 is a diagram illustrating an electrode film thickness where fa when a duty in an electrode including Al, Mo, Cu, Ni, Ag, Au, W, Ta, or Pt has changed matches a bulk transversal wave acoustic velocity.

FIG. 33 illustrates a relationship between the duty of an electrode including Al, Mo, Cu, Ni, Ag, Au, W, Ta, or Pt and the normalized film thickness (H/λ) of the electrode when the fa coincides with the bulk wave acoustic velocity 4060 meters per second. In addition, Table 6 illustrates a condition to be satisfied by the normalized film thickness (H/λ) of each electrode when the duty is defined as X. When the normalized film thickness (H/λ) is greater than or equal to lines in FIG. 33 or within an electrode film thickness range indicated in the following Table 6, the fa is less than or equal to about 4060 meters per second, and accordingly, the influence of the bulk wave does not remain.

TABLE 6

| Electrode Material | Electrode Normalized Film Thickness H/λ |
|---|---|
| Al | $\geq 0.18032 - 0.15186X + 0.04954X^2$ |
| Mo | $\geq 0.13336 - 0.25984X + 0.1623X^2$ |
| Cu | $\geq 0.11452 - 0.16714X + 0.06712X^2$ |
| Ni | $\geq 0.14498 - 0.27652X + 0.17081X^2$ |
| Ag | $\geq 0.0904 - 0.13393X + 0.0518X^2$ |
| Au | $\geq 0.05966 - 0.10753X + 0.05177X^2$ |
| W | $\geq 0.08039 - 0.15733X + 0.08902X^2$ |
| Ta | $\geq 0.08344 - 0.15413X + 0.0806X^2$ |
| Pt | $\geq 0.06404 - 0.12311X + 0.06493X^2$ |

X in the table indicates a duty ratio

Figure 26:
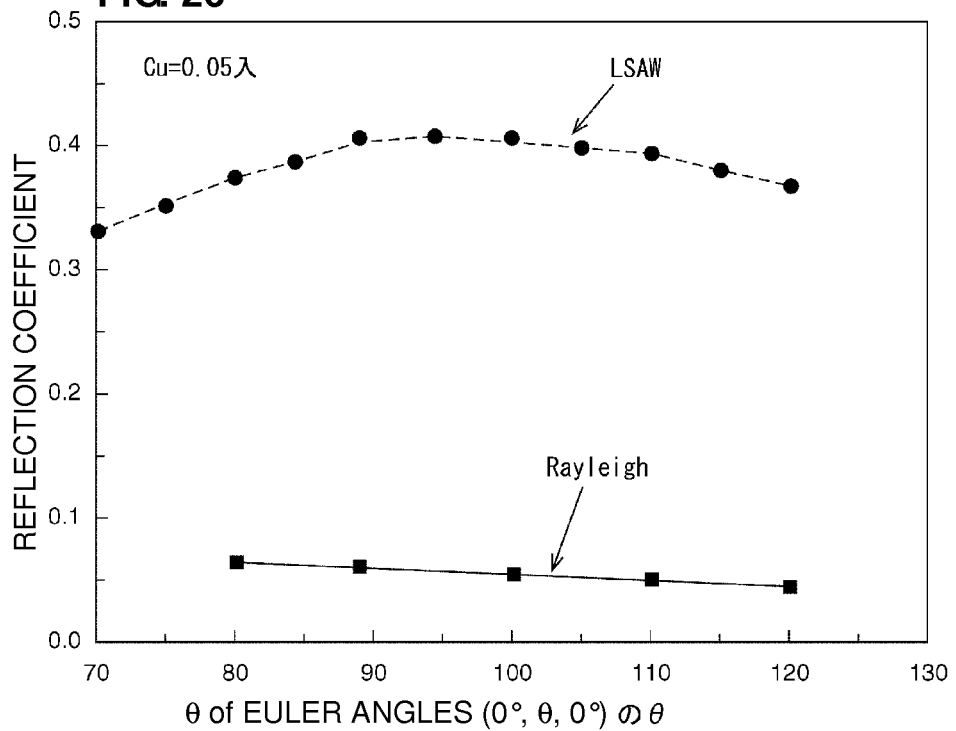
FIG. 26 is a diagram illustrating a relationship between θ of Euler angles (0°, θ, 0° of an LN substrate and a reflection coefficient in a surface acoustic wave resonator where an IDT electrode that includes Cu, whose thickness is about 0.05λ, and whose duty is about 0.5 is provided on a LiNbO$_3$ substrate.
Figure 27:
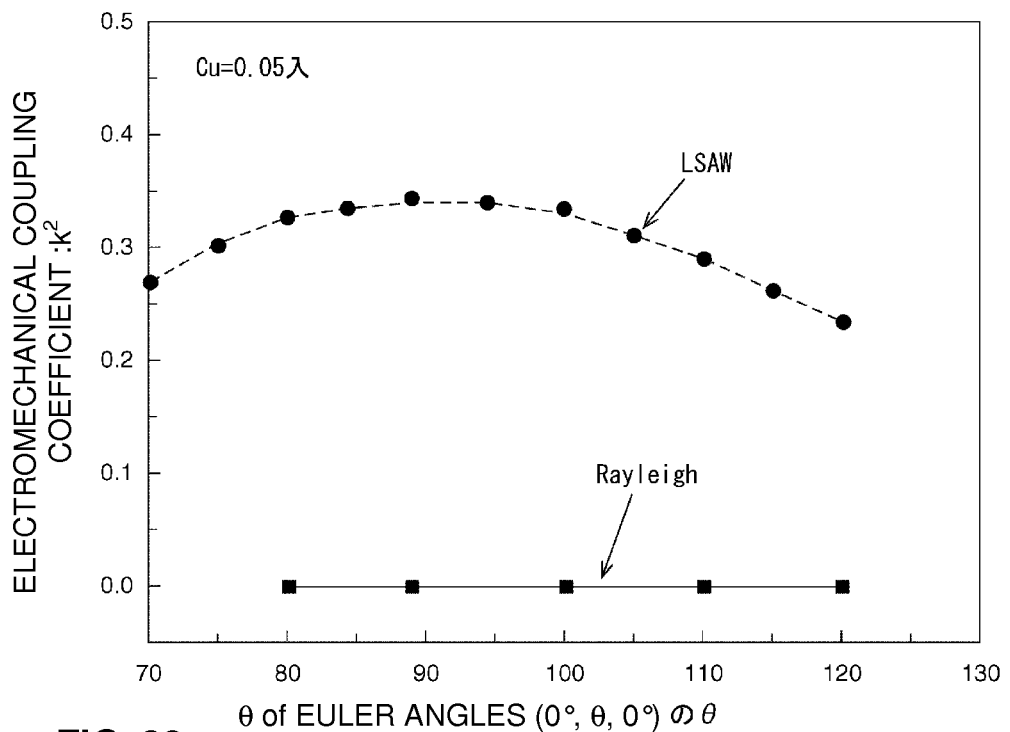
FIG. 27 is a diagram illustrating a relationship between θ of Euler angles (0°, θ, 0°) of an LN substrate and an electromechanical coupling coefficient $k^2$ in a surface acoustic wave resonator where an IDT electrode that includes Cu, whose thickness is about 0.05λ, and whose duty is about 0.5 is provided on a LiNbO$_3$ substrate.

FIG. 26 and FIG. 27 illustrate relationships between θ of Euler angles (0°, θ, 0°), a reflection coefficient, and an electromechanical coupling coefficient $k^2$ in a surface acoustic wave resonator when an LN substrate is used, the normalized film thickness of an IDT electrode including Cu is about 0.05, and a duty is about 0.5. While, in FIGS. 17 to 25, the results of the case of LiNbO$_3$ of 10° Y-cut X-propagation with Euler angles of (0°, 100°, 0°), have been illustrated, the reflection coefficient and the electromechanical coupling coefficient $k^2$ poorly change in the range of θ=70° to 115°, as is understood from FIG. 26 and FIG. 27. Accordingly, it is only necessary for the Euler angles of LiNbO$_3$ to be within the ranges of (0°, 70° to 115°, 0°).

While being illustrated with a focus on the duty of about 0.5, a high electric power handling capability is desired in the case of a high-frequency wave. Accordingly, since it is possible to increase the electric power handling capability, the duty less than about 0.5, more preferably, within the range of about 0.15 to about 0.49, has an advantage.

In this case, it is also possible to widen a band width due to the bandwidth extending inductance.

Second Preferred Embodiment

Figure 28:
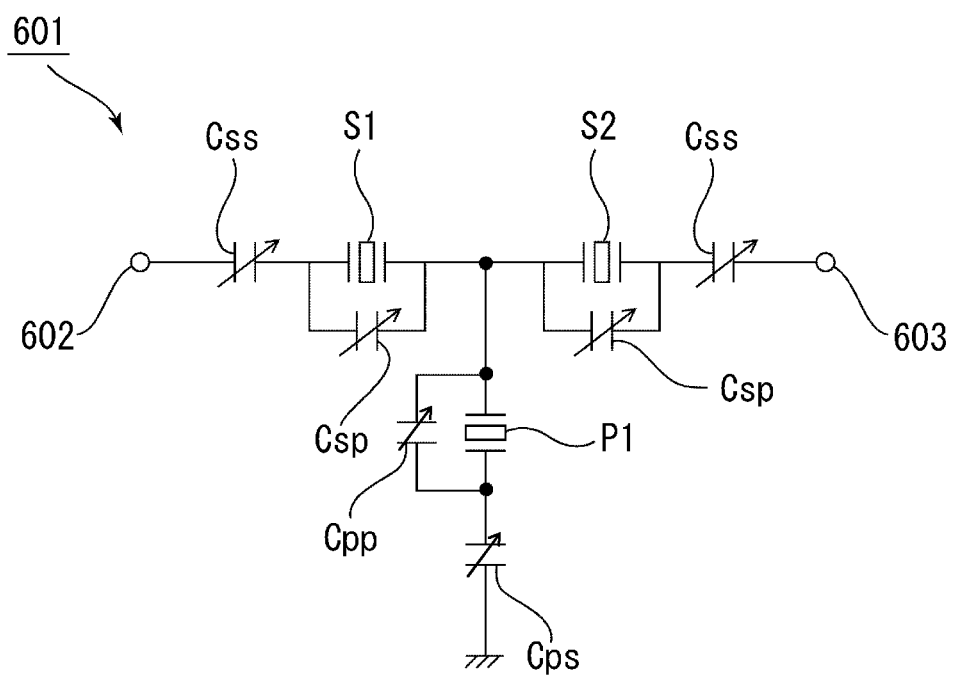
FIG. 28 is a circuit diagram of a tunable filter of a second preferred embodiment of the present invention.

FIG. 28 is a circuit diagram illustrating the tunable filter of a second preferred embodiment of the present invention. The second preferred embodiment is a preferred embodiment of a second invention of the present allocation. In a tunable filter 601 of the second preferred embodiment, in a series arm connecting an input terminal 602 and an output terminal 603 to each other, the series arm resonators S1 and S2 are connected in series to each other. A variable capacitor Css is connected to the input side of the series arm resonator S1, and another variable capacitor Css is connected to the output side of the series arm resonator S2. In addition, a variable capacitor Csp is connected in parallel to the series arm resonator S1, and a variable capacitor Csp is also connected in parallel to the series arm resonator S2.

In a parallel arm connecting the ground potential and a connection point between the series arm resonators S1 and S2 to each other, a parallel arm resonator P1 is provided. A capacitor Cps is connected in series to the parallel arm resonator P1, on the ground side of the parallel arm resonator P1. In addition, a capacitor Cpp is connected in parallel to the parallel arm resonator P1. The tunable filter 601 of the second preferred embodiment is a tunable filter having a ladder circuit configuration where a series arm including the series arm resonators S1 and S2 and a parallel arm including the parallel arm resonator P1 are provided.

In the tunable filter 601 of the ladder circuit configuration, it is assumed that the resonant frequency and the anti-resonant frequency of the series arm resonators S1 and S2 are FrS and FaS, respectively. In addition, it is assumed that the resonant frequency and the anti-resonant frequency of the parallel arm resonator P1 are FrP and FaP, respectively. In this case, in the second preferred embodiment of the present invention, a configuration is adopted so that the FrS, FaS, FrP, and FaP satisfy FrS≤{(n−1) FrP+FaP}/n and FaP≤{(n−1) FaS+FrS}/n where the n is an integer number greater than or equal to 2 and less than or equal to 30. Connection to a variable capacitor connected to at least one of the series arm resonator and the parallel arm resonator is established, and a ladder tunable filter is configured. Therefore, it is possible to increase the frequency variable amount of the tunable filter. This will be described hereinafter in detail.

Figure 29:
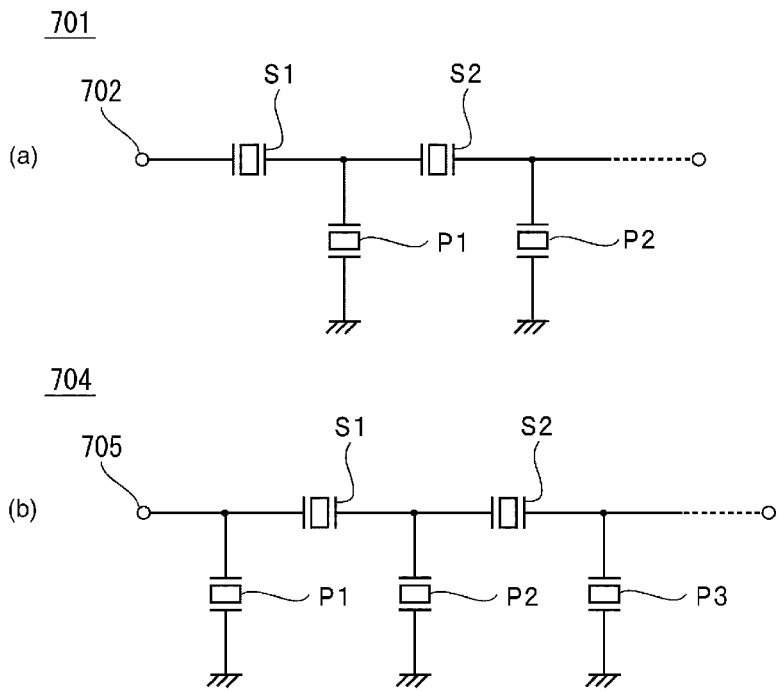
FIGS. 29A and 29B are diagrams illustrating examples of a circuit configuration of a ladder filter.

In general, a ladder filter includes a circuit configuration illustrated in FIG. 29A or FIG. 29B. In a ladder filter 701 illustrated in FIG. 29A, the series arm resonator S1 is connected to an input terminal 702. In addition, the parallel arm resonator P1 nearest to the input terminal 702 is provided in a parallel arm connecting the ground potential and a connection point between the series arm resonator S1 and the subsequent series arm resonator S2 to each other.

On the other hand, in a ladder filter 704 illustrated in FIG. 29B, the parallel arm resonator P1 is connected to an input terminal 705.

Figure 30:
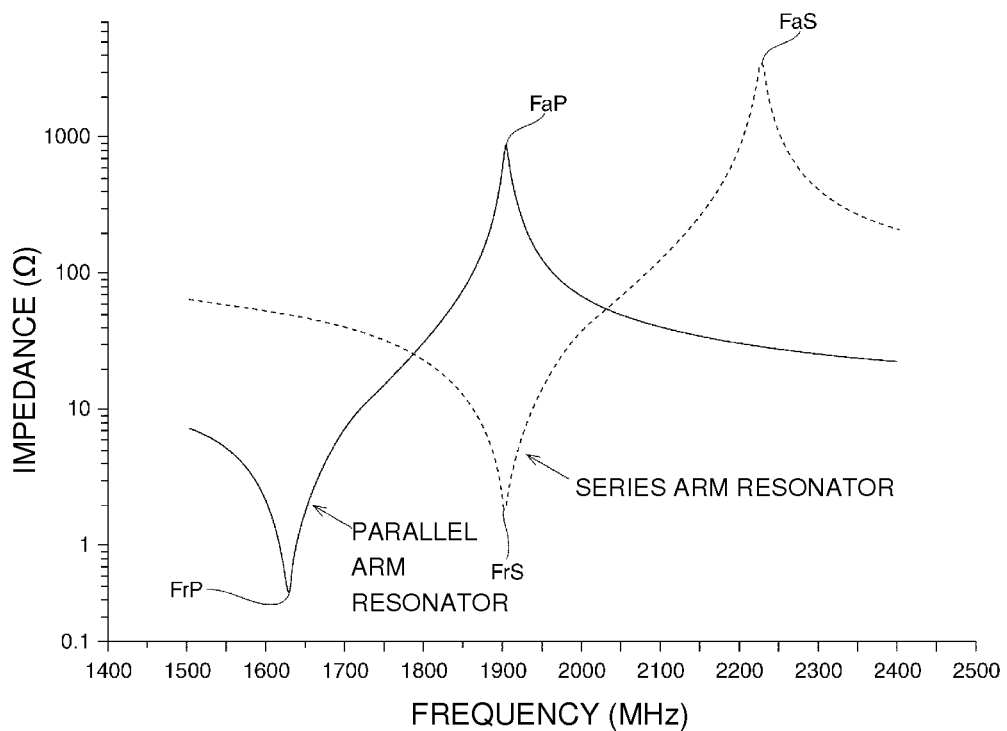
FIG. 30 is a diagram illustrating a relationship between a resonance characteristic of a parallel arm resonator and a resonance characteristic of a series arm resonator in a ladder filter of the related art.

In each of the above-mentioned ladder filters 701 and 704, the frequency characteristic of the series arm resonator and the frequency characteristic of the parallel arm resonator are set as follows. FIG. 30 is a diagram illustrating the impedance characteristics of a series arm resonator and a parallel arm resonator. As illustrated by a solid line in FIG. 30, the anti-resonant frequency FaP of the parallel arm resonator and the resonant frequency FrS of the series arm resonator indicated by a dashed line coincide with each other. In this way, the reduction of an insertion loss within a pass band is achieved.

However, in such a configuration, even if an electrostatic capacitance is connected in series or parallel to each of the series arm resonator and the parallel arm resonator, it is difficult to configure a tunable filter. This will be described hereinafter.

As described above, a pass band is provided around a frequency where the anti-resonant frequency FaP of the parallel arm resonator and the resonant frequency FrS of the series arm resonator coincide with each other. Attenuation poles on both sides of the pass band occur at the resonant frequency FrP of the parallel arm resonator and the anti-resonant frequency FaS of the series arm resonator.

When an electrostatic capacitance is connected in series to the parallel arm resonator, there is an increase in the resonant frequency FrP of the parallel arm resonator. Accordingly, while the frequency of the attenuation pole on the low frequency side of the pass band increases, the pass band does not change.

In addition, when an electrostatic capacitance is connected in parallel to the series arm resonator, the anti-resonant frequency FaS of the series arm resonator decreases. Accordingly, while the frequency of the attenuation pole on the high frequency side of the pass band decreases, the pass band does not change.

On the other hand, when an electrostatic capacitance is connected in parallel to the parallel arm resonator, the anti-resonant frequency FaP of the parallel arm resonator decreases. As a result, a filter characteristic that is a so-called double hump characteristic, is obtained where an insertion loss becomes small at each of the anti-resonant frequency FaP of the parallel arm resonator and the resonant frequency FrS of the series arm resonator. Accordingly, the filter characteristic is degraded. While it is possible to correct the above-mentioned degradation of the filter characteristic if it is possible to decrease the resonant frequency FrS of the series arm resonator, it is impossible to correct the above-mentioned degradation of the filter characteristic using a member to connect an electrostatic capacitance.

In addition, when an electrostatic capacitance is connected in series to the series arm resonator, there is an increase in the resonant frequency FrS of the series arm resonator. In addition, a filter characteristic that is a double hump characteristic, is obtained where an insertion loss becomes small at each of the anti-resonant frequency FaP of the parallel arm resonator and the resonant frequency FrS of the series arm resonator. Accordingly, the filter characteristic is degraded. While it is possible to correct the above-mentioned degradation of the filter characteristic if it is possible to increase the anti-resonant frequency FaP of the parallel arm resonator, it is impossible to correct the above-mentioned degradation of the filter characteristic using a member to connect an electrostatic capacitance.

When n=2 is satisfied in the present preferred embodiment, it is desirable that a setting is performed so that FrS≤(FrP+FaP)/, FaP>FrS, and FaP<FaS are satisfied.

In this case, since the electrostatic capacitance is connected in parallel to the parallel arm resonator, the anti-resonant frequency FaP of the parallel arm resonator decreases. In addition, since the electrostatic capacitance is connected in series to the series arm resonator, the resonant frequency FrS of the series arm resonator is increased. In addition, the anti-resonant frequency FaP of the parallel arm resonator and the resonant frequency FrS of the series arm resonator are caused to coincide with each other, and hence it is possible to obtain a filter characteristic having a center frequency in a frequency band located between the FrS and the FaP before the connection of the electrostatic capacitances. Accordingly, the filter characteristic does not become the double hump characteristic. Accordingly, by adjusting the value of the electrostatic capacitance to be connected, it is possible to obtain a tunable filter where the center frequency of the filter is variable between the FrS and the FaP.

When the electrostatic capacitance is connected in series to the parallel arm resonator in this state, the resonant frequency FrP of the parallel arm resonator increases. Accordingly, the attenuation pole on the low frequency side of the pass band draws nigh to the pass band, and accordingly, it is possible to improve the steepness on the pass band low frequency side of the tunable filter. When the electrostatic capacitance is connected in parallel to the series arm resonator, the anti-resonant frequency FaS of the series arm resonator decreases. Accordingly, the attenuation pole on the high frequency side of the pass band draws nigh to the pass band, and accordingly, it is possible to improve the steepness on the pass band high frequency side of the tunable filter.

When n=2 is satisfied, since it is possible to use, as the series arm and parallel arm resonators, surface acoustic wave resonators where Δf, differences between the anti-resonant frequencies and the resonant frequencies, are approximately equal to one another, design is eased.

More preferably, n=3 is satisfied, and design is performed so as to satisfy FrS≤(2 FrP+FaP)/3, FaP>FrS, and FaP<FaS. Since it is possible to use, as the series arm and parallel arm resonators, surface acoustic wave resonators where Δf, differences between the anti-resonant frequencies and the resonant frequencies, are approximately equal to one another, design is eased.

When being generally illustrated, FrS≤{(n−1) FrP+FaP}/n and FaP≤{(n−1) FaS+FrS}/n are satisfied where the n is an integer number greater than or equal to 2 and less than or equal to 30, as described above.

As is clear from the above description, when no electrostatic capacitance is connected in series to the parallel arm resonator and no electrostatic capacitance is connected in parallel to the series arm resonator, the attenuation poles on both sides of the pass band are farthest from the pass band, and it is possible to obtain the widest 3 dB band width. The 3 dB band width at this time is |FrP−FrS|. Accordingly, the realizable 3 dB band width becomes narrower with an increase in the n. The n may be selected on the basis of the specification of the tunable filter.

As described above, so as to realize a tunable filter capable of increasing a frequency variable range and widening the width of a pass band, it is necessary to prepare a resonator of a wide bandwidth and devise the combination of the frequency characteristic of the series arm resonator and the frequency of the parallel arm resonator. A specific example will be described hereinafter.

Figure 31:
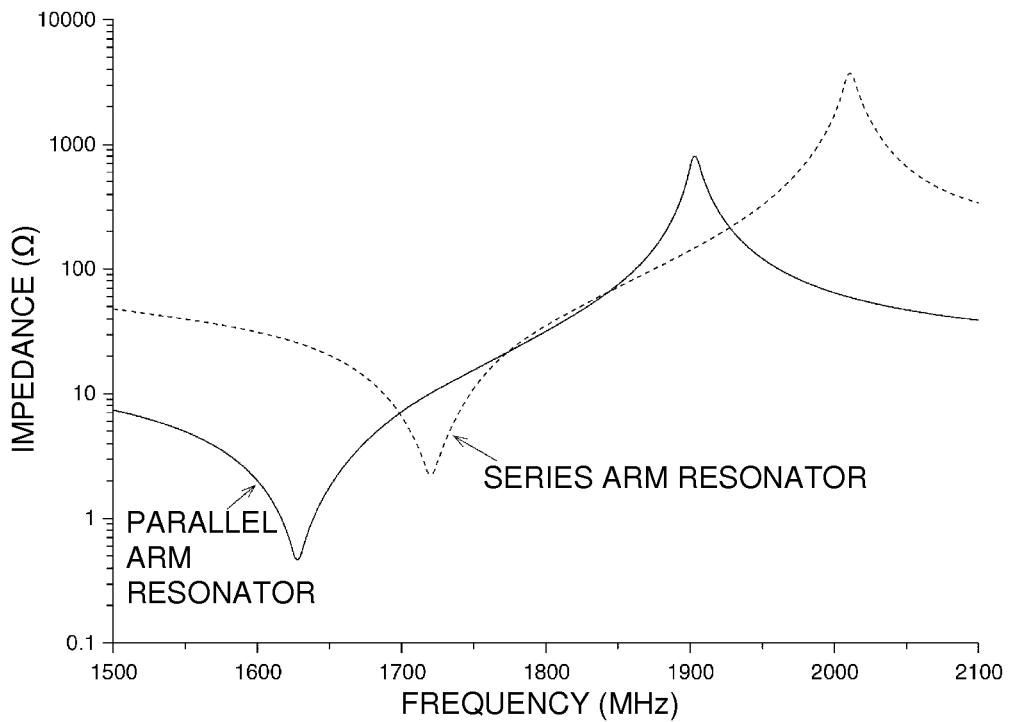
FIG. 31 is a diagram illustrating a relationship between a resonance characteristic of a parallel arm resonator and a resonance characteristic of a series arm resonator in a tunable filter of a first preferred embodiment of the present invention.

FIG. 31 is a diagram illustrating the impedance characteristics of a parallel arm resonator and a series arm resonator, configured using a surface acoustic wave resonator having the above-mentioned embedded electrode. Here, a wave length defined on the basis of the pitch of an IDT electrode and an intersecting width were adjusted, and the impedance characteristics of the parallel arm resonator and the series arm resonator were adjusted.

As is clear from FIG. 31, in the impedance characteristic of the parallel arm resonator, indicated by a solid line, the resonant frequency FrP is about 1629 MHz, and the anti-resonant frequency FaP is about 1903 MHz. On the other hand, the resonant frequency FrS of the series arm resonator was set to about 1720 MHz, higher than about 1629 MHz by about 91 MHz. In addition, design was performed so that the fractional band width of the series arm resonator became about 17% in the same way as the fractional band width of the parallel arm resonator. In addition, the fractional band width of the resonator is a value obtained by dividing a difference between the anti-resonant frequency and the resonant frequency by the resonant frequency.

Using a parallel arm resonator and a series arm resonator having the impedance characteristics illustrated in FIG. 31, the series arm resonators S1 and S2 and the parallel arm resonator P1 in the tunable filter 601 illustrated in FIG. 28 were configured. In this case, as is clear from FIG. 31, the anti-resonant frequencies FaS of the series arm resonators S1 and S2 were set to about 2010 MHz.

Figure 32:
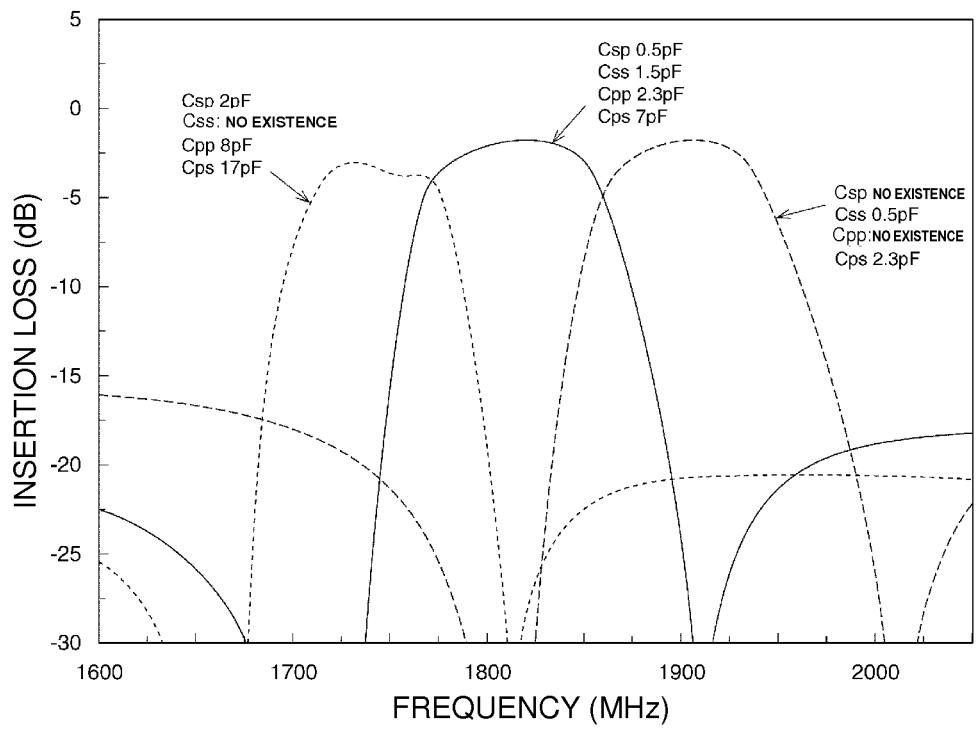
FIG. 32 is a diagram illustrating a filter characteristic of s ladder tunable filter of a second preferred embodiment of the present invention, and is a diagram indicating that it is possible to change a frequency.

FIG. 32 illustrates the filter characteristic of the tunable filter 601 when the electrostatic capacitances of the variable capacitors Css and Csp and the capacitors Cps and Cpp were set to the following first to third combinations.

First Combination: Css=0 pF, Csp=2 pF, Cpp=8 pF, and Cps=17 pF

Second Combination: Css=1.5 pF, Csp=0.5 pF, Cps=7 pF, and Cpp=2.3 pF

Third Combination: Css=0.5 pF, Csp=0 pF, Cps=2.3 pF, and Cpp=0 pF

In FIG. 32, a dashed line indicates the result of the first combination, a solid line indicates the result of the second combination, and a dashed-dotted line indicates the result of the third combination.

As is clear from FIG. 32, it is understood that, by adjusting the amounts of Css, Csp, Cps, and Cpp, it is possible to greatly change the pass band. It is possible to very greatly change a center frequency by as much as about 9%, for example. In addition, in each of the first to third combinations, the 3 dB band width is about 92 MHz, for example.

The 3 dB band width is the width of a frequency domain having an insertion loss larger than a minimum insertion loss within the pass band by about 3 dB. When it is assumed that a frequency in one end portion of this frequency domain is F1 and a frequency in the other end portion thereof is F2, the 3 dB band width is the absolute value of a difference between the frequency F1 and the frequency F2. The center frequency of the tunable filter 601 is expressed by (F1+F2)/2.

Here, when the 3 dB band width is about 92 MHz, it has been possible to set a frequency variable amount to about 9%, as described above.

Figure 34:
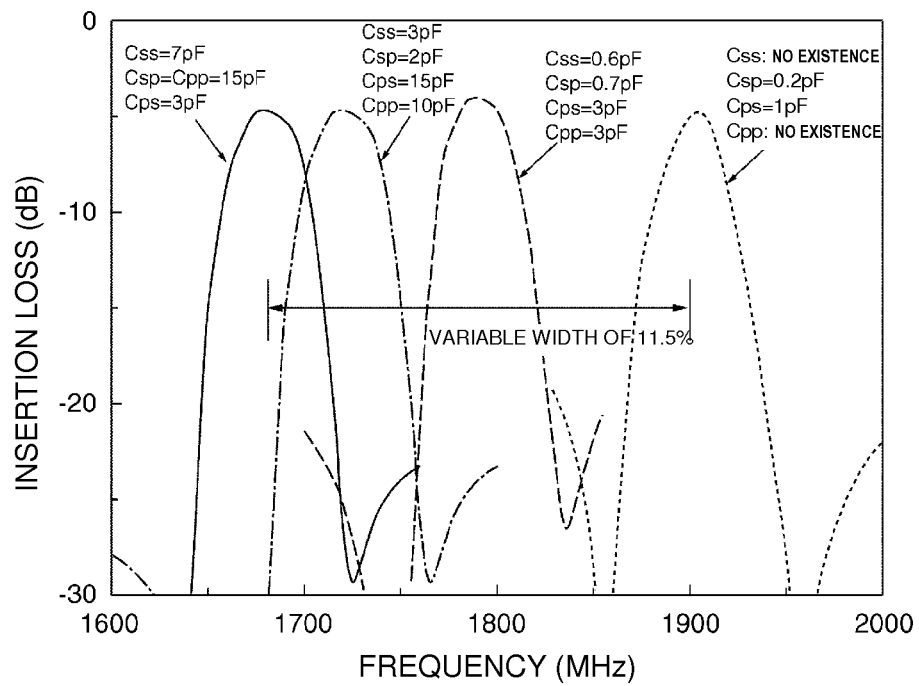
FIG. 34 is a characteristic of a ladder tunable filter of the second preferred embodiment, configured where a difference between FrP and FaS is about 45 MHz.

In addition, FIG. 34 illustrates the filter characteristic of a ladder tunable filter where a difference between the FrP and the FrS is set to about 45 MHz, in the same way as the tunable filter 601. Here, the 3 dB band width is set to about 46 MHz. In addition, a frequency variable width is also set to a large width as much as about 11.5%, for example.

Therefore, in the present preferred embodiment, in the same way, the 3 dB band width and the frequency variable amount were obtained when a difference between the resonant frequency FrS of the series arm resonator and the resonant frequency FrP of the parallel arm resonator was variously changed. A result is illustrated in the following Table 7.

As is clear from Table 7, by changing a difference between the resonant frequency FrS of the series arm resonator and the resonant frequency FrP of the parallel arm resonator, it is possible to change the 3 dB band width of the tunable filter 601 and it is also possible to change the frequency variable amount. The center frequency of the tunable filter at this time is about 1820 MHz.

TABLE 7

|  | FrS − FrP (MHz) | | | | | |
|---|---|---|---|---|---|---|
|  | 182 | 137 | 91 | 45 | 22.5 | 11.3 |
| 3 dB Band Width (MHz) | 185 | 138 | 92 | 46 | 23 | 12 |
| Frequency Variable Amount (%) | 4.5 | 6.8 | 9 | 11.5 | 12.7 | 13.3 |

In addition, it is assumed that the frequency variable amount means the ratio (%) of a difference between a center frequency in the case of the first combination in which the center frequency is the lowest and a center frequency in the case of the third combination in which the center frequency is the highest to a frequency at a point midway between the two center frequencies.

As is clear from Table 7, it is understood that, by changing a difference between the resonant frequency FrS of the series arm resonator and the resonant frequency FrP of the parallel arm resonator, it is possible to greatly change the 3 dB band width and the frequency variable amount. In addition, it was assumed that a difference between the anti-resonant frequency FaS of the series arm resonator and the anti-resonant frequency FaP of the parallel arm resonator was approximately the same as a difference between the FrS and the FrP.

As described above, it is understood that, for example, when the fractional band widths of the series arm resonator and the parallel arm resonator are about 17%, it is only necessary for a resonant frequency difference between the FrS and the FrP to be less than or equal to about 137 MHz so that the frequency variable range of the tunable filter is to be greater than or equal to about 6.2%. It is understood that it is only necessary for a resonant frequency difference Δfr=FrS−FrP to be less than or equal to about 137 MHz corresponding to ½ of about 274 MHz=about 17%, the fractional band widths of the parallel arm resonator and the series arm resonator. In addition, the Δfr at this time becomes a value close to the 3 dB band width of the tunable filter.

In addition, in other words, when the fractional band width of a surface acoustic wave resonator is about 13% to about 25%, as illustrated in the following Table 8, it is only necessary to set the ratio of FrS−FrP to the band width of a resonator in such a way as illustrated in the following Table 8, so as to realize a frequency variable width greater than or equal to about 6.8%.

TABLE 8

| | Fractional Band Width of Resonator (%) | | | | | | | | | | | | | |
|---|---|---|---|---|---|---|---|---|---|---|---|---|---|---|
| | 12 | 13 | 14 | 15 | 16 | 17 | 18 | 19 | 20 | Greater than 20 and Less than or Equal to 25 | Greater than 25 and Less than or Equal to 30 | Greater than 30 and Less than or Equal to 40 | Greater than 40 and Less than or Equal to 50 | Greater than 50 and Less than or Equal to 60 |
| {(FrS − FrP)/ Bandwidth of Resonator} (%) | Less than or Equal to 33 | Less than or Equal to 37 | Less than or Equal to 41 | Less than or Equal to 44.5 | Less than or Equal to 47.5 | Less than or Equal to 50 | Less than or Equal to 52.6 | Less than or Equal to 54.7 | Less than or Equal to 56.6 | Less than or Equal to 63.9 | Less than or Equal to 68.3 | Less than or Equal to 74.4 | Less than or Equal to 78.0 | Less than or Equal to 80.5 |

In addition, it is understood that when the frequency variable width is greater than or equal to about 9%, it is only necessary to set the ratio of FrS−FrP to the band width of a resonator to a value less than or equal to values illustrated in Table 9, as illustrated in the following Table 9.

TABLE 9

| | Fractional Band Width of Resonator (%) | | | | | | | | | | | | | |
|---|---|---|---|---|---|---|---|---|---|---|---|---|---|---|
| | 12 | 13 | 14 | 15 | 16 | 17 | 18 | 19 | 20 | Greater than 20 and Less than or Equal to 25 | Greater than 25 and Less than or Equal to 30 | Greater than 30 and Less than or Equal to 40 | Greater than 40 and Less than or Equal to 50 | Greater than 50 and Less than or Equal to 60 |
| {(FrS − FrP)/ Bandwidth of Resonator} (%) | Less than or Equal to 11 | Less than or Equal to 17.2 | Less than or Equal to 22.4 | Less than or Equal to 27 | Less than or Equal to 31 | Less than or Equal to 34.4 | Less than or Equal to 37.6 | Less than or Equal to 40.4 | Less than or Equal to 42.9 | Less than or Equal to 52.4 | Less than or Equal to 58.7 | Less than or Equal to 66.7 | Less than or Equal to 71.4 | Less than or Equal to 74.6 |

Accordingly, it is desirable that the fractional band width of the series arm resonator and the fractional band width of the parallel arm resonator are greater than or equal to about 13%. Because of it, as described above, it is possible to further increase the frequency variable amount. It is more desirable that the fractional band widths of the series arm resonator and the parallel arm resonator are greater than or equal to about 15%, and because of it, it is possible to further increase the frequency variable amount. In addition, an elastic wave resonator whose fractional band width exceeds about 60% is generally not used in a band pass filter. Accordingly, it is desirable that the fractional band width is greater than or equal to about 13% and less than or equal to about 60%, for example.

When the values of the above-mentioned Table 7 to Table 9 are expressed by expressions, the expressions are as follows. It is assumed that the frequency variable width of a tunable filter intended to be realized is t and the fractional band widths of the series arm resonator and the parallel arm resonator are y.

It is assumed that the t is a value obtained by normalizing (FaP−FrS), which is a width where a frequency can fluctuate, by (FaP+FrS)/2, and the fractional band widths y of the series arm resonator and the parallel arm resonator are values obtained by normalizing band widths by the individual resonant frequencies thereof. At this time, it is understood that it is only necessary for a value, obtained by normalizing $\Delta fr/FrP$, the ratio of $\Delta fr = FrS - FrP$ to FrP, by the fractional band width y, to be less than or equal to a value indicated by the following Expression (1).

$$\{(2-t/0.9) \times (1+y) - (2+t/0.9)\} / \{(2+t/0.9) \times y\} \times 100 (\%) \quad (1)$$

In addition, the frequency variable width t experimentally satisfies $$t \approx 2 \times (FaP-FrS)/(FaP+FrS) \times 0.9 \times 100(\%)$$

at a maximum. Accordingly, in view of an obtained filter characteristic, a suitable variable width lies between about 0.7×t and about 0.9×t, for example. Accordingly, a minimum 3 dB band width is either the smaller of (FrS−FrP)×0.9 or (FaS−FaP)×0.9, and a maximum frequency variable width is obtained to be 140×(FaP−FrS)/(FaP+FrS) (%) to 180×(FaP−FrS)/(FaP+FrS) (%), for example.

As described above, it is understood that, in the tunable filter 601, it is possible to increase the frequency variable width by combining the frequency characteristics of the series arm resonators S1 and S2 and the parallel arm resonator P1.

While the ladder tunable filter has been described that utilizes the series arm and parallel arm resonators configured using the surface acoustic wave resonator including the embedded electrode, series arm and parallel arm resonators may be used that are configured using a surface acoustic wave resonator where an IDT electrode is provided on an LN substrate. In this case, it is also possible to increase the frequency variable width by combining the frequency characteristics of the series arm resonators S1 and S2 and the parallel arm resonator P1.

In the ladder tunable filter, when it is assumed that the resonant frequency and the anti-resonant frequency of the series arm resonator are the FrS and the FaS and the resonant frequency and the anti-resonant frequency of the parallel arm resonator are the FrP and the FaP, it is possible to increase a variable amount in the pass band of the tunable filter with increases in |FrS−FaS| and |FrP−FaP|, which is desirable. While, in the preferred embodiment described above, the description has been performed using the parallel arm resonator and the series arm resonator, which have the impedance characteristics illustrated in FIG. 31, a series arm resonator circuit portion and a parallel arm resonator circuit portion may be provided in both of the series arm and the parallel arm, respectively, in place of the parallel arm resonator and the series arm resonator, and a ladder filter may be configured using the series arm resonator circuit portion and the parallel arm resonator circuit portion.

In addition, when the IDT electrode 12 is provided on the piezoelectric substrate 11 as illustrated in FIGS. 3A and 3B, a spurious response due to a Rayleigh wave occurs between the resonant frequency and the anti-resonant frequency or at a frequency position higher than the anti-resonant frequency. On the other hand, in the above-mentioned structure utilizing the embedded electrode, the spurious response due to the Rayleigh wave occurs at a frequency position lower than the resonant frequency. Accordingly, it is desirable that a surface acoustic wave resonator of a non-embedded type is used as the series arm resonator and an embedded electrode-type surface acoustic wave resonator is used as the parallel arm resonator. Accordingly, it is possible to obtain a tunable filter where it is hard for a spurious response to occur within the pass band.

In addition, when a bandwidth extending inductance is provided and includes a bonding wire in the same way as in the first preferred embodiment, it is also possible to increase a frequency variable width by combining the frequency characteristic of a series arm resonator and the frequency characteristic of a parallel arm resonator as illustrated in the above-mentioned Expression (1) and magnifying a band width.

Example of Modification to Second Preferred Embodiment

With reference to FIG. 35 to FIG. 39, a ladder tunable filter according to an example of a modification to the second preferred embodiment will be described. As illustrated in a circuit diagram in FIG. 37, a ladder tunable filter 61 of the present preferred embodiment includes an input terminal 62, an output terminal 63, and a ground terminal 64 connected to a ground potential. In a series arm connecting the input terminal and the output terminal 63 to each other, first and second bulk wave resonators 65 and 66 are inserted in series with each other. In addition, a first variable capacitor CSs1 is connected between the input terminal 62 and the first bulk wave resonator 65. A variable capacitor CSp1 is connected in parallel to the first bulk wave resonator 65.

A variable capacitor CSp2 is connected in parallel to the second bulk wave resonator 66. A variable capacitor CSs2 is connected between the bulk wave resonator 66 and the output terminal 63. On the other hand, in a parallel arm connecting the ground terminal 64 and a connection point N between the first and second bulk wave resonators 65 and 66, a third bulk wave resonator 67 is connected as a parallel arm resonator.

A variable capacitor CPs is connected between the third bulk wave resonator 67 and the connection point N between the first and second bulk wave resonators 65 and 66. In addition, a variable capacitor CPp is connected in parallel to the third bulk wave resonator 67. In the tunable filter 61 of the present preferred embodiment, it is possible to adjust the frequency position of a pass band by adjusting the electrostatic capacitances of the variable capacitor CSs1, CSs2, CSp1, CSp2, CPs, and CPp.

Figure 35:
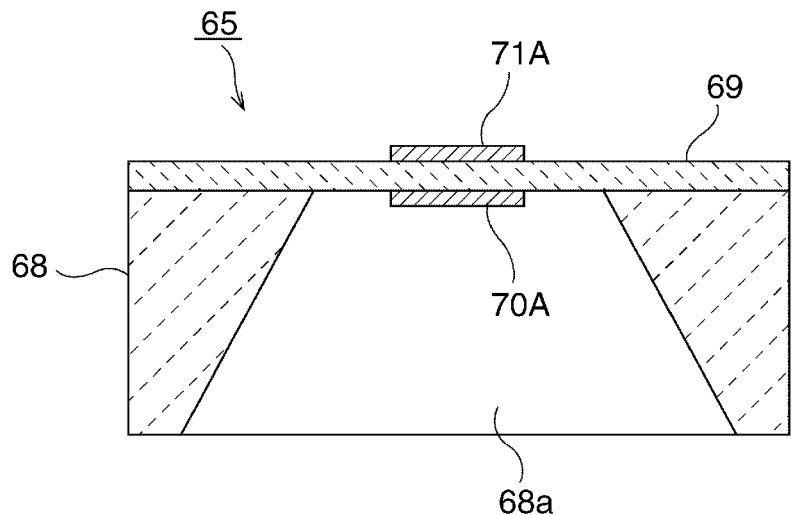
FIG. 35 is an elevational cross-sectional view for explaining a bulk wave resonator used for a ladder tunable filter in an example of a modification to the second preferred embodiment of the present invention.

The above-mentioned bulk wave resonators 65 to 67 use resonance due to a bulk wave generated by excitation of a piezoelectric thin film or a piezoelectric thin plate. FIG. 35 is the elevational cross-sectional view of the first bulk wave resonator 65. The bulk wave resonator 65 includes a substrate 68 including arbitrary insulating material or semiconductor material such as Si or the like. The substrate 68 includes a cavity including a through hole 68a. On the substrate 68, a piezoelectric thin film 69 is laminated. The piezoelectric thin film 69 is arranged so as to cover the through hole 68a. This piezoelectric thin film 69 preferably includes $KNbO_3$ in the present preferred embodiment. However, the piezoelectric thin film 69 may be a piezoelectric thin plate or formed using other piezoelectric material.

In a portion covering the through hole 68a in the piezoelectric thin film 69, a second excitation electrode 70A is provided on the bottom surface of the piezoelectric thin film 69. In addition, a first excitation electrode 71A is arranged so as to face the second excitation electrode 70A through the piezoelectric thin film 69. The first and second excitation electrodes 71A and 70A include Al in the present preferred embodiment. However, the excitation electrodes 70A and 71A may be formed using arbitrary metal such as Cu, Ag, Au, Pt, Mo, or Ni or alloy based mainly thereon.

An area where the first and second excitation electrodes 71A and 70A face each other defines an excitation portion. The cavity including the through hole 68a is located below the excitation portion. Accordingly, it is difficult for the vibration of the piezoelectric thin film 69 to be blocked in the excitation portion.

As the vibration mode of the bulk wave resonator, there are a thickness-shear vibration and a thickness-longitudinal vibration. It is only necessary to arbitrarily adjust the dimension of the excitation electrode in response to the vibration mode to be used. In regard to FIG. 35, the thickness-shear vibration is a vibration mode where when a voltage is applied between the excitation electrodes 70A and 71A provided in the piezoelectric thin film 69, the propagation direction of a bulk wave, which is the thickness direction of the piezoelectric thin film, and the displacement direction of the bulk wave are nearly perpendicular to each other. On the other hand, the thickness-longitudinal vibration is a vibration mode in which, when a voltage is applied between the excitation electrodes 70A and 71A provided in the piezoelectric thin film 69, the propagation direction of a bulk wave, which is the thickness direction of the piezoelectric thin film, and the displacement direction of the bulk wave are nearly parallel to each other.

While the bulk wave resonator 65 has been described, the second and third bulk wave resonators 66 and 67 also preferably have the same structure.

Figure 37:
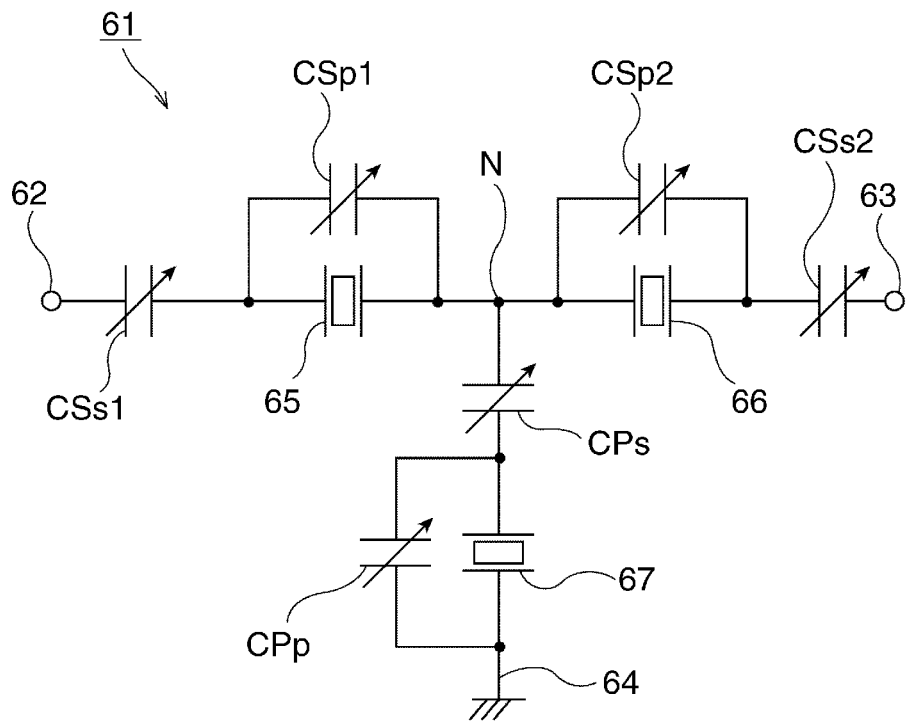
FIG. 37 is a circuit diagram of the ladder tunable filter in an example of a modification to the second preferred embodiment of the present invention.

While the bulk wave resonator 65 illustrated in FIG. 37 is connected to the input terminal 62 and the above-mentioned connection point, the above-mentioned first excitation electrode 71A is connected to the input terminal 62 through the CSs1 and the second excitation electrode 70A is connected to the above-mentioned connection point N.

Figure 36:
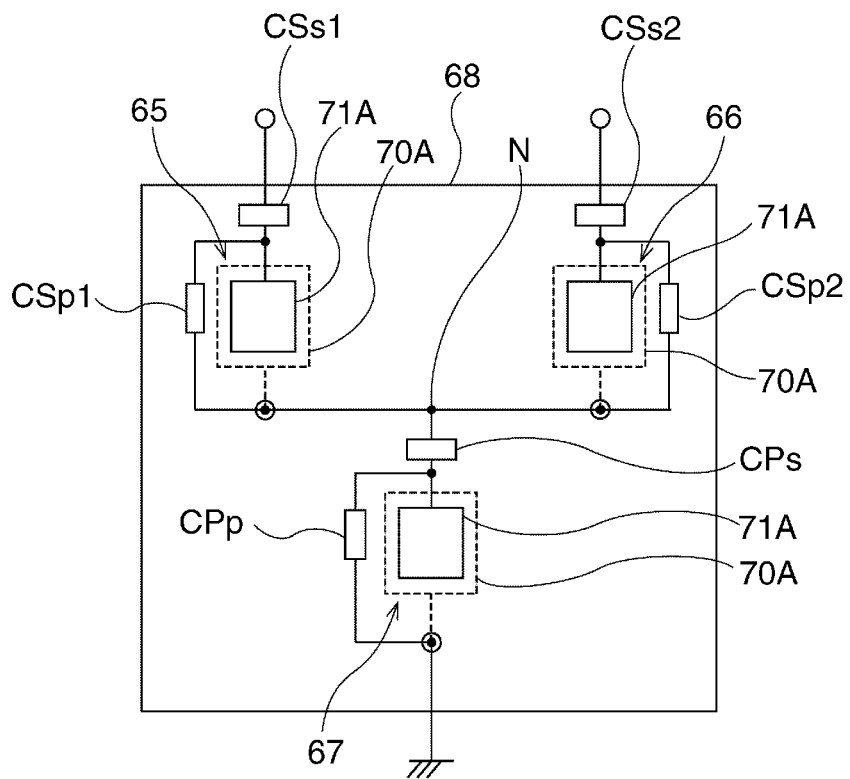
FIG. 36 is a schematic plan view of the ladder tunable filter in an example of a modification to the second preferred embodiment of the present invention.

FIG. 36 is the schematic plan view of the above-mentioned tunable filter. In FIG. 36, on the substrate 68, in a portion in which the above-mentioned bulk wave resonator 65 is configured, the first excitation electrode 71A is illustrated. Since being located on the bottom surface of the piezoelectric thin film, the second excitation electrode 70A is indicated by a dashed line. In areas where the second and third bulk wave resonators 66 and 67 are provided, the first excitation electrodes 71A are also provided in the top surface of the substrate 68 in the same way.

In addition, in FIG. 36, it is assumed that portions where the variable capacitors CSs1, CSp1, CSp2, CSs2, CPs, and CPp are provided are schematically illustrated using rectangular blocks. It is possible to configure such a structure of each variable capacitor in the same way as in the above-mentioned first and second preferred embodiments by using a variable capacitor that is known.

In such a way as in the present preferred embodiment, in the tunable filter of a preferred embodiment of the present invention, bulk wave resonators may be used as the series arm resonator and the parallel arm resonator.

Figure 38:
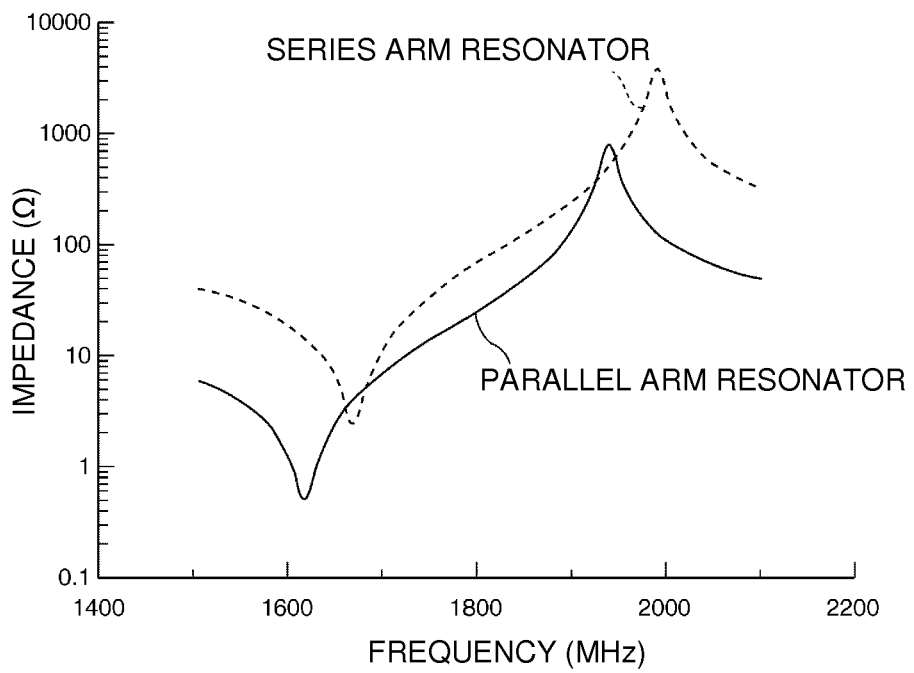
FIG. 38 is a diagram illustrating impedance characteristics of a series arm resonator and a parallel arm resonator in the ladder tunable filter in an example of a modification to the second preferred embodiment.

FIG. 38 illustrates the impedance characteristic of each of the series arm resonator and the parallel arm resonator in the above-mentioned tunable filter 61. The first and second bulk wave resonators 65 and 66 have the impedance characteristic of a series arm resonator indicated by a dashed line in FIG. 38. On the other hand, the third bulk wave resonator 67 has the impedance characteristic of a parallel arm resonator indicated by a solid line in FIG. 38.

Figure 39:
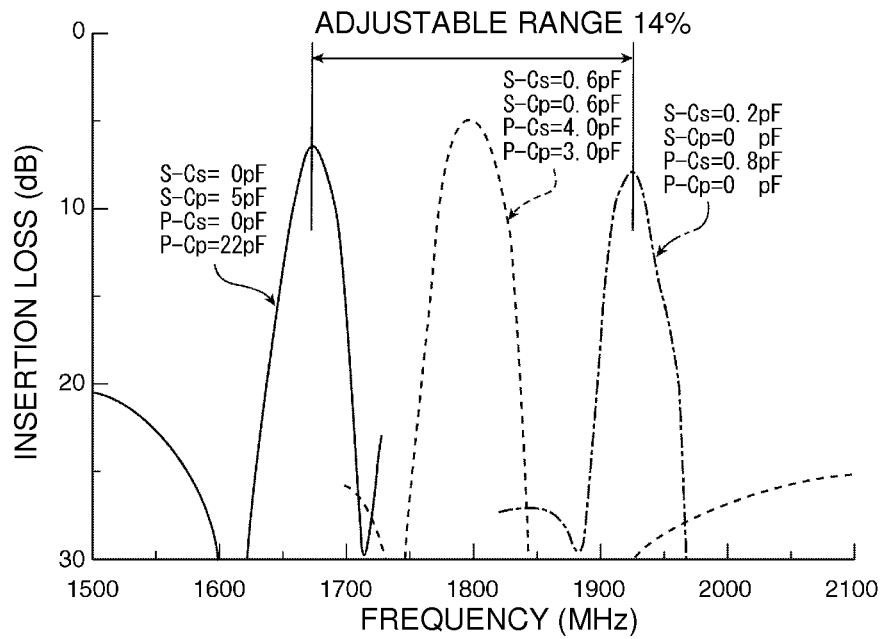
FIG. 39 is a diagram illustrating an attenuation frequency characteristic and an adjustable range of the ladder tunable filter in an example of a modification to the second preferred embodiment.

FIG. 39 illustrates the attenuation frequency characteristic of the tunable filter 61 utilizing such first to third bulk wave resonators 65 to 67.

In addition, FIG. 39 illustrates frequency characteristics when the electrostatic capacitances of the above-mentioned variable capacitors are variously changed. In the present preferred embodiment, the electrostatic capacitances of the variable capacitors CSs1 and CSs2 are caused to be equal to each other, and such electrostatic capacitances are defined as S-Cs. In addition, the electrostatic capacitances of the variable capacitors CSp1 and variable capacitor CSP2 are caused to be equal to each other, and the electrostatic capacitance of these variable capacitors are defined as S-Cp.

In addition, the electrostatic capacitance of the variable capacitor CPs connected to the parallel arm is defined as P-Cs, and the electrostatic capacitance of the variable capacitor CPp is defined as P-Cp. FIG. 39 illustrates frequency characteristics when the electrostatic capacitances of the variable capacitors are defined as the following three combinations.

First Combination: S-Cs=0 pF, S-Cp=5 pF, P-Cs=0 pF, and P-Cp=22 pF

Second Combination: S-Cs=0.6 pF, S-Cp=0.6 pF, P-Cs=4.0 pF, and P-Cp=3.0 pF

Third Combination: S-Cs=0.2 pF, S-Cp=0 pF, P-Cs=0.8 pF, and P-Cp=0 pF

As is clear from FIG. 39, it is understood that the center frequency of the pass band is located at about 1.67 GHz in the case of the first combination, the center frequency of the pass band is located at about 1.79 GHz in the case of the second combination, and the center frequency of the pass band is located at about 1.91 GHz in the case of the third combination. It is understood that, by adjusting the electrostatic capacitances of the variable capacitors, it is possible to change the center frequency of the pass band in such a way as 1.91−1.67=0.24 GHz=240 MHz. Accordingly, it is understood that, with respect to a design center frequency of about 1.8 GHz, a frequency adjustable range is large so as to be as much as about 14%.

It is understood that, in a preferred embodiment of the present invention, not only the surface acoustic wave resonator but also such bulk wave resonators 65 to 67 as described above may be used and in that case, it is also possible to widen a frequency adjustable range in accordance with the present invention.

Figure 40A:
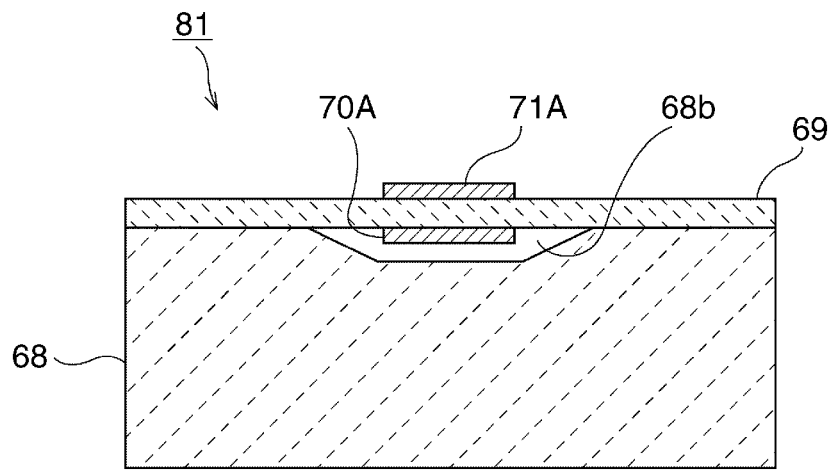
FIGS. 40A and 40B are individual elevational cross-sectional views illustrating examples of a modification to a bulk wave resonator included in a preferred embodiment of the present invention.
Figure 40B:
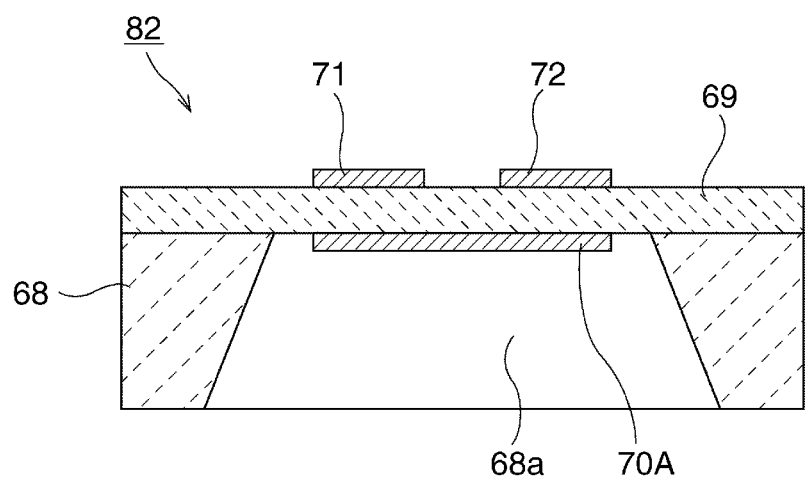

FIGS. 40A and 40B are elevational cross-sectional views each of which illustrates an example of a modification to the bulk wave resonator. In the bulk wave resonator 65 illustrated in FIG. 35, the cavity including the through hole 68a has been provided in the substrate 68. On the other hand, as illustrated in FIG. 40A, a cavity may also be formed by providing, in the top surface of the substrate 68, a concave portion 68b that is not a through hole.

In addition, as illustrated in FIG. 40B, the first excitation electrode 71A in the top surface of the piezoelectric thin film 69 may also include split excitation electrodes 71 and caused to face each other across a gap, and the second excitation electrode 70A may also be caused to face the split excitation electrodes 71 and 72 through the piezoelectric thin film 69.

In place of the bulk wave resonator 65 illustrated in FIG. 35, each of bulk wave resonators 81 and 82 illustrated in FIGS. 40A and 40B may be used.

Next, as another example of a modification to the bulk wave resonator 65 illustrated in FIG. 35, a resonator will be described that uses a piezoelectric thin film 69 including LiNbO$_3$ and further uses a thickness-shear vibration as a bulk wave.

Figure 41:
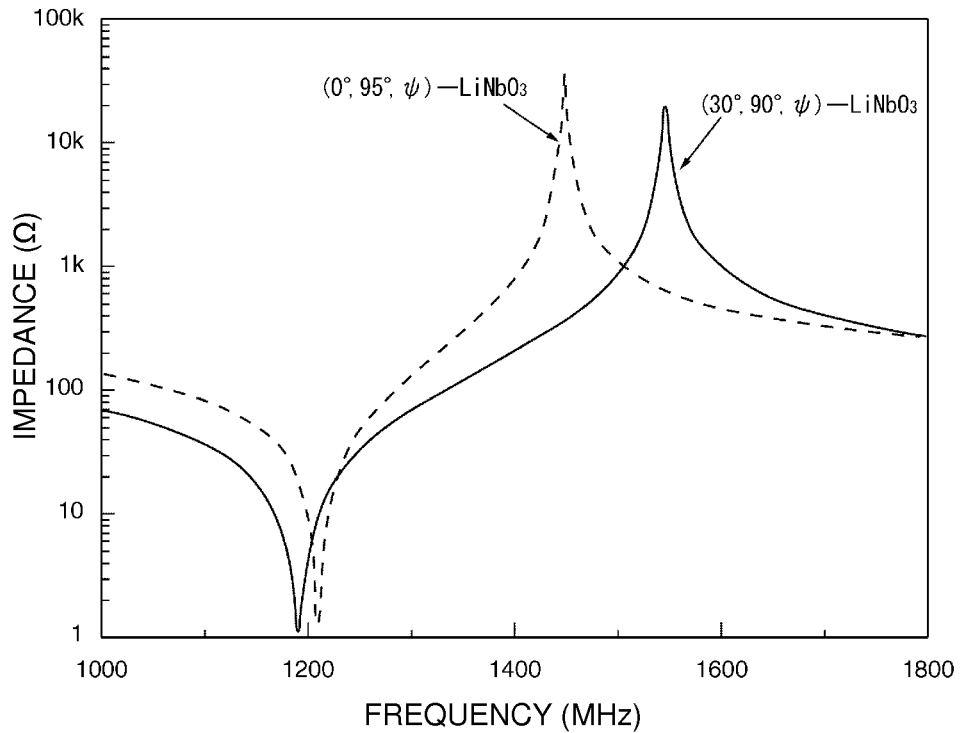
FIG. 41 is a diagram illustrating an impedance characteristic of a thickness-shear bulk wave resonator used for a ladder tunable filter according to another example of a modification to the second preferred embodiment of the present invention.

FIG. 41 is a diagram illustrating the impedance characteristic of the bulk wave resonator 65 where each of LiNbO$_3$ of Euler angles (0°, 95°, ψ) and LiNbO$_3$ of Euler angles (30°, 90° ψ) is preferably used and the thickness-shear vibration is preferably utilized, for example. It was assumed that each of the thicknesses of LiNbO$_3$ was about 1.45 μm, for example. The first and second excitation electrodes 71A and 70A were formed preferably using an Al film. It was assumed that the thicknesses of the first and second excitation electrodes 71A and 70A were about 0.1 μm and a planar shape was a circle shape whose radius is about 50 μm, for example.

As is clear from FIG. 41, it is understood that when Euler angles of a piezoelectric thin film including LiNbO$_3$ are (30°, 90°, ψ), it is possible to obtain a fractional band width of about 30%. On the other hand, it is understood that when a piezoelectric thin film including LiNbO$_3$ of Euler angles (0°, 95°, ψ) is used, it is possible to obtain a fractional band width of about 21% in the thickness-shear vibration resonator. In this way, it is understood that when the thickness-shear vibration mode is used in the bulk wave resonator 65, it is possible to control the band width by utilizing LiNbO$_3$ as the piezoelectric thin film and changing the Euler angles thereof.

Figure 42:
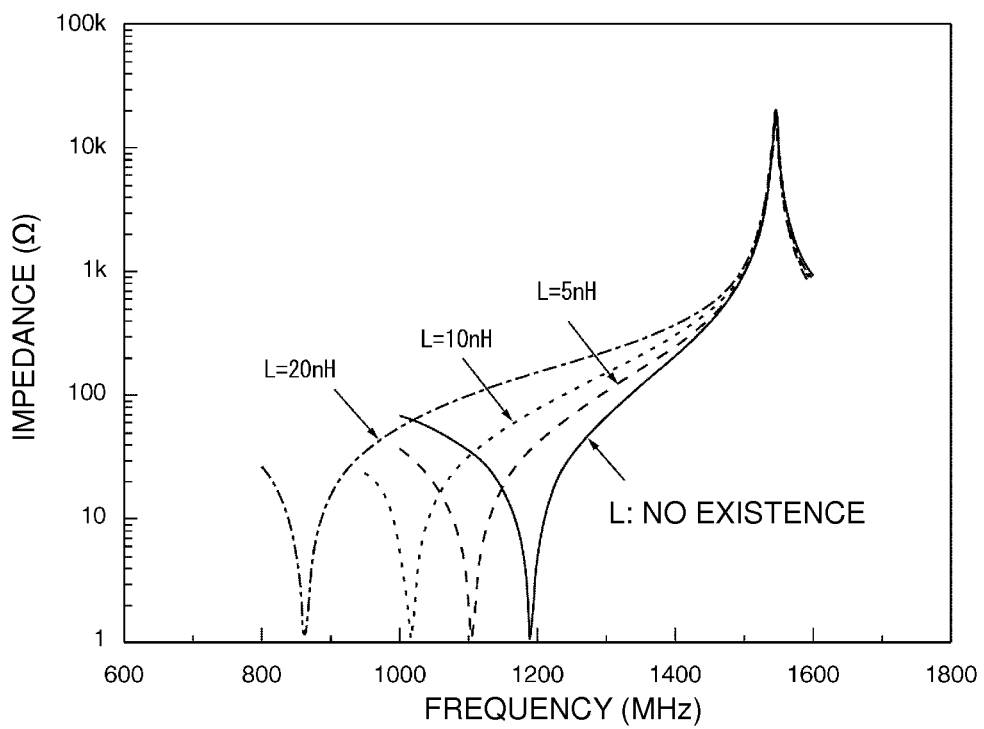
FIG. 42 is an impedance-frequency characteristic diagram illustrating a change in a band when a coil is connected to a bulk wave resonator, a thickness-shear vibration resonator including $LiNbO_3$, in a ladder tunable filter according to another example of a modification to the second preferred embodiment of the present invention.

FIG. 42 is a diagram illustrating the amount of an inductance and a change in an impedance characteristic when the inductance is connected in series to a bulk wave resonator, which is the bulk wave resonator 65 utilizing a piezoelectric thin film including LiNbO$_3$ of Euler angles (30°, 0°, ψ) and utilizes the thickness-shear vibration mode.

As is clear from FIG. 42, it is understood that, compared with a case where an inductance, such as a bandwidth extending inductance, is not connected, it is possible to widen a band width by connecting bandwidth extending inductances whose inductance values are about 5 nH, about 10 nH, and about 20 nH, for example.

Figure 43:
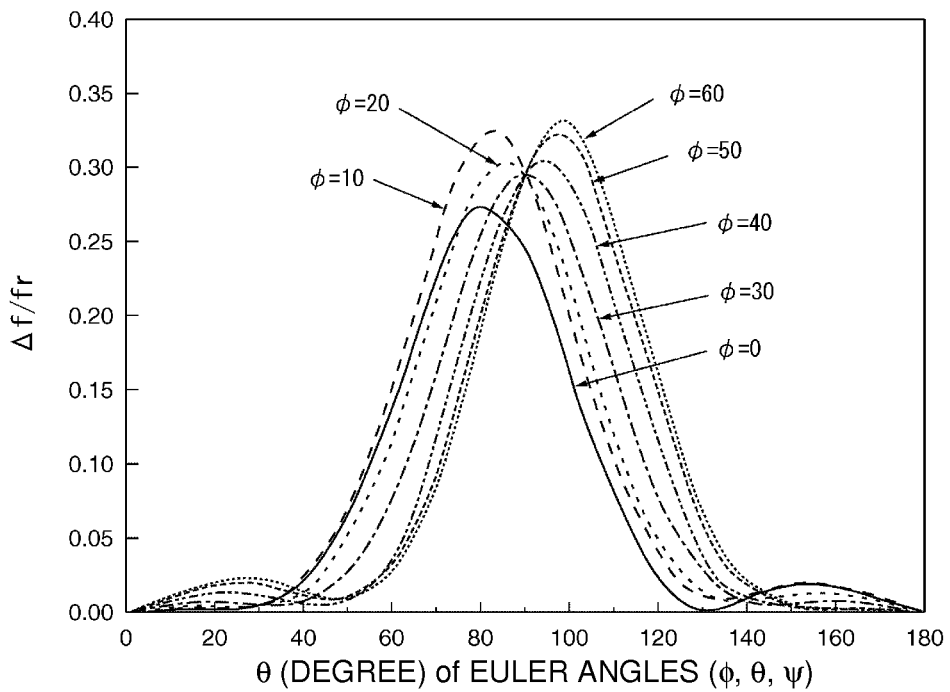
FIG. 43 is a diagram illustrating a relationship among a fractional band width and φ and θ of Euler angles in a bulk wave resonator, a thickness-shear vibration resonator, that is used in a ladder tunable filter according to another example of a modification to the second preferred embodiment of the present invention and utilizes $LiNbO_3$ of Euler angles (φ, θ, ψ).

FIG. 43 is a diagram illustrating a relationship among Euler angles and a fractional band width Δf/fr in a resonator, which is the bulk wave resonator 65 utilizing a piezoelectric thin film including LiNbO$_3$ of the above-mentioned Euler angles (φ, θ, ψ) and utilizes the thickness-shear vibration mode.

As seen in FIG. 43, it is understood that when the thickness-shear mode is used, by selecting Euler angles from a specific range as follows, it is possible to greatly widen a fractional band width so that the fractional band width is greater than or equal to about 20%, greater than or equal to about 25%, or greater than or equal to about 30%, for example.

TABLE 10

| Fractional Band Width Is Greater than or Equal to 20% | Fractional Band Width Is Greater than or Equal to 25% | Fractional Band Width Is Greater than or Equal to 30% |
| --- | --- | --- |
| (0 ± 5°, 63° to 97°, ψ) | (0 ± 5°, 72° to 90°, ψ) | — |
| (10 ± 5°, 62° to 100°, ψ) | (10 ± 5°, 68° to 95°, ψ) | (10 ± 5°, 72° to 90°, ψ) |
| (20 ± 5°, 67° to 103°, ψ) | (20 ± 5°, 72° to 97°, ψ) | (20 ± 5°, 80° to 90°, ψ) |
| (30 ± 5°, 72° to 108°, ψ) | (30 ± 5°, 78° to 102°, ψ) | (30 ± 5°, 89° to 91°, ψ) |
| (40 ± 5°, 76° to 113°, ψ) | (40 ± 5°, 81° to 107°, ψ) | (40 ± 5°, 88° to 98°, ψ) |
| (50 ± 5°, 77° to 115°, ψ) | (50 ± 5°, 83° to 110°, ψ) | (50 ± 5°, 87° to 104°, ψ) |
| (60 ± 5°, 78° to 117°, ψ) | (60 ± 5°, 83° to 113°, ψ) | (60 ± 5°, 87° to 107°, ψ) |

Figure 44:
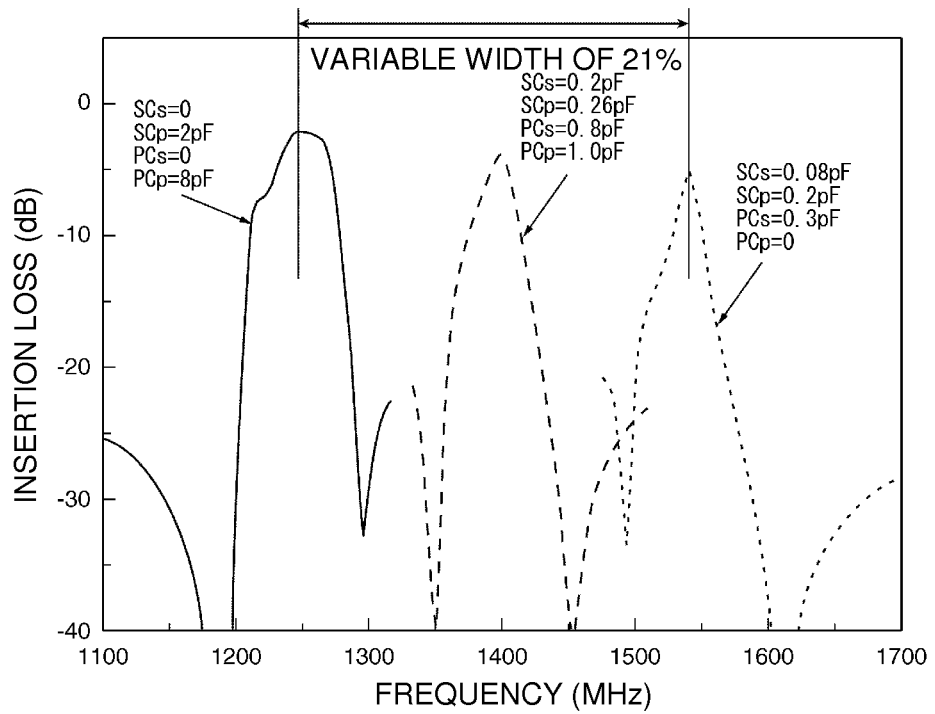
FIG. 44 is a diagram illustrating an attenuation frequency characteristic of a ladder tunable filter according to another example of a modification to the second preferred embodiment of the present invention. The ladder tunable filter includes a bulk wave resonator, that is, a thickness-shear vibration resonator including $LiNbO_3$ of Euler angles (30°, 90°, ψ).

FIG. 44 is a diagram illustrating an attenuation frequency characteristic and a frequency variable width when the tunable filter illustrated in FIG. 37 is configured in the same way as in FIG. 37, using the bulk wave resonator 65 utilizing the above-mentioned thickness-shear vibration mode. In the tunable filter in FIG. 37, the tunable filter 61 is configured in the same way as in FIG. 37, except that, as a resonator, a piezoelectric thin film including LiNbO$_3$ with Euler angles of (30°, 90°, ψ) is preferably used and the thickness-shear vibration mode is preferably utilized, for example. In addition, FIG. 44 illustrates frequency characteristics when the electrostatic capacitances of the variable capacitors are variously changed in the same way as in the case of FIG. 39. FIG. 44 illustrates frequency characteristics when the electrostatic capacitances of the variable capacitors are defined as the following three combinations.
First Combination: S-Cs=0 pF, S-Cp=2 pF, P-Cs=0 pF, and P-Cp=8 pF.
Second Combination: S-Cs=0.2 pF, S-Cp=0.26 pF, P-Cs=0.8 pF, and P-Cp=1.0 pF.
Third Combination: S-Cs=0.08 pF, S-Cp=0.2 pF, P-Cs=0.3 pF, and P-Cp=0 pF.

As is clear from FIG. 44, it is understood that the center frequency of the pass band is located at about 1.25 GHz in the case of the first combination, the center frequency is located in the vicinity of about 1.38 GHz in the case of the second combination, and the center frequency is located in the vicinity of about 1.54 GHz in the case of the third combination. Accordingly, it is understood that it is possible to change the center frequency within the range of about 1.54 to about 1.25=about 0.29 GHz. Accordingly, it is understood that, with respect to a design center frequency of about 1.395 GHz, a frequency adjustable range is large so as to be as much as about 21%.

Figure 45:
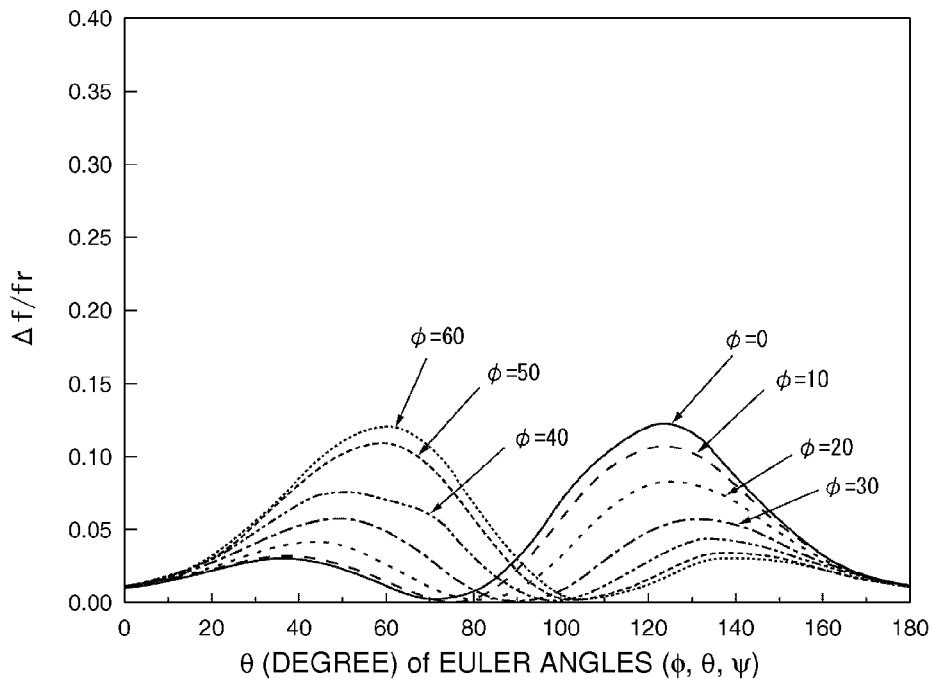
FIG. 45 is a diagram illustrating a relationship among a fractional band width and θ and φ of Euler angles in a bulk wave resonator, a thickness-longitudinal resonator utilizing piezoelectric material including $LiNbO_3$.
Figure 46:
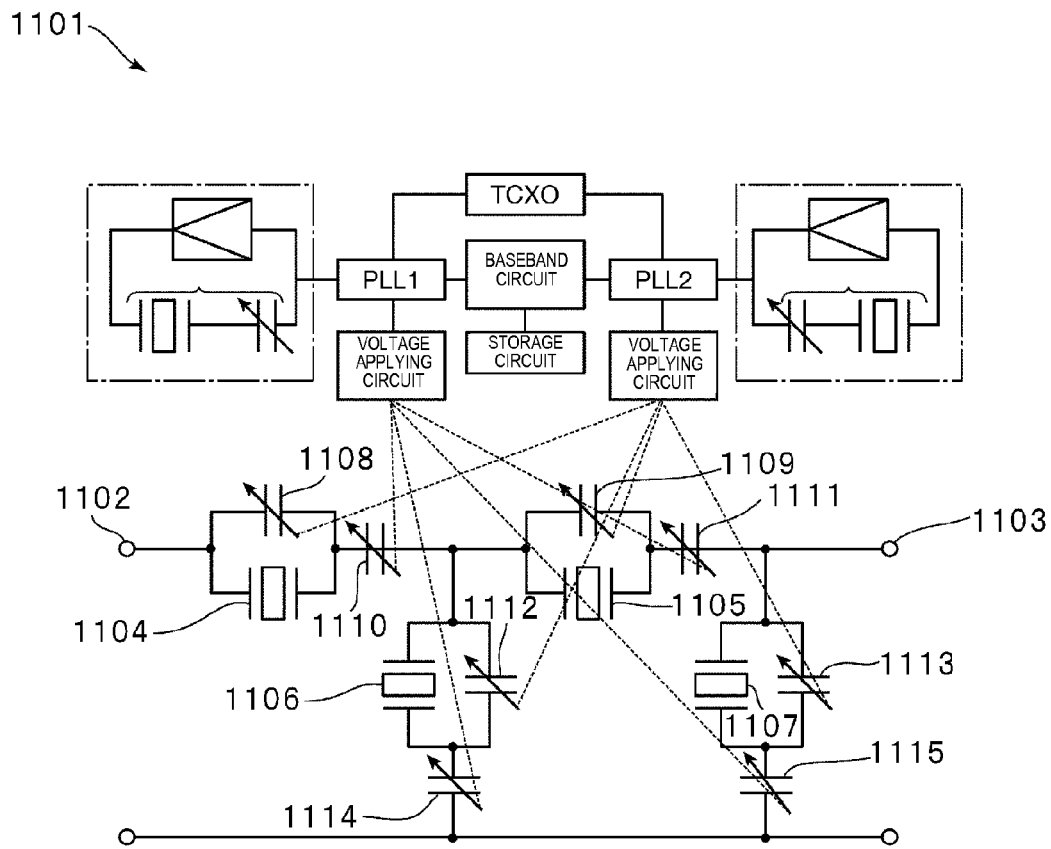
FIG. 46 is a circuit diagram for explaining a tunable filter of the related art.

In addition, in a preferred embodiment of the present invention, a thickness-longitudinal resonator may also be used that utilizes a thickness-longitudinal vibration mode, as the bulk wave resonator 65. FIG. 45 is a diagram illustrating a relationship among a fractional band width Δf/fr and Euler angles when the bulk wave resonator 65 is configured using a piezoelectric thin film including LiNbO$_3$ of Euler angles (φ, θ, ψ) and the thickness-longitudinal vibration mode is used.

As is clear from FIG. 45, it is understood that when the bulk wave resonator utilizing the thickness-longitudinal vibration mode is used, it is also possible to set a band width greater than or equal to about 10% if the Euler angles of LiNbO$_3$ are set within the range of one of (0±5°, 107° to 137°, ψ), (10±5°, 112° to 133°, ψ), (50±5°, 47° to 69°, ψ), and (60±5°, 43° to 73°, ψ).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A tunable filter of a ladder circuit configuration, comprising:
a series arm resonator provided in a series arm;
a parallel arm resonator provided in a parallel arm; and
a variable capacitor connected to at least one of the series arm resonator and the parallel arm resonator; wherein
when a resonant frequency and an anti-resonant frequency of the series arm resonator are FrS and FaS and a resonant frequency and an anti-resonant frequency of the parallel arm resonator are FrP and FaP, FrS≤{(n−1) FrP+FaP}/n and FaP≤{(n−1) FaS+FrS}/n are satisfied where n is an integer number greater than or equal to 2 and less than or equal to 30.

2. The tunable filter according to claim 1, wherein FrS≤(FrP +FaP)/2, FaP>FrS, and FaP<FaS are satisfied.

3. The tunable filter according to claim 1, wherein FrS≤(2 FrP +FaP)/3, FaP>FrS, and FaP<FaS are satisfied.

4. The tunable filter according to claim 1, wherein when a value obtained by normalizing a frequency variable width of the tunable filter by (FaP +FrS)/2 is t and a value obtained by normalizing an absolute value of a difference between a resonant frequency and an anti-resonant frequency of each of the series arm resonator and the parallel arm resonator by the resonant frequency of each thereof is y, a value, obtained by normalizing Δfr/FrP, a ratio of Δfr=FrS−FrP to FrP, by the fractional band width y, is less than or equal to a value indicated by the following Expression:

{(2−t/0.9)×(1+y)−(2+t/0.9)}/{(2+t/0.9)×y}×100(%).

5. The tunable filter according to claim 1, wherein a maximum value of a ratio of a difference between the resonant frequency FrS of the series arm resonator and the resonant frequency FrP of the parallel arm resonator to a bandwidth of the series arm resonator is caused to be within a range illustrated in the following Table:

| Fractional Band Width of Resonator (%) | | | | | | | | | | | | | |
|---|---|---|---|---|---|---|---|---|---|---|---|---|---|
| | 12 | 13 | 14 | 15 | 16 | 17 | 18 | 19 | 20 | Greater than 20 and Less than or Equal to 25 | Greater than 25 and Less than or Equal to 30 | Greater than 30 and Less than or Equal to 40 | Greater than 40 and Less than or Equal to 50 | Greater than 50 and Less than or Equal to 60 |
| {(FrS − FrP)/ Bandwidth of Resonator} (%) | Less than or Equal to 33 | Less than or Equal to 37 | Less than or Equal to 41 | Less than or Equal to 44.5 | Less than or Equal to 47.5 | Less than or Equal to 50 | Less than or Equal to 52.6 | Less than or Equal to 54.7 | Less than or Equal to 56.6 | Less than or Equal to 63.9 | Less than or Equal to 68.3 | Less than or Equal to 74.4 | Less than or Equal to 78.0 | Less than or Equal to 80.5. |

6. The tunable filter according to claim 5, wherein a minimum 3 dB band width is either the smaller of (FrS-FrP) ×0.9 or (FaS-FaP)×0.9, and a maximum frequency variable width is caused to be within a range of 140× (FaP-FrS) /(FaP+FrS)(%) to 180×(FaP-FrS)/(FaP+FrS) (%).

7. The tunable filter according to claim 1, wherein a maximum value of a ratio of a difference between the resonant frequency FrS of the series arm resonator and the resonant frequency FrP of the parallel arm resonator to a bandwidth of the series arm resonator is caused to be within a range illustrated in the following Table:

| | | | | | | | | | | Fractional Band Width of Resonator (%) | | | | |
|---|---|---|---|---|---|---|---|---|---|---|---|---|---|---|
| | 12 | 13 | 14 | 15 | 16 | 17 | 18 | 19 | 20 | Greater than 20 and Less than or Equal to 25 | Greater than 25 and Less than or Equal to 30 | Greater than 30 and Less than or Equal to 40 | Greater than 40 and Less than or Equal to 50 | Greater than 50 and Less than or Equal to 60 |
| {(FrS − FrP)/ Bandwidth of Resonator} (%) | Less than or Equal to 11 | Less than or Equal to 17.2 | Less than or Equal to 22.4 | Less than or Equal to 27 | Less than or Equal to 31 | Less than or Equal to 34.4 | Less than or Equal to 37.6 | Less than or Equal to 40.4 | Less than or Equal to 42.9 | Less than or Equal to 52.4 | Less than or Equal to 58.7 | Less than or Equal to 66.7 | Less than or Equal to 71.4 | Less than or Equal to 74.6. |

8. The tunable filter according to claim 1, wherein each of a fractional band width of the series arm resonator and a fractional band width of the parallel arm resonator is greater than or equal to about 13% and less than or equal to about 60%.

9. The tunable filter according to claim 1, further comprising a surface acoustic wave resonator having an electrode normalized film thickness within a range illustrated in the following Table when Euler angles of LiNbO$_3$ are (0°, 70° to 115°, 0°) and a duty ratio is X:

| Electrode Material | Electrode Normalized Film Thickness H/λ |
|---|---|
| Al | ≥0.18032 − 0.15186X + 0.04954X$^2$ |
| Mo | ≥0.13336 − 0.25984X + 0.1623X$^2$ |
| Cu | ≥0.11452 − 0.16714X + 0.06712X$^2$ |
| Ni | ≥0.14498 − 0.27652X + 0.17081X$^2$ |
| Ag | ≥0.0904 − 0.13393X + 0.0518X$^2$ |
| Au | ≥0.05966 − 0.10753X + 0.05177X$^2$ |
| W | ≥0.08039 − 0.15733X + 0.08902X$^2$ |
| Ta | ≥0.08344 − 0.15413X + 0.0806X$^2$ |
| Pt | ≥0.06404 − 0.12311X + 0.06493X$^2$ |

X in the table indicates a duty ratio.

10. The tunable filter according to claim 1, wherein
the series arm resonator and parallel arm resonator include bulk wave resonators; and
the bulk wave resonator includes:
   a substrate including a cavity open in a top surface;
   a piezoelectric thin film or a piezoelectric thin plate arranged on the substrate so as to cover the cavity of the substrate;
   a first excitation electrode provided in a portion that is a bottom surface of the piezoelectric thin film and faces the cavity; and
   a second excitation electrode provided in a top surface of the piezoelectric thin film and disposed so as to face the first excitation electrode through the piezoelectric thin film.

11. The tunable filter according to claim 10, wherein the bulk wave resonator is a thickness-shear vibration resonator.

12. The tunable filter according to claim 11, wherein the bulk wave resonator is a thickness-shear vibration resonator utilizing a piezoelectric thin film or a piezoelectric thin plate, which includes LiNbO$_3$, and Euler angles thereof are within one of ranges illustrated in the following Table:

| Fractional Band Width Is Greater than or Equal to 20% |
|---|
| (0 ± 5°, 63° to 97°, ψ) |
| (10 ± 5°, 62° to 100°, ψ) |
| (20 ± 5°, 67° to 103°, ψ) |
| (30 ± 5°, 72° to 108°, ψ) |
| (40 ± 5°, 76° to 113°, ψ) |
| (50 ± 5°, 77° to 115°, ψ) |
| (60 ± 5°, 78° to 117°, ψ). |

13. The tunable filter according to claim 10, wherein the bulk wave resonator is a thickness-longitudinal vibration resonator.

14. The tunable filter according to claim 13, wherein
the bulk wave resonator is a thickness-longitudinal vibration resonator utilizing a piezoelectric thin film or a piezoelectric thin plate, which includes LiNbO$_3$, and Euler angles thereof are within a range of (0±5°, 107° to 137°, ψ), (10±5°, 112° to 133°, ψ), (50±5°, 47° to 69°, ψ), or (60±5°, 43° to 73°, ψ).

* * * * *